(12) United States Patent
Son et al.

(10) Patent No.: US 9,318,502 B2
(45) Date of Patent: Apr. 19, 2016

(54) NONVOLATILE MEMORY DEVICE

(71) Applicant: SAMSUNG ELECTRONICS CO., LTD., Suwon-Si, Gyeonggi-Do (KR)

(72) Inventors: Jai-Ick Son, Gyeonggi-do (KR); Sunghoon Kim, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/678,526

(22) Filed: Apr. 3, 2015

(65) Prior Publication Data

US 2016/0079259 A1 Mar. 17, 2016

(30) Foreign Application Priority Data

Sep. 15, 2014 (KR) ........................ 10-2014-0122067

(51) Int. Cl.
*H01L 27/115* (2006.01)
*H01L 23/535* (2006.01)
*H01L 23/528* (2006.01)
*H01L 27/12* (2006.01)

(52) U.S. Cl.
CPC ........ *H01L 27/11573* (2013.01); *H01L 23/528* (2013.01); *H01L 23/535* (2013.01); *H01L 27/1157* (2013.01); *H01L 27/11582* (2013.01); *H01L 27/11514* (2013.01); *H01L 27/11578* (2013.01); *H01L 27/1203* (2013.01)

(58) Field of Classification Search
CPC .................. H01L 27/11578; H01L 27/11514; H01L 27/1203
USPC .................................................. 257/347, 774
See application file for complete search history.

(56) References Cited

U.S. PATENT DOCUMENTS

| | | | | |
|---|---|---|---|---|
| 6,051,870 | A * | 4/2000 | Ngo ................... | H01L 21/02129 257/519 |
| 6,146,978 | A * | 11/2000 | Michael .......... | H01L 21/823871 257/382 |
| 6,391,665 | B1 * | 5/2002 | Chang .................... | G11C 29/50 257/E21.59 |
| 7,679,133 | B2 | 3/2010 | Son et al. | |
| 8,502,321 | B2 * | 8/2013 | Izumi ................ | H01L 21/26586 257/369 |
| 8,553,466 | B2 | 10/2013 | Han et al. | |
| 8,559,235 | B2 | 10/2013 | Yoon et al. | |
| 8,654,587 | B2 | 2/2014 | Yoon et al. | |
| 8,716,779 | B2 | 5/2014 | Kim et al. | |
| 2004/0211999 | A1 * | 10/2004 | Yamamoto ........ | H01L 21/28044 257/296 |

(Continued)

FOREIGN PATENT DOCUMENTS

| KR | 1019980053431 | 9/1998 |
|---|---|---|
| KR | 1020020049125 | 6/2002 |

(Continued)

*Primary Examiner* — George Fourson, III
(74) *Attorney, Agent, or Firm* — F. Chau & Associates, LLC

(57) ABSTRACT

A nonvolatile memory device includes a memory cell array and a peripheral circuit. The peripheral circuit is connected to the memory cell array through conductive lines and includes transistors. Each of the transistors is formed on the substrate and includes first and second regions and a gate electrode. In at least one of the transistors, the first region is connected to at least one of the conductive lines through first contact plugs extending in the direction perpendicular to the substrate, and second contact plugs extending in the direction perpendicular to the substrate. A contact area of each of the first contact plugs is different from a contact area of each of the second contact plugs.

20 Claims, 40 Drawing Sheets

(56) References Cited

U.S. PATENT DOCUMENTS

| | | | |
|---|---|---|---|
| 2008/0157227 A1* | 7/2008 | Manabe | H01L 21/76897 257/401 |
| 2008/0210978 A1 | 9/2008 | Yabu et al. | |
| 2008/0259673 A1* | 10/2008 | Wise | G11C 11/15 365/158 |
| 2011/0006437 A1* | 1/2011 | Tsao | H01L 21/31144 257/774 |
| 2011/0233648 A1 | 9/2011 | Seol et al. | |
| 2011/0284963 A1 | 11/2011 | Yabu et al. | |
| 2012/0043592 A1* | 2/2012 | Zhao | H01L 21/76847 257/288 |
| 2012/0273965 A1* | 11/2012 | Seo | H01L 27/11565 257/774 |
| 2013/0069170 A1* | 3/2013 | Blatchford | H01L 27/0207 257/401 |
| 2014/0061939 A1 | 3/2014 | Yu et al. | |
| 2014/0117424 A1 | 5/2014 | Kim | |

FOREIGN PATENT DOCUMENTS

| | | |
|---|---|---|
| KR | 1020090070465 | 7/2009 |
| KR | 1020090065395 | 9/2009 |
| KR | 1020090109353 | 10/2009 |
| KR | 1020140028910 | 3/2014 |

\* cited by examiner

FIG. 30
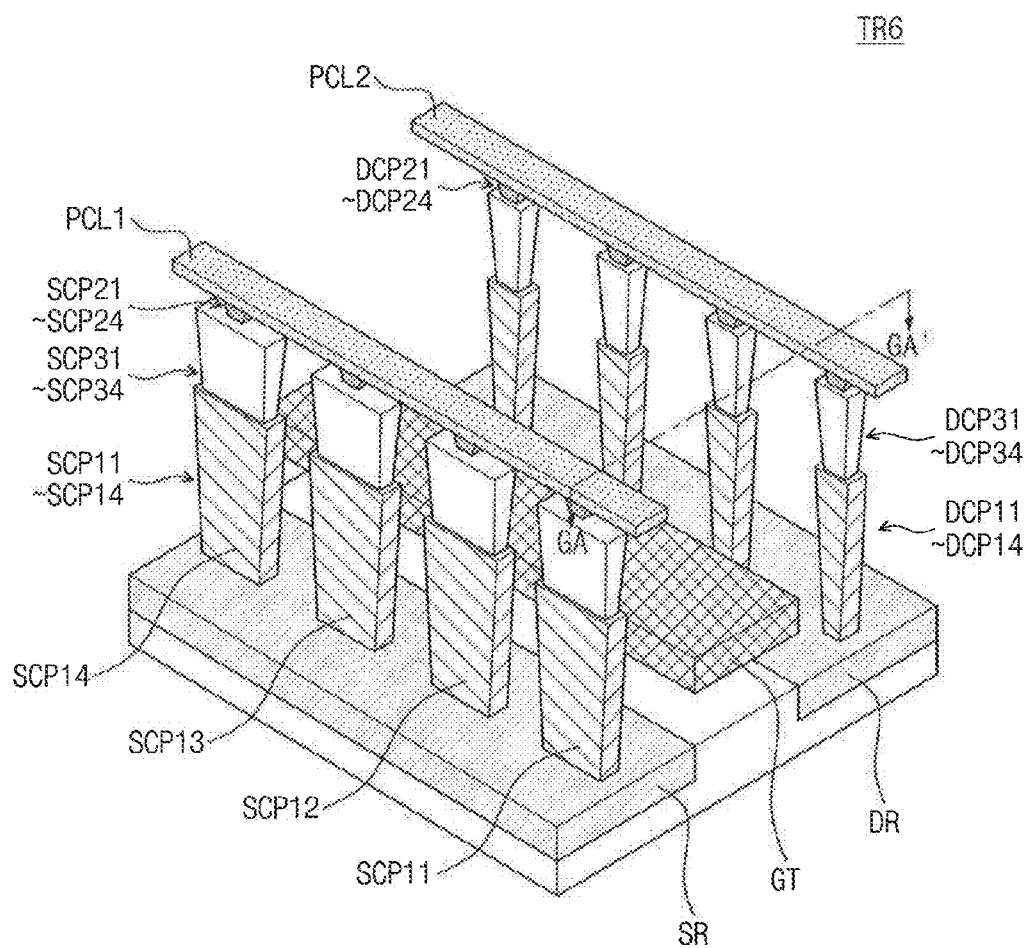
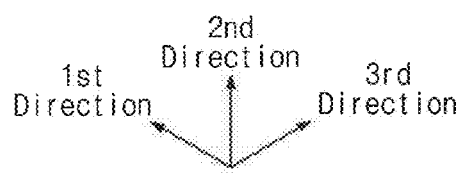

FIG. 35
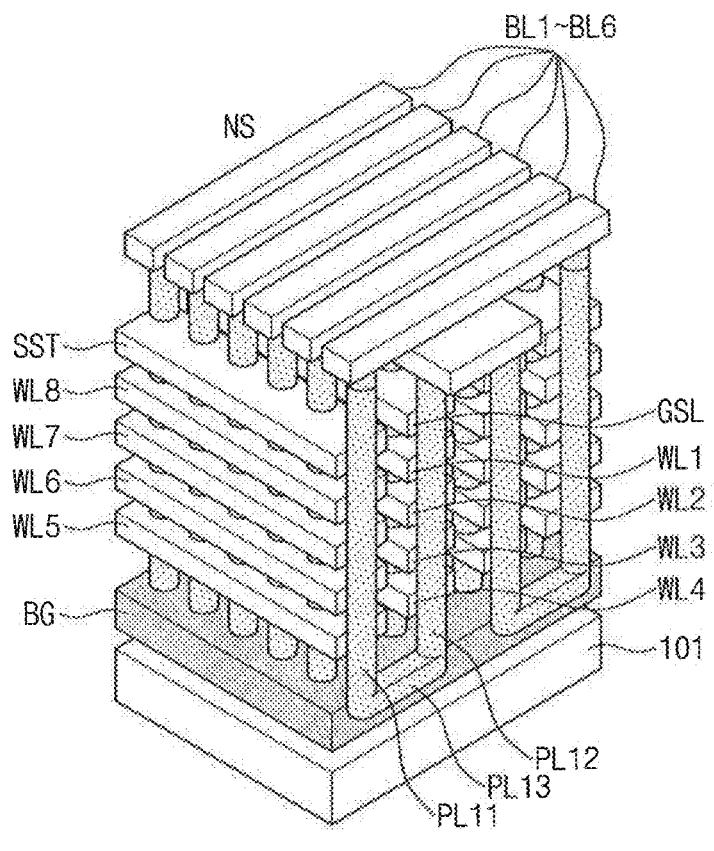
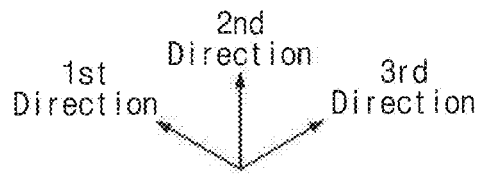

NONVOLATILE MEMORY DEVICE

CROSS-REFERENCE TO RELATED APPLICATION

This U.S. non-provisional patent application claims priority under 35 U.S.C. §119 to Korean Patent Application No. 10-2014-0122067 filed Sep. 15, 2014, in the Korean Intellectual Property Office, the disclosure of which is incorporated by reference herein in its entirety.

TECHNICAL FIELD

Exemplary embodiments of the present inventive concept relate to a semiconductor memory device, and more particularly, to a nonvolatile memory device.

DISCUSSION OF RELATED ART

A semiconductor memory device may include semiconductors, which include materials such as silicon (Si), germanium (Ge), gallium arsenide (GaAs), or indium phosphide (InP). Semiconductor memory devices may include volatile memory devices and nonvolatile memory devices.

A volatile memory device such as a Static RAM (Static Random Access Memory), a Dynamic RAM (DRAM), or a Synchronous DRAM (SDRAM) may lose stored data when power to the memory is lost. A nonvolatile memory device such as a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (RERAM), or a Ferroelectric RAM (FRAM) may retain stored data even when power is lost.

A three-dimensional stack-type flash memory may increase the degree of integration of a semiconductor memory device.

SUMMARY

According to exemplary embodiments of the present inventive concept, parasitic capacitance and resistance between transistors in a peripheral circuit of a nonvolatile memory device may be reduced. Accordingly, propagation delay in the peripheral circuit may be reduced and a performance of the nonvolatile memory device may be increased.

According to exemplary embodiments of the present inventive concept, a nonvolatile memory device includes a memory cell array including a plurality of cell strings. Each of the cell strings have memory cells stacked in a direction perpendicular to a substrate. A peripheral circuit is connected to the memory cell array through a plurality of conductive lines. The peripheral circuit includes a plurality of transistors. Each of the transistors is formed on the substrate. Each of the transistors includes first and second regions. The first and second regions include a conductive material different from a material included in the substrate. A gate electrode is disposed between the first and second regions. In at least one of the transistors, the first region is connected to at least one of the conductive lines through a plurality of first contact plugs extending in the direction perpendicular to the substrate, and a plurality of second contact plugs extending in the direction perpendicular to the substrate. Each of the second contact plugs is disposed on a respective first contact plug. A contact area of each of the first contact plugs is different from a contact area of each of the second contact plugs.

In exemplary embodiments, the contact area of each of the first and second contact plugs is an upper surface of each contact plug that is parallel with the substrate.

In exemplary embodiments, a first end of each of the first contact plugs is connected to the at least one conductive line and a second end of each of the first contact plugs is connected to a first end of each of the second contact plugs. The second end of each of the second contact plugs is connected to the first region.

In exemplary embodiments, a length of each of the first contact plugs is shorter than a length of each of the second contact plugs. The length extends in the direction perpendicular to the substrate.

In exemplary embodiments, the contact area of each of the plurality of first contact plugs is smaller than the contact area of each of the plurality of second contact plugs.

In exemplary embodiments, the number of the first contact plugs is greater than the number of the second contact plugs. The first end of the second contact plugs is connected to the second end of each of at least two of the first contact plugs.

In exemplary embodiments, a first length of each of the first contact plugs is shorter than a second length of each of the second contact plugs. The first and second lengths extend in a direction where the first region extends.

In exemplary embodiments, the second region of the at least one transistor is connected to at least one of the conductive lines through a plurality of third contact plugs. The fourth contact plugs extend in the direction perpendicular to the substrate and are disposed on the third contact plugs.

In exemplary embodiments, a second end of each of the fourth contact plugs is connected to the second region and thereof first end of each of the fourth contact plugs is connected to a second end of each of the third contact plugs. A first end of each of the third contact plugs is connected to the at least one conductive line.

In exemplary embodiments, the contact area of each of the plurality of second contact plugs is wider than the contact area of each of the plurality of fourth contact plugs.

In exemplary embodiments, the number of the second contact plugs is less than the number of the fourth contact plugs.

In exemplary embodiments, a metal layer is disposed on the memory cell array and the peripheral circuit. The metal layer includes the plurality of conductive lines.

In exemplary embodiments, a length of the peripheral circuit extending in the direction perpendicular to the substrate is shorter than a length of the memory cell array extending in the direction perpendicular to the substrate.

According to exemplary embodiments of the present inventive concept, a nonvolatile memory device which includes a memory cell array including a plurality of cell strings. Each of the cells strings includes memory cells stacked in a direction perpendicular to a substrate. A peripheral circuit is connected to the memory cell array through a plurality of conductive lines. The peripheral circuit includes a plurality of transistors. At least one of the transistors includes a source region and a drain region. The source region is connected to a first conductive line of the plurality of conductive lines through a plurality of source contact plugs extending in a direction perpendicular to the substrate. The drain region is connected to a second conductive line of the plurality of conductive lines through a plurality of drain contact plugs extending in the direction perpendicular to the substrate. A contact area of each of the source contact plugs is different from a contact area of each of the drain contact plugs. The contact area of each of the source and drain contact plugs is an area of each contact plug parallel with the substrate.

In exemplary embodiments, each of the source contact plugs includes a lower source contact plug including a second end connected to the source region. An upper source contact plug includes a second end connected to the first end of the lower source contact plug. A first end of the upper source contact plug is connected to the first conductive line. Each of the drain contact plugs includes a lower drain contact plug including a second end connected to the drain region. An upper drain contact plug includes a second end connected to a first end of the lower drain contact plug. A first end of the upper drain contact plug is connected to the second conductive line.

In exemplary embodiments, a contact area of the lower source contact plug of each source contact plug is larger than a contact area of the upper source contact plug of each source contact plug.

In exemplary embodiments, a contact area of the lower drain contact plug of each drain contact plug is larger than a contact area of the upper drain contact plug of each drain contact plug.

In exemplary embodiments, the number of the source contact plugs is greater than the number of the drain contact plugs.

In exemplary embodiments, each of the source contact plugs includes a lower source contact plug including a second end connected to the source region. An intermediate source contact plug includes a second end connected to a first end of the lower source contact plug. An upper source contact plug includes a second end connected to a first end of the intermediate source contact plug. A first end of the upper source contact plug is connected to the first conductive line. Each of the drain contact plugs includes a lower drain contact plug including a second end connected to the drain region. An intermediate drain contact plug includes a second end connected to a first end of the lower drain contact plug. An upper drain contact plug includes a second end connected to a first end of the intermediate drain contact plug. A first end of the upper drain contact plug is connected to the second conductive line.

In exemplary embodiments, a contact area of the lower source contact plug of each source contact plug is larger than a contact area of the intermediate source contact plug of each source contact plug and a contact area of the upper source contact plug of each source contact plug.

In exemplary embodiments, contact areas of the lower source contact plug and the intermediate source contact plug of each source contact plug are larger than a contact area of the upper drain contact plug of each drain contact plug.

In exemplary embodiments, a contact area of the lower source contact plug of each source contact plug is larger than a contact area of the lower drain contact plug of each drain contact plug, a contact area of the intermediate drain contact plug of each drain contact plug, and a contact area of the upper drain contact plug of each drain contact plug.

According to exemplary embodiments of the present inventive concept, a nonvolatile memory device which includes a memory cell array including a plurality of cell strings. each of the cell strings includes memory cells stacked in a direction perpendicular to a substrate. A peripheral circuit is connected to the memory cell array through a plurality of conductive lines. The peripheral circuit includes a plurality of transistors. The transistors include a first transistor and a second transistor adjacent to the first transistor. Source regions of the first and second transistors are connected to the conductive lines through a plurality of source contact plugs. The drain regions of the transistors are connected to the conductive lines through a plurality of drain contact plugs. A contact area of each of the drain contact plugs is narrower than a contact area of each of the source contact plugs. The source contact plugs of the first transistor are adjacent to the drain contact plugs of the second transistor. The contact area of the source and drain contact plugs is parallel with the substrate.

According to exemplary embodiments of the present inventive concept, a nonvolatile memory device which includes a memory cell array including a plurality of cell strings. Each of the cell strings includes memory cells stacked in a direction perpendicular to a substrate. A peripheral circuit is connected to the memory cell array through a plurality of conductive lines. The peripheral circuit includes a plurality of transistors. A source region of at least one of the transistors is connected to a first conductive line of the plurality of conductive lines through a plurality of source contact plugs and a drain region of the at least one transistor is connected to a second conductive line of the plurality of conductive lines through a plurality of drain contact plugs. Each of the source contact plugs includes first through n-th sub source contact plugs that are stacked in a direction perpendicular to the substrate. The first through n-th sub source contact plugs extend in the direction perpendicular to the substrate. Contact areas of at least two of the first through n-th sub source contact plugs are different from each other. The contact of the at least two of the first through n-th sub source contact plugs are parallel with the substrate.

In exemplary embodiments, each of the drain contact plugs includes first through n-th sub drain contact plugs that are stacked in the direction perpendicular to the substrate. The first through n-th sub drain contact plugs extend in the direction perpendicular to the substrate. A contact area of at least one of the first through n-th sub source contact plugs is larger than a contact area of at least one of the first through n-th sub drain contact plugs.

BRIEF DESCRIPTION OF THE FIGURES

The above and other features of the present inventive concept will become more apparent by describing in detail exemplary embodiments thereof, with reference to the accompanying drawings in which:

FIG. 30 is a perspective view of a transistor according to an exemplary embodiment of the present inventive concept;

FIG. 35 is a perspective view of a memory block according to an exemplary embodiment of the present inventive concept;

DETAILED DESCRIPTION

Figure 1:
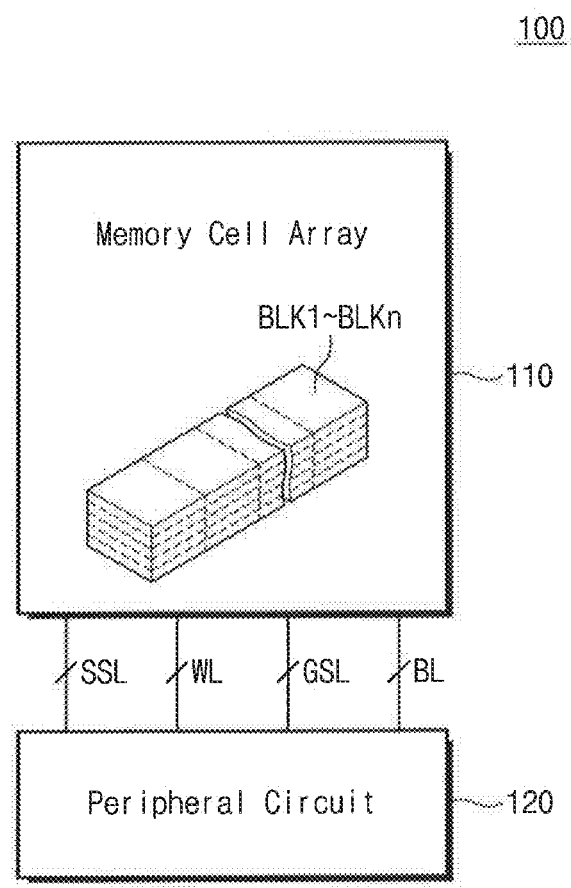
FIG. 1 is a block diagram schematically illustrating a nonvolatile memory device according to an exemplary embodiment of the present inventive concept.

Exemplary embodiments of the present inventive concept are disclosed herein. However, specific structural and functional details disclosed herein may be merely representative and may be provided for purposes of describing exemplary embodiments of the present inventive concept. Exemplary embodiments of the present inventive concept may, however, be embodied in alternate forms and the present inventive concept should not be construed as limited to only the exemplary embodiments set forth herein.

Accordingly, exemplary embodiments of the present inventive concept are capable of various modifications and alternative forms. It should be understood that there is no intent to limit the exemplary embodiments of the present inventive concept to the particular forms disclosed, but to the contrary, exemplary embodiments of the present inventive concept are to cover all modifications, equivalents, and alternatives falling within the scope of exemplary embodiments of the present inventive concept. Like reference numbers may refer to like elements throughout the specification and the figures.

It will be understood that, although the terms first, second, etc. may be used herein to describe various elements, these elements should not be limited by these terms.

It will be understood that when an element is referred to as being "connected" or "coupled" to another element, it may be directly connected or coupled to the other element or intervening elements may be present.

Although the terms first direction, second direction and third direction may be used herein for indicating directions; directions that the terms indicate may be different from one drawing to another or from one exemplary embodiment to another.

It should be noted that with regard to some exemplary embodiments of the present inventive concept the steps indicated in the specification or drawings may occur out of the order indicated in the specification or drawings.

A nonvolatile memory device according to an exemplary embodiment of the present inventive concept may include a memory cell array having a three-dimensional stack structure and a peripheral circuit connected to the memory cell array through a metal layer. The peripheral circuit may include a plurality of transistors, which may be connected to conductive lines of the metal layer through contact plugs. Resistance and capacitance in the contact plugs may be reduced by forming the contact plugs to have an asymmetrical structure (e.g., the number of contacts or areas of contacts may be variable), thereby reducing propagation delay due to resistance and capacitance. Thus, performance of the nonvolatile memory device may be increased.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram schematically illustrating a nonvolatile memory device according to an exemplary embodiment of the present inventive concept. Referring to FIG. 1, a nonvolatile memory device 100 may include a memory cell array 110 and a peripheral circuit 120.

The memory cell array 110 may include a plurality of memory blocks BLK1 through BLKn, each of which may have a plurality of strings. Each string may include a plurality of memory cells. Each memory cell may be a single level cell (SLC) storing one bit or a multi-level cell (MLC) storing at least two bits. According to exemplary embodiments of the present inventive concept, each memory block may have a three-dimensional vertical stack structure. A memory block of the three-dimensional vertical stack structure will be described in more detail below with reference to FIGS. 4 and 5.

The peripheral circuit 120 may be connected to the memory cell array 110 through string selection lines SSL, word lines WL, ground selection lines GSL, and bit lines BL. The peripheral circuit 120 may receive various types of signals from an external device (e.g., memory controller, host, or application processor) and may perform data reading or data writing about the memory cell array 110 in response to the received signals.

Figure 2:
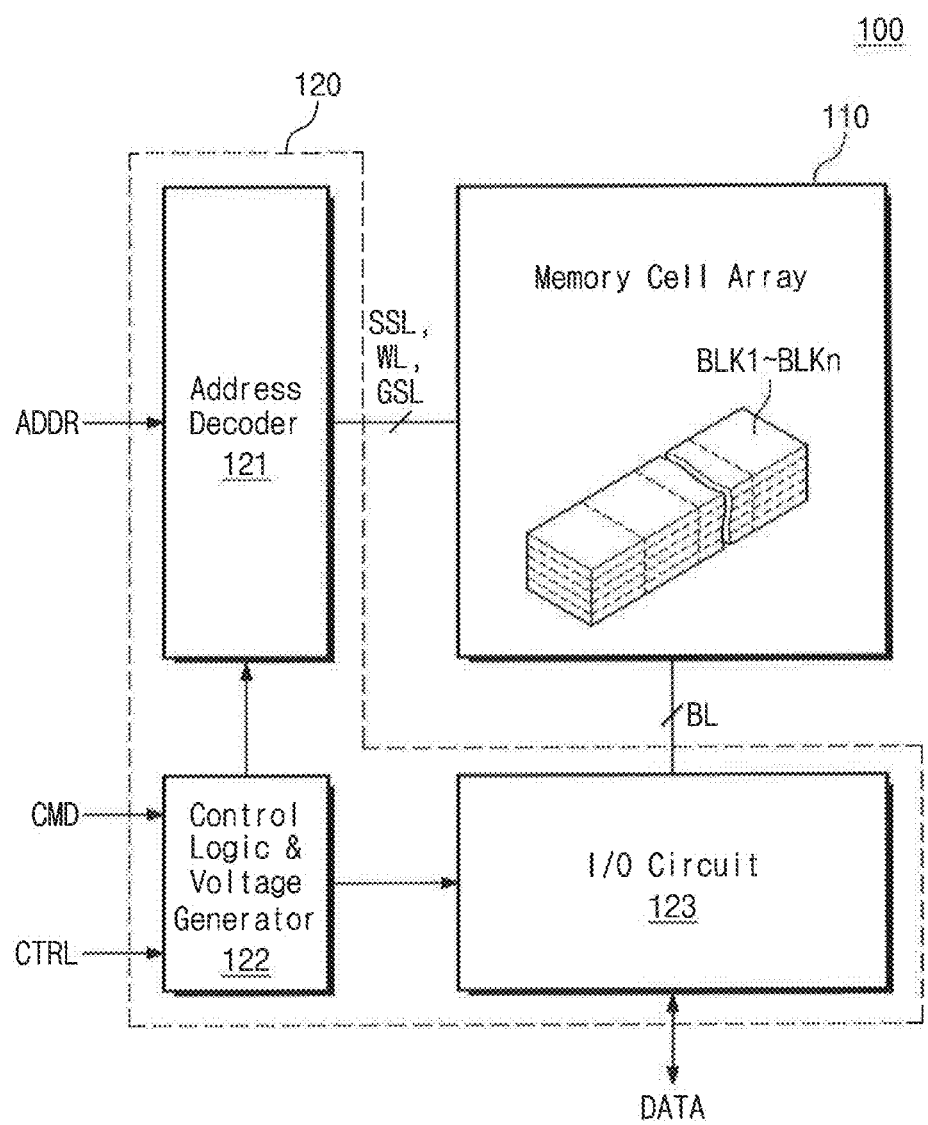
FIG. 2 is a block diagram schematically illustrating a nonvolatile memory device shown in FIG. 1.

FIG. 2 is a block diagram schematically illustrating a nonvolatile memory device shown in FIG. 1. Referring to FIG. 2, the nonvolatile memory device 100 may include the memory cell array 110 and the peripheral circuit 120. The memory cell array 110 may include the plurality of memory blocks BLK1 through BLKn. The peripheral circuit 120 may include an address decoder 121, a control logic and voltage generator block 122, and an input/output circuit 123.

The address decoder 121 may receive an address ADDR from an external device (e.g., memory controller, host, or application processor). The address decoder 121 may decode the address ADDR to select at least one of the word lines WL. The address decoder 121 may drive the selected word line in response to a control signal from the control logic and voltage generator block 122.

The control logic and voltage generator block 122 may control the address decoder 121 and the input/output circuit 123 in response to a command CMD and a control signal CTRL received from the external device. The control logic and voltage generator block 122 may control the address decoder 121 and the input/output circuit 123 in response to the command CMD and the control signal CTRL such that data is written in the memory cell array 110. The control logic and voltage generator block 122 may control the address decoder 121 and the input/output circuit 123 in response to the command CMD and the control signal CTRL such that data stored in the memory cell array 110 may be output.

The control logic and voltage generator block 122 may generate various voltages and may transmit the voltages to operate the nonvolatile memory device 1100. For example, the control logic and voltage generator block 122 may generate various voltages including a plurality of selection read voltages, a plurality of non-selection read voltages, a plurality of program voltages, a plurality of pass voltages, a plurality of erase voltages, and/or a plurality of verification voltages. The voltages thus generated may be provided to the memory cell array 110 through the address decoder 121. In exemplary embodiments of the present inventive concept, various voltages generated by the control logic and voltage generator block 122 may be supplied a plurality of word lines through the address decoder 121. Various voltages supplied to the plurality of word lines may be variable depending on sizes or cell speeds of memory cells connected to the plurality of word lines.

The input/output circuit 123 may be connected to the memory cell array 110 through the bit lines BL and may exchange data with the external device. The input/output circuit 123 may control the bit lines BL such that data from the external device may written in the memory cell array 110. The input/output circuit 123 may control the bit lines BL such that data written in the memory cell array 110 may be output and the read data may be output to the external device.

In exemplary embodiments of the present inventive concept, the input/output circuit 123 may operate as a read driver or a write driver. The input/output circuit 123 may include a page buffer, a page register, a column selector, and/or a data buffer. In exemplary embodiments of the present inventive concept, the input/output circuit 123 may include a sense amplifier, a write driver, a column selector, and/or a data buffer.

In exemplary embodiments of the present inventive concept, the peripheral circuit 120 may include a plurality of transistors, a plurality of resistors, and a plurality of capacitors. Components of the peripheral circuit 120 may include the transistors, resistors, and capacitors.

Figure 3:
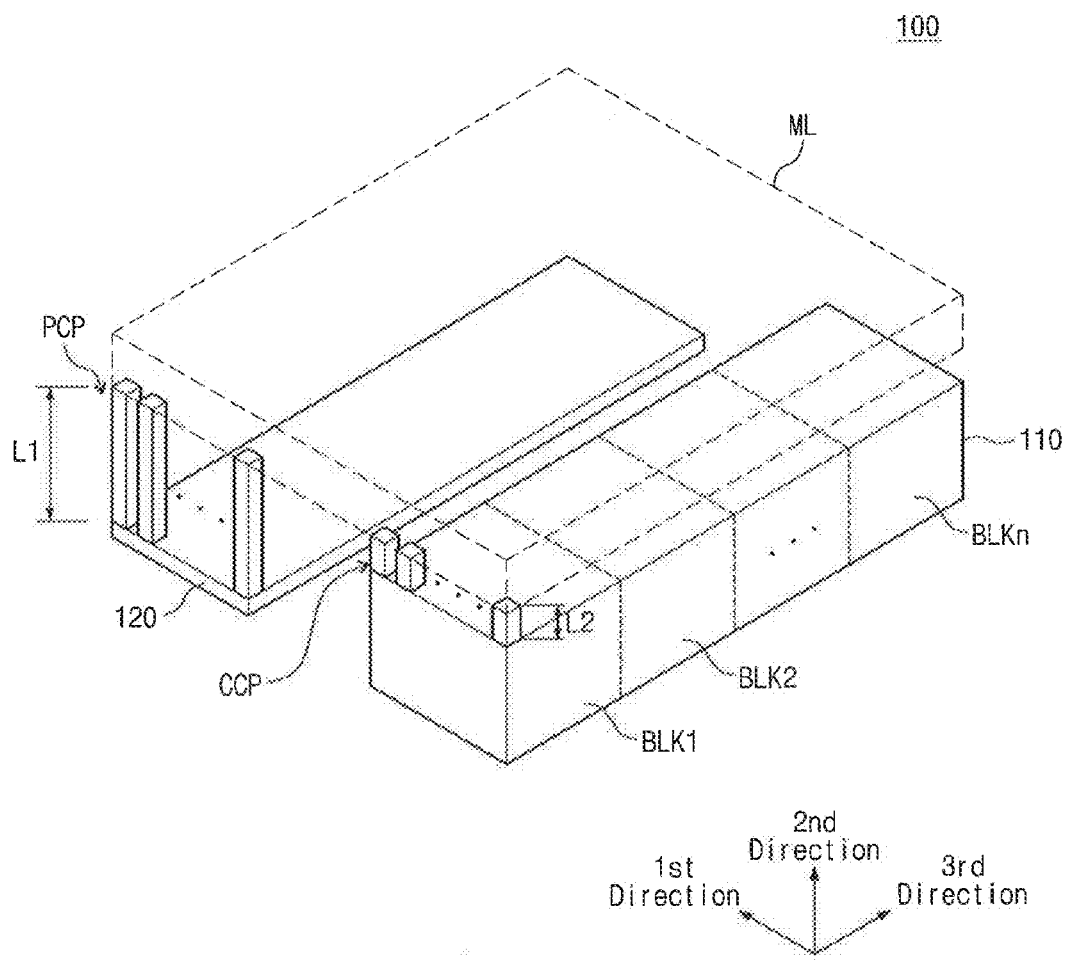
FIG. 3 is a perspective view schematically illustrating a nonvolatile memory shown in FIG. 1.

FIG. 3 is a perspective view schematically illustrating a nonvolatile memory shown in FIG. 1. Referring to FIG. 3, the nonvolatile memory device 100 may include the memory cell array 110 and the peripheral circuit 120. The memory cell array 110 and the peripheral circuit 120 may be connected to each other by a metal layer ML. For example, the metal layer ML may include a plurality of conductive lines. The memory cell array 110 and the peripheral circuit 120 may be electrically connected to each other by at least one of the conductive lines. The conductive lines may include a same material as the bit line.

The metal line ML may be disposed over the memory cell array 110 and the peripheral circuit 120. The memory cell array 110 may be connected to the metal layer by one or more cell contact plugs CCP. The peripheral circuit 120 may be connected to the metal layer ML one or more peripheral contact plugs PCP. For example, the memory cell array 110 may be connected to at least one of the conductive lines by the cell contact plugs CCP. The peripheral circuit 120 may be connected to at least one of the conductive lines by the peripheral contact plugs PCP.

According to exemplary embodiments of the present inventive concept, the memory cell array 110 may include the plurality of memory blocks BLK1 through BLKn. Each memory block may have a three-dimensional vertical stack structure. For example, each memory block may include a structure that is stacked along a second direction along a plane extending along first and third directions.

The peripheral circuit 120 may have a plane structure. For example, the peripheral circuit 120 may include the plurality of transistors that may be disposed on the plane extending along the first and third directions. The height of the memory cell array 110 (e.g., a second-direction length) may be different from that of the peripheral circuit 120. In exemplary embodiments, the height of the memory cell array 110 is higher than that of the peripheral circuit 120.

As described above, lengths of the cell contact plugs CCP and lengths of the peripheral contact plugs PCP are different from each other because the height of the memory cell array 110 is different from that of the peripheral circuit 120. For example, the peripheral contact plugs PCP may have a first length L1, and the cell contact plugs CCP may have a second length L2 shorter than the first length L1.

According to exemplary embodiments of the present inventive concept, the peripheral contact plug PCP may include a first peripheral contact plug extending along the second direction and a second peripheral contact plug extending along the second direction from the first peripheral contact plug. The peripheral contact plug PCP may have a multi-layer stack structure.

As described above, as the height of the memory cell array 110 increases, the height (e.g., the first length L1) of the peripheral contact plugs PCP may also increase.

When the height of the peripheral contact plugs PCP increases, the resistance of the peripheral contact plugs PCP and parasitic capacitance between the peripheral contact plugs PCP may increase. Thus, a propagation delay in signals transmitted to the peripheral circuit 120 by the metal layer ML and the peripheral contact plugs PCP or in signals transmitted from the peripheral circuit 120 by the metal layer ML and the peripheral contact plugs PCP may increase.

Figure 4:
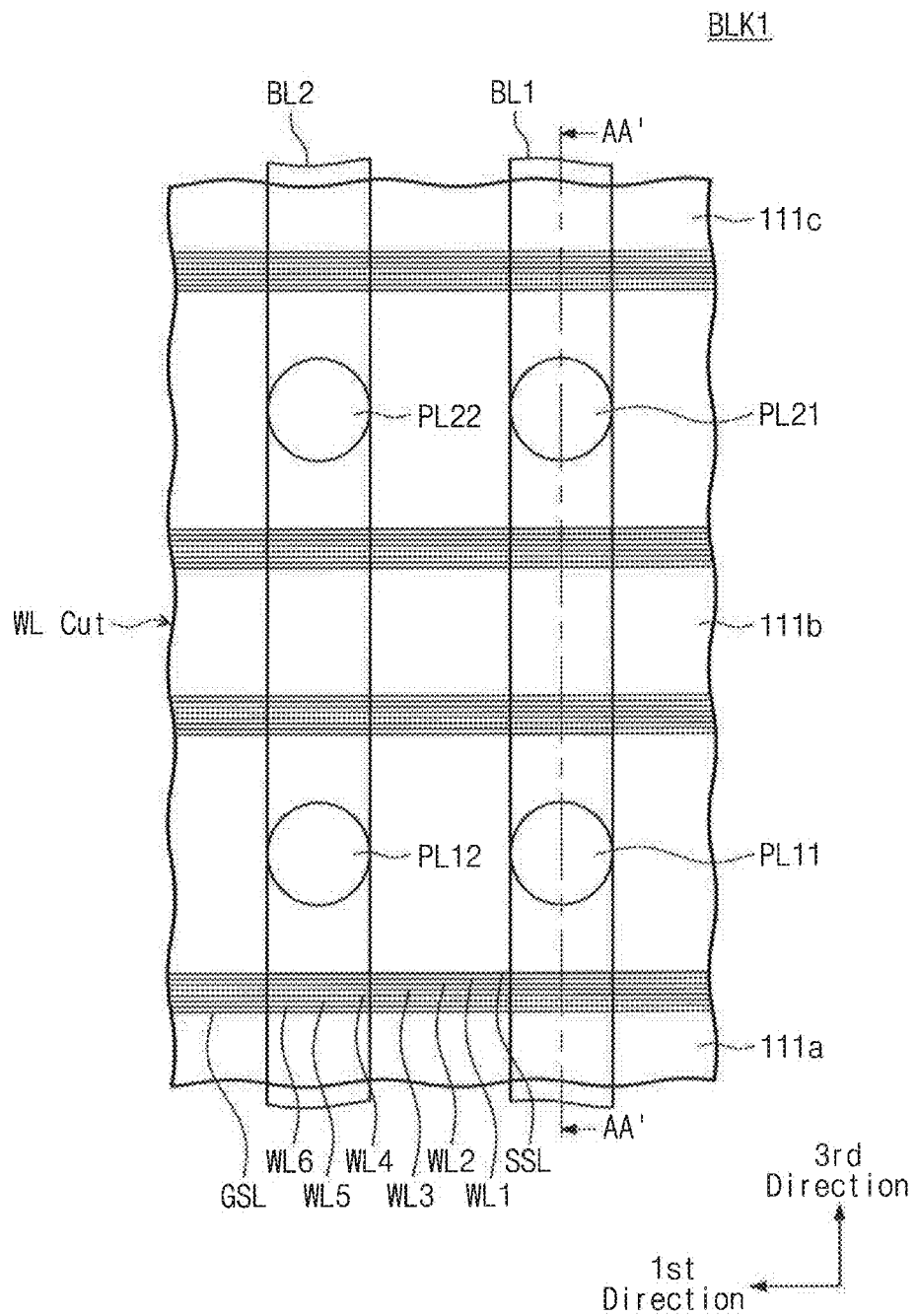
FIG. 4 is a plan view of a memory block shown in FIG. 1.
Figure 5:
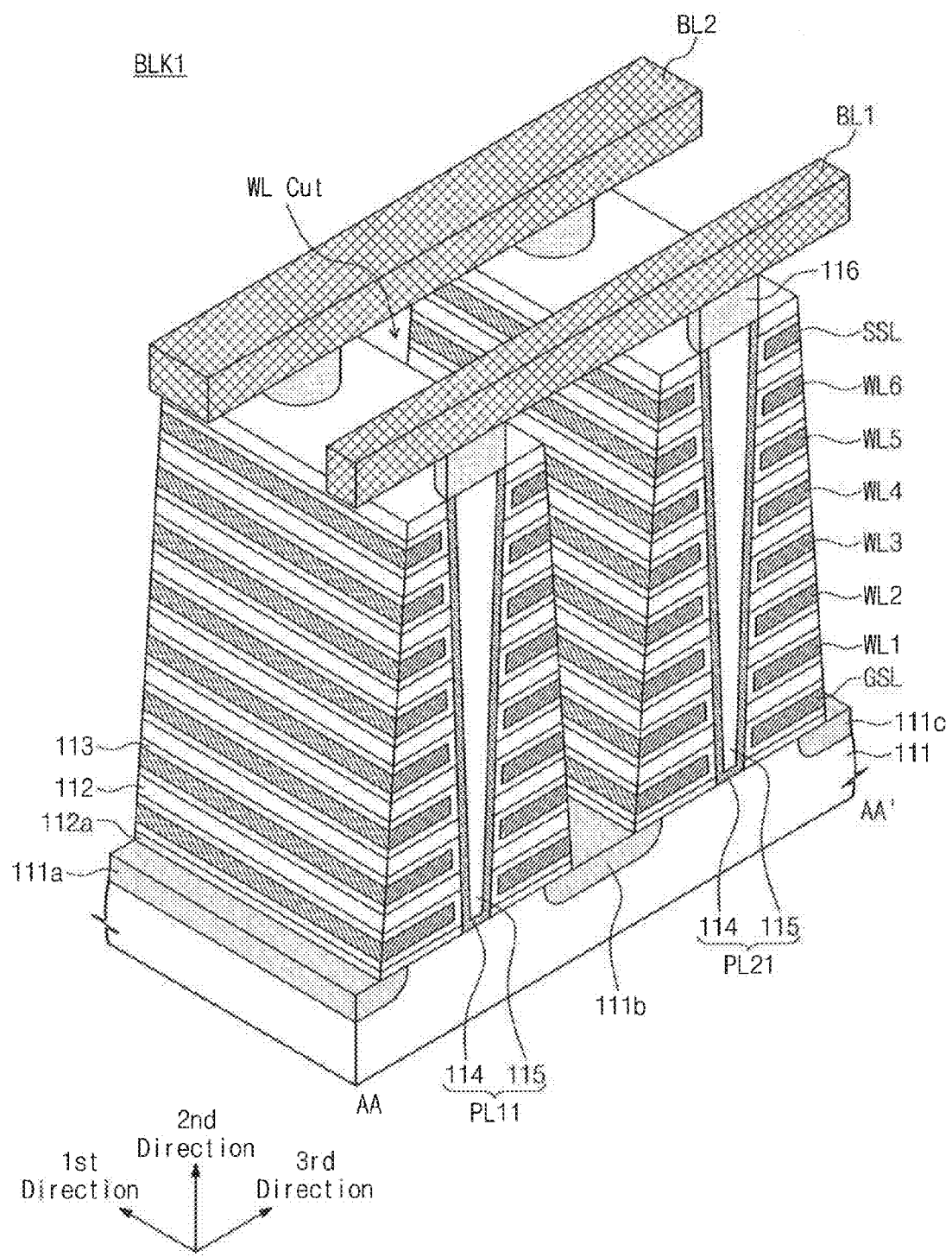
FIG. 5 is a perspective view taken along line AA-AA' in FIG. 4.
Figure 6:
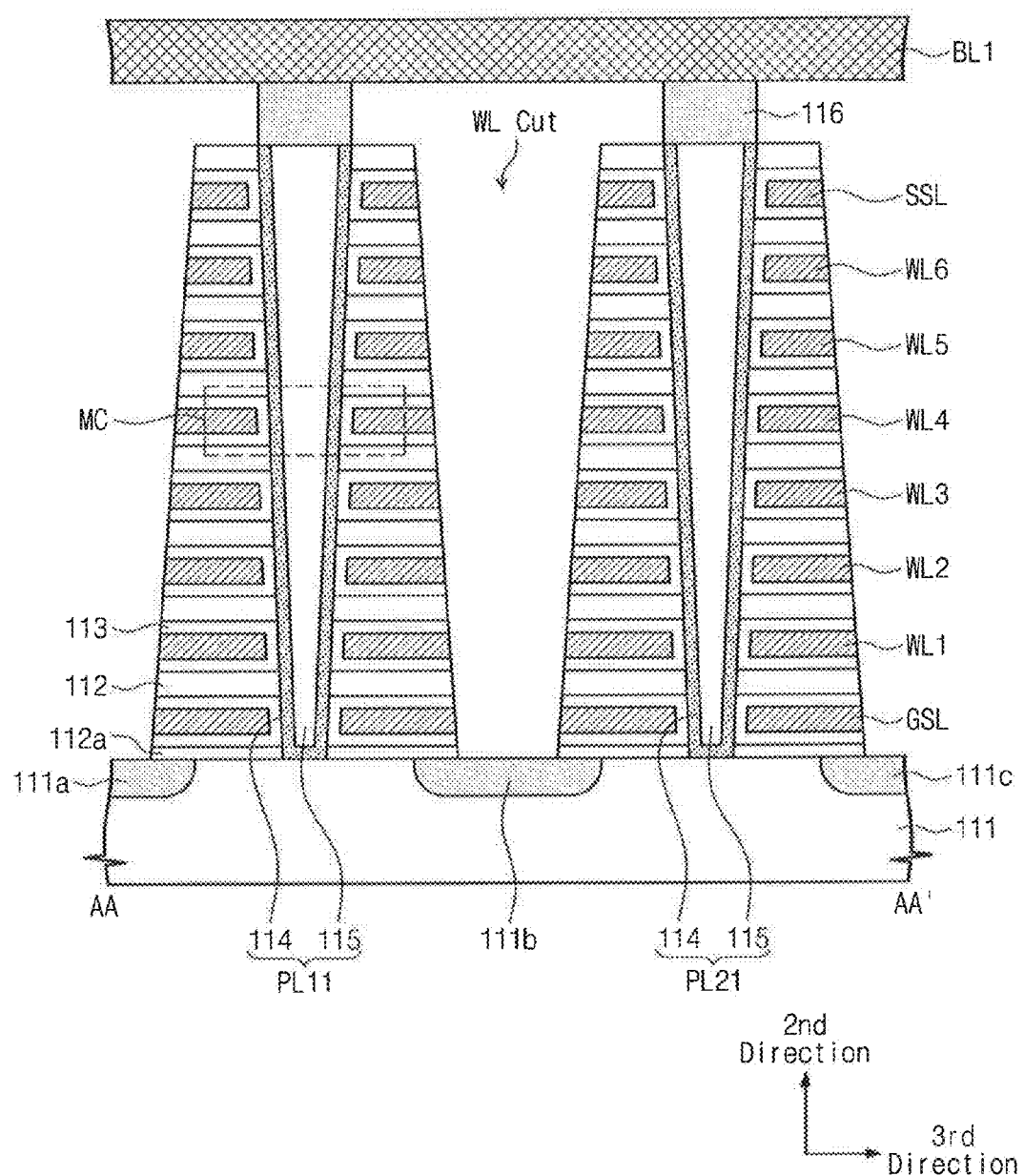
FIG. 6 is a cross-sectional view taken along line AA-AA' in FIG. 4.

FIG. 4 is a plan view of a memory block shown in FIG. 1. FIG. 5 is a perspective view taken along line AA-AA' in FIG. 4. FIG. 6 is a cross-sectional view taken along line AA-AA' in FIG. 4.

Referring to FIGS. 4 to 6, a first memory block BLK1 may include structures extending along first, second, and third directions.

A substrate 111 may be disposed in a plane along the first and third directions. The substrate 111 may include a well having a first conductivity type. According to exemplary embodiments of the present inventive concept, the substrate 111 may include a p-well including a Group 3 element. For example, boron may be injected in the p-well. According to exemplary embodiments of the present inventive concept, the substrate 111 may include a pocket p-well which is disposed within an n-well. Below, the substrate 111 may include a p-well (or, a pocket p-well). However, the substrate 111 is not limited to a p-well or a pocket p-well.

A plurality of doping regions 111a through 111c disposed along the first direction may be disposed in the substrate 111. The doping regions 111a through 111c may be formed by doping the substrate 111 with a conductive material different from the substrate 111. According to exemplary embodiments of the present inventive concept, the doping regions 111a through 111c may include an n-type doping region. Below, the doping regions 111a through 111c may include the n-type doping region. However, the doping regions 111a through 111c are not limited to the n-type doping region.

The doping regions 111a through 111c may be spaced apart from each other along the third direction. In FIGS. 4 through 6, the doping regions 111a through 111c may be referred to as first through third doping regions 111a through 111c, respectively.

Between two adjacent regions of the first to third doping region 111a through 111c, a plurality of insulation materials 112 and 112a may be sequentially stacked on the substrate 111 along the second direction (e.g., a direction perpendicular to the substrate 111). The insulation materials 112 and 112a may be spaced apart from each other along the second direction. The insulation materials 112 and 112a may be disposed along the first direction. According to exemplary embodiments of the present inventive concept, the insulation materials 112 and 112a may include an insulation material such as a sillicon oxide film. A thickness of the insulation material 112a in contact with the substrate 111, from among the insulation materials 112 and 112a may be thinner than the other insulation materials 112 that are not in contact with the substrate 111.

Between two adjacent regions of the first to third doping region 111a through 111c, a plurality of pillars PL11, PL12, PL21, and PL22 may be disposed along the first direction. The pillars PL11, PL12, PL21, and PL22 may respectively penetrate the insulation materials 112 and 112a along the second direction. According to exemplary embodiments of the present inventive concept, the pillars PL11, PL12, PL21, and PL22 may be in contact with the substrate 111 through the insulation materials 112 and 112a.

According to exemplary embodiments of the present inventive concept, the pillars PL11, PL12, PL21, and PL22 may have a multi-layer structure. Each of the pillars PL11, PL12, PL21, and PL22 may include an inner material 115 and a channel film 114 surrounding the inner material 115.

The channel film 114 may include a semiconductor material (e.g., silicon) having a first conductivity type. For example, the channel film 114 may include a semiconductor material (e.g., silicon) having the same conductivity type as the substrate 111. Below, the channel film 114 may include p-type silicon. However, the channel film 114 is not limited to —type silicon. The channel film 114 may include an intrinsic semiconductor, which may be a nonconductor.

Between two adjacent regions of the first to third doping region 111a through 111c, information storage films 113 may be disposed on exposed surfaces of the insulation materials 112 and 112a and the pillars PL11, PL12, PL21, and PL22. A thickness of the information storage films 113 may be less than a distance between the insulation films 112 and 112a. According to exemplary embodiments of the present inventive concept, the information storage films 113 may be disposed around each of the plurality of pillars PL11 through PL22 along the second direction.

Between two adjacent regions of the first to third doping region 111a through 111c, conductive materials SSL, WL1 through WL6, and GSL may be disposed on exposed surfaces of the information storage films 113. The conductive materials SSL, WL1 through WL6, and GSL may be disposed along the first direction and may be disposed between information storage film disposed on a lower surface of an upper-layer insulation material of the insulation material 112 and 112a and an information storage film disposed on an upper surface of a lower-layer insulation material thereof. For example, the conductive materials SSL, WL1 through WL6, and GSL may include the string selection line SSL, the plurality of word lines WL1 through WL6, and the ground selection line GSL.

Drains 116 may be disposed on the pillars PL11, PL12, PL21, and PL22, respectively. The drains 116 may include a semiconductor material (e.g., silicon) having the second conductivity type, for example. The drains 116 may include an n-type semiconductor material (e.g., silicon), for example. Below, the drains 116 may include n-type silicon. However, exemplary embodiments of the present inventive concept are not limited thereto. The drains 116 may be disposed on tops of the channel films 114 of the pillars PL11, PL12, PL21, and PL22.

Bit lines BL1 and BL2 may be disposed on the drains 116. The bit lines BL1 and BL2 may be disposed along the first direction and may extend along the third direction. The bit lines BL1 and BL2 may be connected to the drains 116. For example, the drains 116 and the bit lines BL1 and BL2 may be connected to each other by bit line contact plugs (not shown). The bit lines BL1 and BL2 may include one or more conductive metallic materials. According to exemplary embodiments of the present inventive concept, the bit lines BL1 and BL2 may include conductive non-metallic materials, such as polysilicon.

Below, rows and columns of the pillars PL11, PL12, PL21, and PL22 of the memory block BLK are described in more detail. According to exemplary embodiments of the present inventive concept, rows of the pillars PL11, PL12, PL21, and PL22 may be defined by whether the conductive materials SSL, WL1 through WL6, and GSL are separated from each other. In FIGS. 4 to 6, the conductive materials SSL, WL1 through WL6 and GSL may be separated by word line cuts in the center as the second doping region 111b. Columns of the pillars PL11, PL12, PL21, and PL22 may be defined by the bit lines BL1 and BL2.

The plurality of pillars PL11, PL12, PL21, and PL22 may form a plurality of cell strings together with the information storage films 113 and the plurality of conductive materials SSL, WL1 through WL6, and GSL. Each of the pillars PL11, PL12, PL21, and PL22 may form the cell string with the information storage film 113 and an adjacent conductive material.

Figure 7:
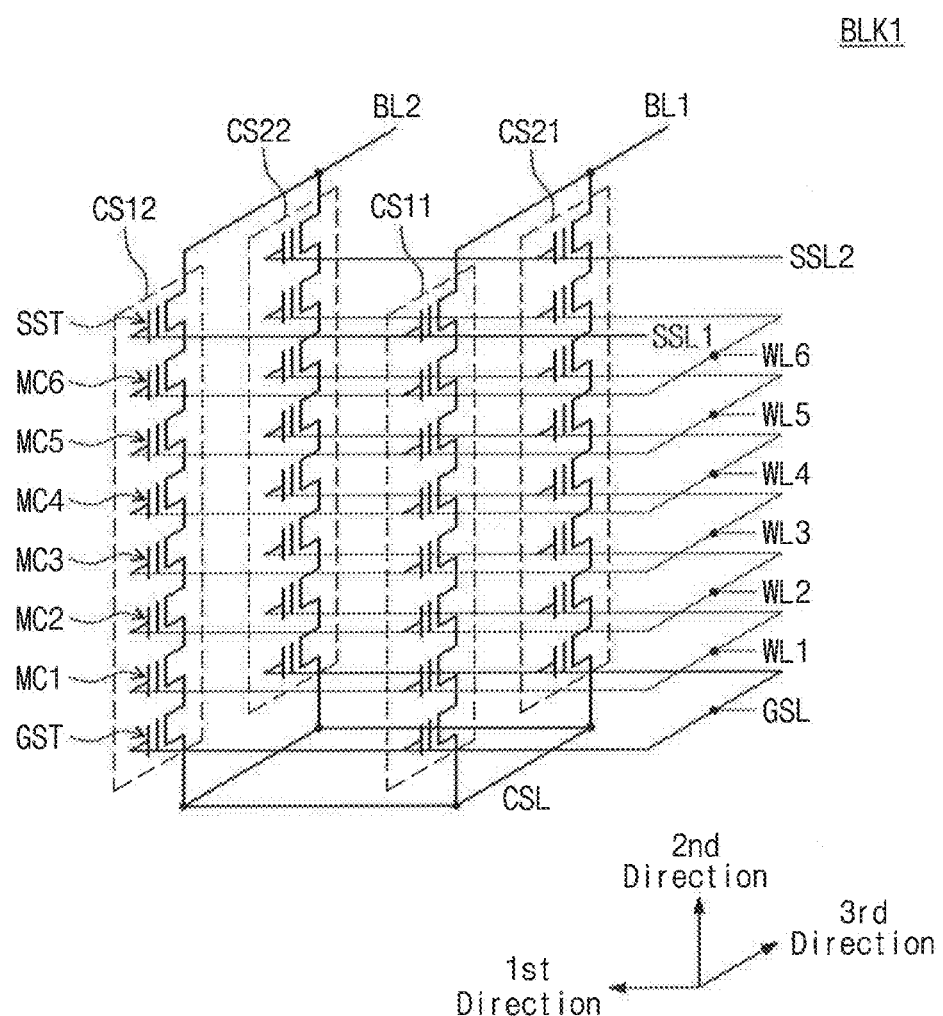
FIG. 7 is an equivalent circuit diagram of a memory block shown in FIGS. 4 through 6.

FIG. 7 is an equivalent circuit diagram of a first memory block shown in FIGS. 4 through 6. Referring to FIG. 7, the first memory block BLK1 may include a plurality of cell strings CS11, CS12, CS21, and CS22. The cell strings CS11, CS12, CS21, and CS22 may be disposed in a row direction and a column direction to form rows and columns.

Each of the cell strings CS11, CS12, CS21, and CS22 may include a plurality of cell transistors. In each cell string, the cell transistors may include a string selection transistor SST, a plurality of memory cells MC1 through MC6, and a ground selection transistor GST. Each of the string selection transistors SST may be connected to the string selection line SSL. The string selection line SSL is divided into first and second string selection lines SSL1 and SSL2. The memory cells MC1 through MC6 may be respectively connected to word lines WL1 through WL8. Word lines at the same height may be connected to each other. The ground selection transistor GST may be connected to the ground selection line GSL. Each cell string may be connected between the bit line BL and a common source line CSL. In each cell string, the string selection transistor SST may be connected to the bit line BL and the ground selection transistor GST may be connected to the common source line CSL.

Cell strings that are disposed in the same column may be connected to the same bit line BL. For example, the cell strings CS11 and CS21 may be connected to the first bit line BL1 and the cell strings CS12 and CS22 may be connected to the second bit line BL2.

Cell strings that are disposed in the same row may be connected to the same string selection line SSL. For example the cell strings CS11 and CS21 may be connected to the first string selection line SSL1 and the cell strings CS12 and CS22 may be connected to the second string selection line SSL2.

Each of the cell strings CS11, CS12, CS21, and CS22 may be stacked along a direction perpendicular to the substrate 111 (see, e.g., FIG. 4). For example, the ground selection transistor GST, memory cells MC1 through MC6, and the string selection transistor SST may be stacked along the direction perpendicular to the substrate 111. According to exemplary embodiments of the present inventive concept, the memory cells may include a charge trap flash (CTF) memory cell.

The first memory block BLK1 described with reference to FIGS. 4 through 7 have been described as examples, however, exemplary embodiments of the present inventive concept are not limited thereto. For example, the number of rows of cell strings may be higher or lower than described with reference to FIGS. 4 through 7. As the number of rows of cell strings is changed, the number of string selection lines SSL or ground selection lines GSL connected to rows of cell strings and the number of cell strings connected to the bit line BL may be changed.

The number of columns of cell strings may be higher or lower than described with reference to FIGS. 4 through 7. As the number of columns of cell strings is changed, the number of bit lines BL connected to columns of cell strings and the number of cell strings connected to a string selection line SSL may be changed.

Heights of the cell strings may be higher or lower than described with reference to FIGS. 4 through 7. For example, the number of stacked memory cells of each cell string may be higher or lower than described with reference to FIGS. 4 through 7. The number of word lines may also be higher or lower than described with reference to FIGS. 4 through 7. For example, the number of ground selection transistors GST or string selection transistors SST in each cell string may be higher or lower than described with reference to FIGS. 4 through 7. As the number of ground selection transistors GST or string selection transistors SST in each cell string is changed, the number of string selection lines SSL or ground selection lines GSL may also be changed. When the number of string selection transistors SST or ground selection transistors GST increases, the number of string selection transistors SST or ground selection transistors GST may be stacked in the same form as the memory cells MC1 through MC6.

According to exemplary embodiments of the present inventive concept, reading and writing may be performed by a unit of the cell string row. The cell strings CS11, CS21, CS12, and CS22 may be selected by the unit of the cell string row by selectively activating the string selection lines SSL1 and SSL2.

In the selected row, writing and reading may be performed by a page. The page may be a row of memory cells connected to a word line. In the selected row, memory cells may be selected by the page by selectively activating the word lines WL1 through WL6.

Figure 8:
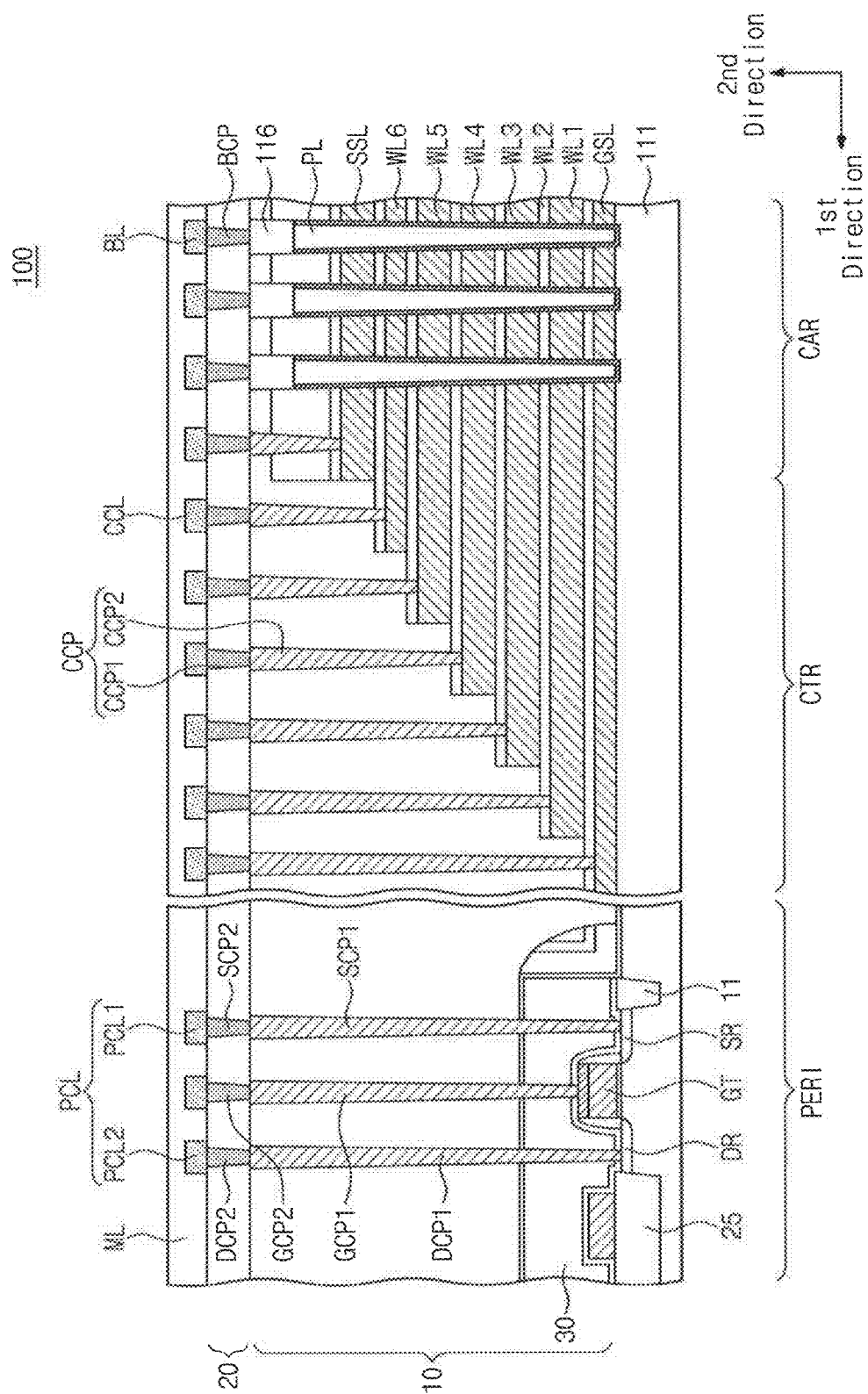
FIG. 8 is a cross-sectional view of a nonvolatile memory device shown in FIG. 3.

FIG. 8 is a cross-sectional view of a nonvolatile memory device shown in FIG. 3. In FIG. 8, there is illustrated a cross section that is based on a plane defined by the first and second directions. Referring to FIGS. 3 and 8, the nonvolatile memory device 100 may include a cell array region CAR, a peripheral circuit region PERI, and a contact region CTR disposed between the cell array region CAR and the peripheral circuit region PERI.

A cell array structure (e.g., memory cell array 110 or memory blocks BLK1 through BLKn) may be disposed in the cell array region CAR of the substrate 111. A peripheral logic structure (e.g., peripheral circuit 120 or components included in the peripheral circuit 120) may be disposed in the peripheral circuit region PERI of the substrate 111. The cell array structure may have a first height, and some components of the cell array structure, such as word lines WL, string selection line SSL, and ground selection line GSL may extend into the contact region CTR. The peripheral logic structure may have a second height lower than the first height.

The cell array structure may include memory blocks that are vertically stacked on the substrate 111. A memory block is described with reference to FIGS. 4 through 7, and duplicative descriptions thereof may be omitted.

Pillars PL may be connected to bit lines BL through drains 116 disposed along the second direction, and the pillars PL may be connected to bit line contact plugs BCP. The bit lines BL may be disposed in the metal layer ML. According to exemplary embodiments of the present inventive concept, the bit line contact plugs BCP may be disposed in a second insulation layer 20. The cell array structure may be disposed in a first insulation layer 10.

A contact structure may be disposed in the contact region CTR connecting the cell array structure of the cell array region CAR to the peripheral circuit 120 of the peripheral circuit region PERI. For example, some components of the cell array structure, such as word lines WL, string selection line SSL, and ground selection line GSL, may extend along the first direction into the contact region CTR. Cell contact plugs CCP (e.g., lower contact plug CCP1 and upper contact plug CCP2) may penetrate the first and second insulation layers 10 and 20. The cell contact plugs CCP may electrically connect a cell conductive line CML and the some components (e.g., WL, SSL, and GSL) of the cell array structure in the cell array region CAR extended to the contact region CTR. For example, the cell contact plug CCP may include the upper cell contact plug CCP2 of which one end is connected to a conductive line and the lower cell contact plug CCP1 of which one end is connected to one of the some components (e.g., WL, SSL, and GSL) of the cell array structure. The upper cell contact plug CCP2 may be disposed in the second insulation layer 20 and the lower cell contact plug CCP1 may be disposed in the first insulation layer 10.

A peripheral logic structure (e.g., peripheral circuit 120) may be disposed in the peripheral circuit region PERI of the substrate 111. The peripheral logic structure may include transistors, resistors, and capacitors.

A device isolation film 11 defining an active region may be disposed in the peripheral circuit region PERI of the substrate 111. The peripheral logic structure of the peripheral circuit region PERI may include a gate electrode GT. The gate electrode GT may extend along the first direction and may traverse the active region, source and drain regions SR and DR disposed in the active region and at both sides of the gate electrode GT, and a peripheral insulation pattern 30 covering peripheral circuits. The peripheral logic structure may include a resistor pattern 25. The peripheral insulation pattern 30 may cover the gate electrode GT and the resistor pattern 25. An upper surface of the peripheral insulation pattern 30 may be lower than an upper surface of the cell array structure.

The cell array region CAR, the contact region CTR, and the peripheral circuit region PERI may be disposed in the first insulation layer 10. The first insulation layer 10 may have a planarized upper surface that may cover end portions of memory blocks of the cell array region CAR.

The second insulation layer 20 may be disposed on the first insulation layer 10. A height (e.g., a second-direction length) of the second insulation layer 20 may be less than that of the first insulation layer 10. The second insulation layer 20 may include contact plugs connecting the first insulation layer 10 to conductive lines disposed in the metal layer ML.

Peripheral conductive lines PCL1 and PCL2 may be disposed on the second insulation layer 20 of the peripheral circuit region PERI. The peripheral conductive lines PCL may extend from the peripheral circuit region PERI to the cell array region CAR. The peripheral conductive lines PCL may extend in parallel in the third direction perpendicular to the first direction. The peripheral conductive lines PCL may include the same conductive material as bit lines BL of the cell array region CAR.

When viewed from a vertical perspective, a source contact plug SCP may be disposed between the source region SR and the metal layer ML. The source contact plug SCP may electrically connect a peripheral conductive line PCL1 to the source region SR. According to exemplary embodiments of the present inventive concept, the source contact plug SCP may include a lower source contact plug SCP1 of which one end is connected to the source region SR and an upper source contact plug SCP2 of which one end is connected to the peripheral conductive line PCL. The lower source contact plug SCP1 may be disposed in the first insulation layer 10, and the upper source contact plug SCP2 may be disposed in the second insulation layer 20.

A drain contact plug DCP may be disposed between the drain region DR and the metal layer ML. The drain contact plug DCP may electrically connect the peripheral conducive line PCL2 to the drain region DR. According to exemplary embodiments of the present inventive concept, the drain contact plug DCP may include a lower drain contact plug DCP1 of which one end is connected to the drain region DR and an upper drain contact plug DCP2 of which one end is connected to the peripheral conductive line PCL2. The lower drain contact plug DCP1 may be disposed in the first insulation layer 10, and the upper drain contact plug DCP2 may be disposed in the second insulation layer 20.

A gate contact plug GCP may be disposed between the gate electrode GT and the metal layer ML. The gate contact plug GCP may include an upper gate contact plug GCP2 and a lower gate contact plug GCP1.

As described above, contact plugs GCP connecting the metal layer ML to the peripheral circuit 120 may have the multi-layer stack structure.

Figure 9:
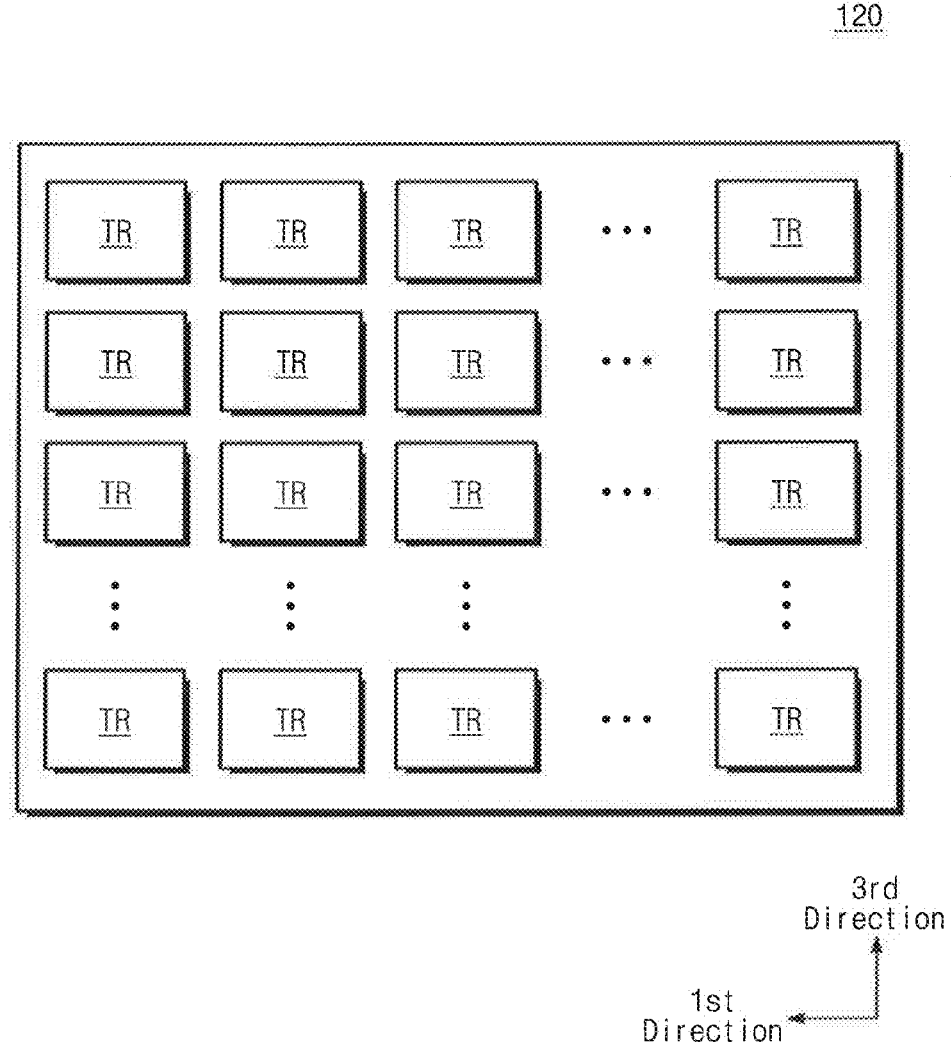
FIG. 9 is a plan view of a peripheral circuit shown in FIG. 8.

FIG. 9 is a plan view of a peripheral circuit shown in FIG. 8. Referring to FIGS. 8 and 9, the peripheral circuit 120 may include a plurality of transistors TR. The transistors TR may be disposed in the peripheral circuit region PERI of the substrate 111. The transistors TR may be connected to peripheral conductive lines PCL of the metal layer ML by peripheral contact plugs PCP.

In FIG. 9, an exemplary embodiment of the present inventive concept is illustrated including the transistors TR disposed in a row in a first direction or a third direction. However, exemplary embodiments of the present inventive concept are not limited thereto. For example, the transistors TR may be disposed at any position in the peripheral circuit region PERI of the substrate 111.

Figure 10:
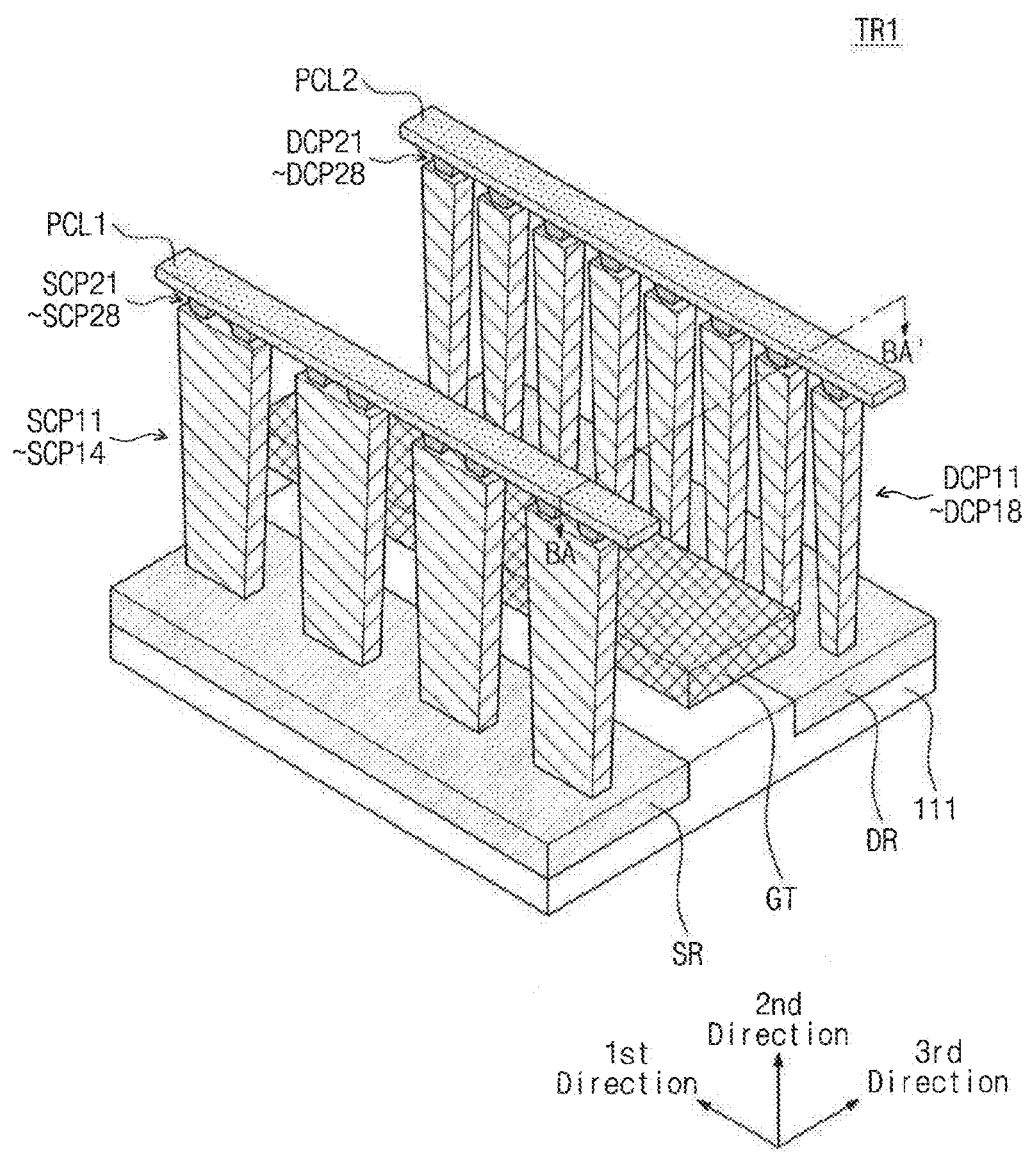
FIG. 10 is a perspective view of a transistor of a plurality of transistors shown in FIG. 9.
Figure 11:
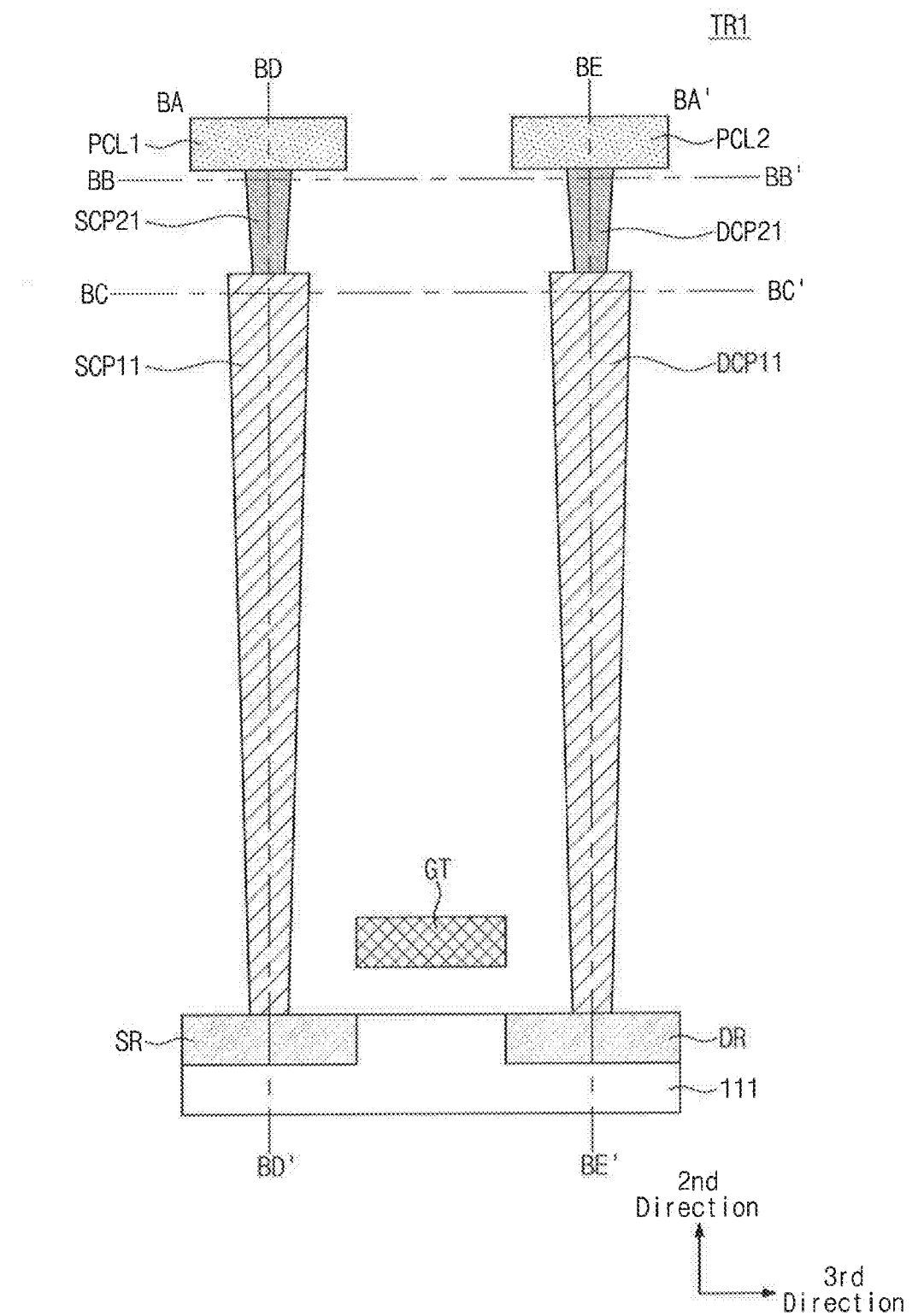
FIG. 11 is a cross-sectional view taken along line BA-BA' of FIG. 10.
Figure 12:
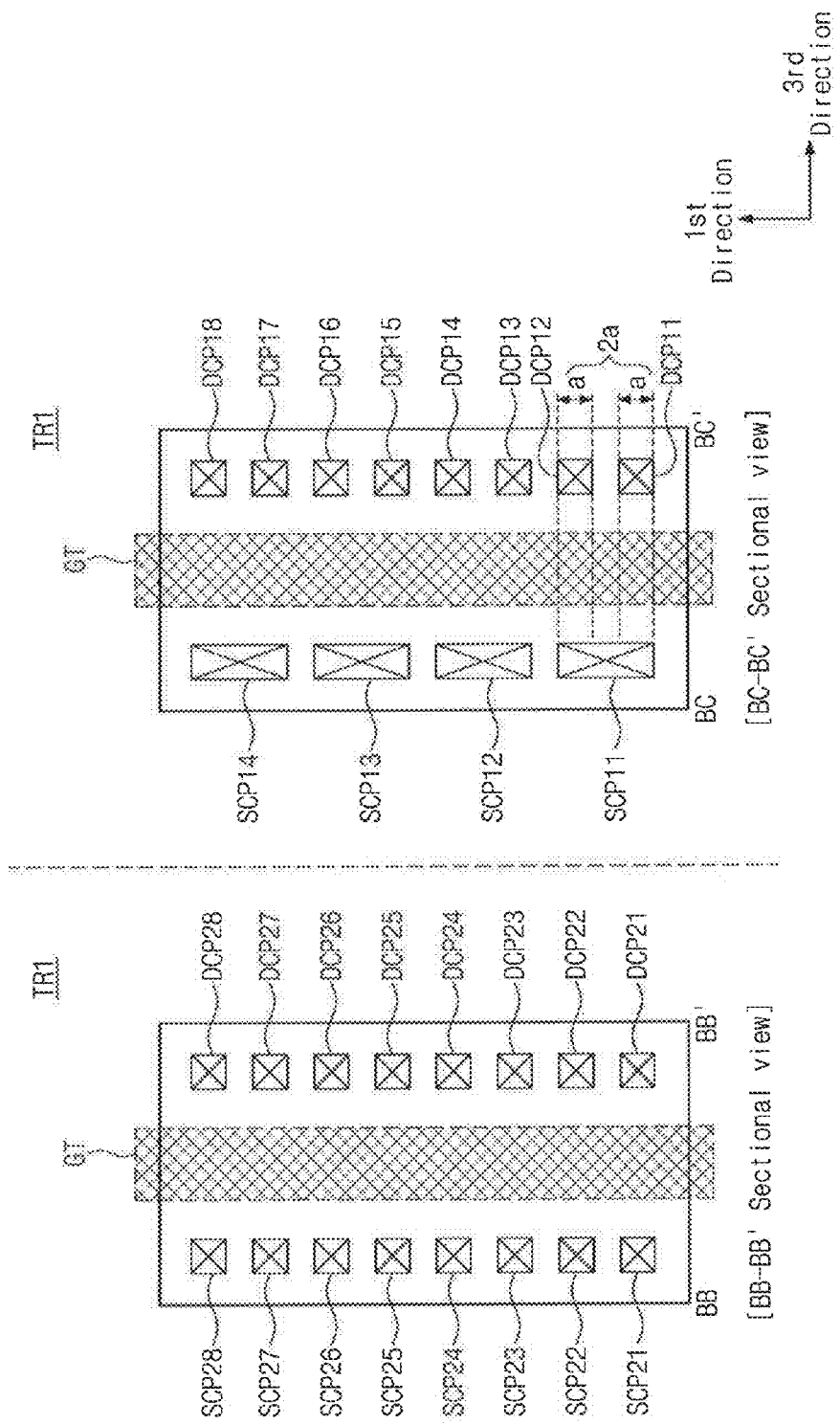
FIG. 12 illustrates cross sections taken along lines BB-BB' and BC-BC' of FIG. 11.
Figure 13:
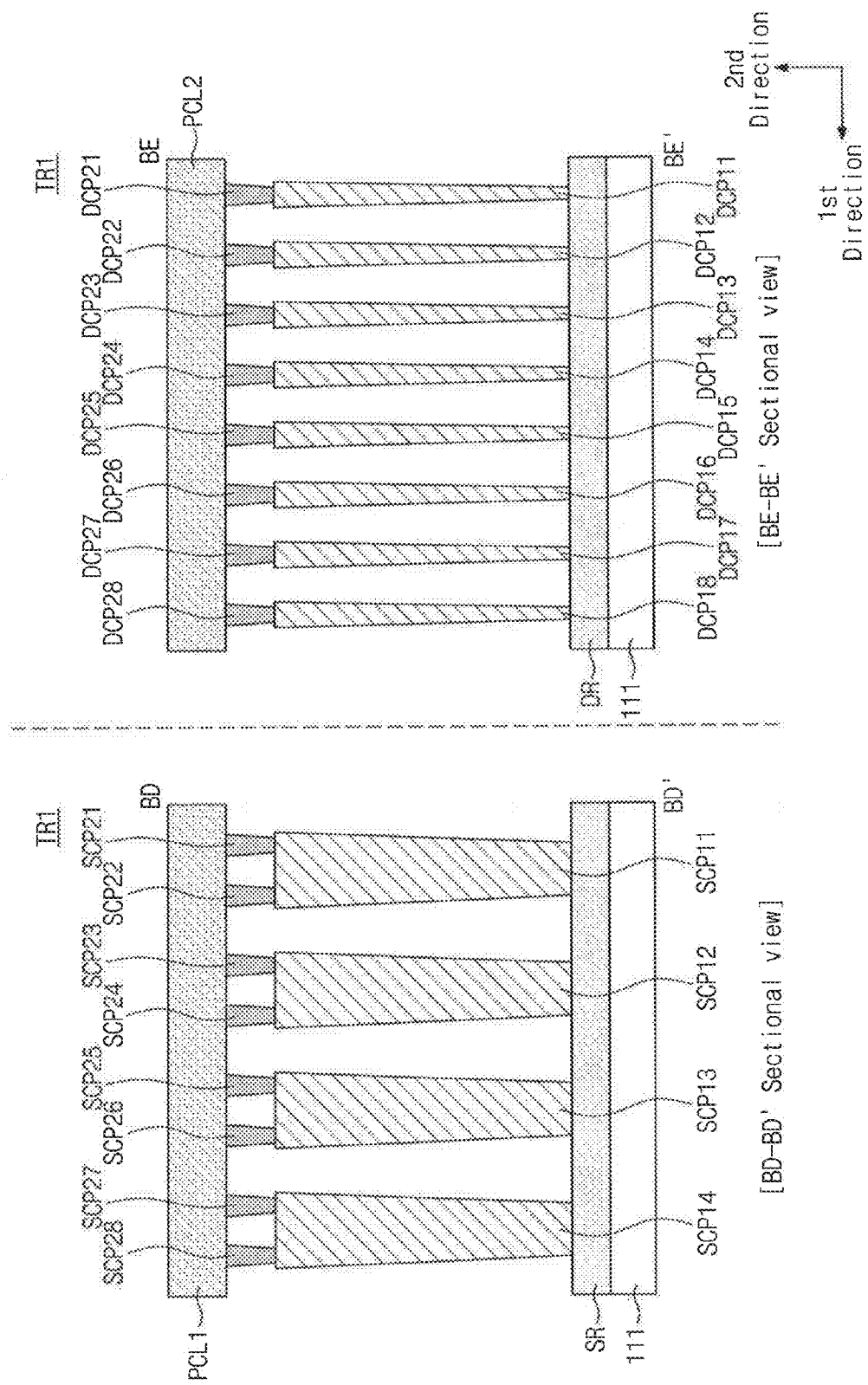
FIG. 13 illustrates cross sections taken along lines BD-BD' and BE-BE' of FIG. 11.

FIG. 10 is a perspective view of a first transistor of a plurality of transistors shown in FIG. 9. FIG. 11 is a cross-sectional view taken along line BA-BA' of FIG. 10. FIG. 12 illustrates cross sections taken along lines BB-BB' and BC-BC' of FIG. 1. FIG. 13 illustrates cross sections taken along lines BD-BD' and BE-BE' of FIG. 11.

Referring to FIGS. 9 through 13, a first transistor TR1 may be disposed on the substrate 111. The first transistor TR1 may have the source region SR and the drain region DR that may be disposed in the substrate 111. The source and drain regions SR and DR may be formed through doping using a conductive material different from the substrate 111.

The source and drain regions SR and DR may be disposed along a third direction and may extend along a first direction. The gate electrode GT that extends along the first direction may be disposed between the source and drain regions SR and DR.

The source region SR may be electrically connected to the first peripheral conductive line PCL1 by a plurality of source contact plugs SCP11 through SCP14 and SCP21 through SCP28. Respective ends of the source contact plugs SCP11 through SCP14 may be connected to the source region SR, and respective ends of the source contact plugs SCP21 through SCP28 may be connected to the first peripheral conductive line PCL1. According to exemplary embodiments of the present inventive concept, the source contact plugs SCP11 through SCP14 and SCP21 through SCP28 may extend along a second direction.

As described with reference to FIG. 8, the first peripheral conductive line PCL1 may be disposed in the metal layer ML. The source contact plugs SCP11 through SCP14 may be disposed in the first insulation layer 10, and the source contact plugs SCP21 through SCP28 may be disposed in the second insulation layer 20.

The drain region DR may be electrically connected to the second peripheral conductive line PCL2 through the plurality of drain contact plugs DCP11 through DCP18 and DCP21 through DCP28. Respective ends of the drain contact plugs DCP11 through DCP18 may be connected to the drain region DR, and respective ends of the drain contact plugs DCP21 through DCP28 may be connected to the second peripheral conductive line PCL2. According to exemplary embodiments of the present inventive concept, the drain contact plugs DCP11 through DCP18 and DCP21 through DCP28 may extend along the second direction.

As described with reference to FIG. 8, the second peripheral conductive line PCL2 may be disposed in the metal layer ML. The drain contact plugs DCP11 through DCP18 may be disposed in the first insulation layer 10, and the drain contact plugs DCP21 through DCP28 may be disposed in the second insulation layer 20.

The source contact plugs SCP11 through SCP14 and the drain contact plugs DCP11 through DCP18 disposed in the first insulation layer 10 may be referred to as "lower source contact plugs" and "lower drain contact plugs," respectively. The source contact plugs SCP21 through SCP28 and the drain contact plugs DCP21 through DCP28 disposed in the second insulation layer 20 may be referred to as "upper source contact plugs" and "upper drain contact plugs," respectively. The lower source contact plugs SCP11 through SCP14 may be referred to as first through fourth lower source contact plugs, and the upper source contact plugs SCP21 through SCP28 may be referred to as first through eighth upper source contact plugs. The lower drain contact plugs DCP11 through SCP18 may be referred to as first through eighth lower drain contact plugs, and the upper drain contact plugs DCP21 through DCP28 may be referred to as first through eighth upper drain contact plugs.

As illustrated in FIGS. 12 and 13, a contact area of each of the first through fourth lower source contact plugs SCP11 through SCP14 is different from that of each of the contact plugs SCP21 through SCP28, DCP11 through DCP18, and DCP21 through DCP28. According to exemplary embodiments of the present inventive concept, the contact area may include each contact plug that is in parallel with the substrate 111. The contact area may include an area of an upper surface of each contact plug that is in parallel with the substrate 111.

According to exemplary embodiments of the present inventive concept, a first-direction length of each of the first through eighth upper source contact plugs SCP21 through SCP28 may be shorter than that of each of the first through fourth lower source contact plugs SCP11 through SCP14.

According to exemplary embodiments of the present inventive concept, the number of first through fourth lower source contact plugs SCP11 through SPL14 may be different from the number of first through eighth upper source contact plugs SCP21 through SCP28, the number of first through eighth lower drain contact plugs DCP11 through DCP18, and the number of first through eighth upper drain contact plugs DCP21 through DCP28. According to exemplary embodiments of the present inventive concept, the number of lower source contact plugs may be less than that of upper source contact plugs.

Referring to FIG. 13, one side of the first lower source contact plug SCP11 may be connected to the source region SR, and the other end of the first lower source contact plug SCP11 may be connected to one side of each of the first and second upper source contact plugs SCP21 and SCP22. Referring to a cross section taken along line BD-BD' of FIG. 13, one lower source contact plug (e.g., SCP11) may be electrically connected to two upper source contact plugs (e.g., SCP21 and SCP22).

The first through eighth lower drain contact plugs DCP11 through DCP18 may be connected to the first through eighth upper drain contact plugs DCP21 through DCP28, respectively.

As described above, as the contact area of each of the lower source contact plugs SCP11 through SCP14 increases, the resistance of the source contact plug may decrease. Thus, propagation delay in a signal exchanged through contact plugs may be reduced.

Figure 14:
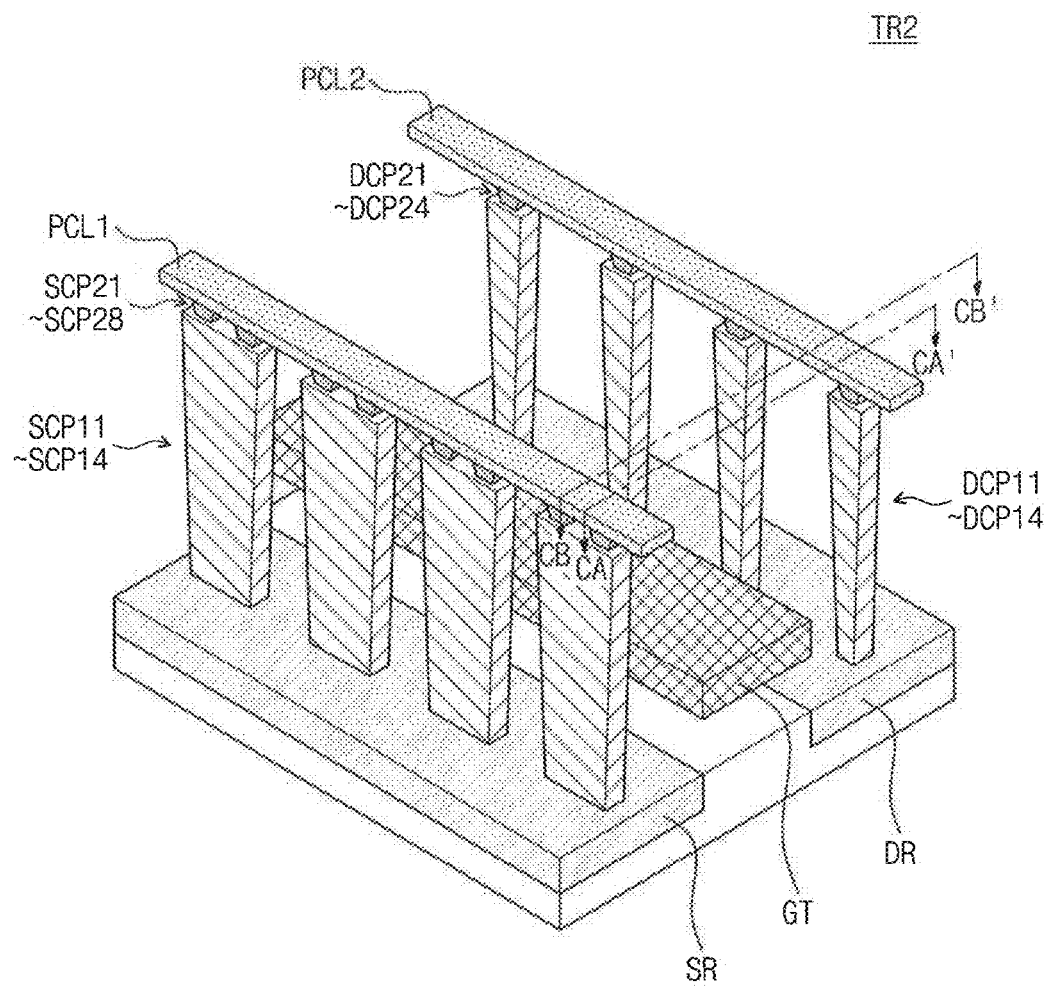
FIG. 14 is a perspective view of a transistor according to an exemplary embodiment of the present inventive concept.
Figure 15:
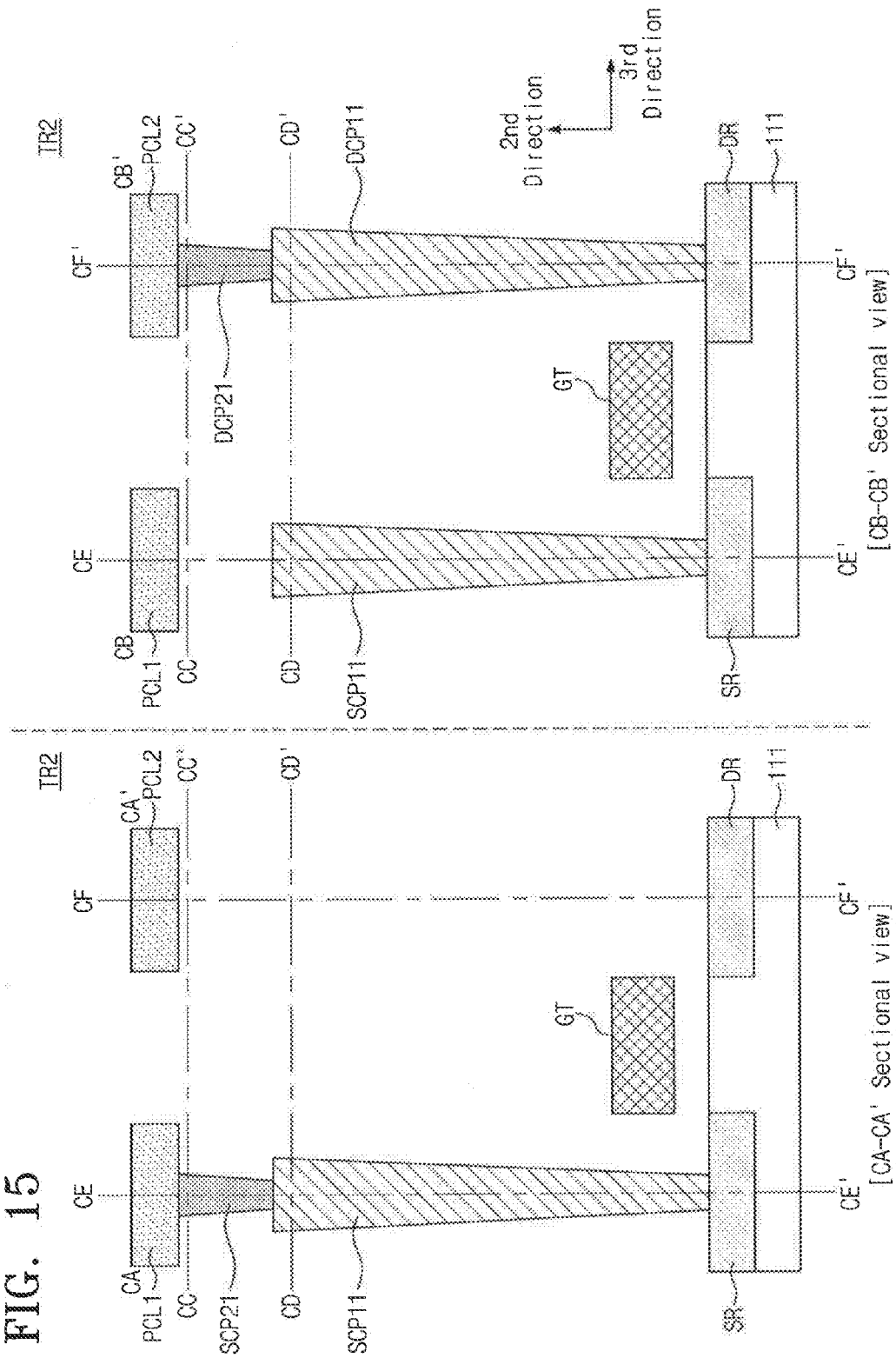
FIG. 15 illustrates cross sections taken along lines CA-CA' and CB-CB' of FIG. 14.
Figure 16:
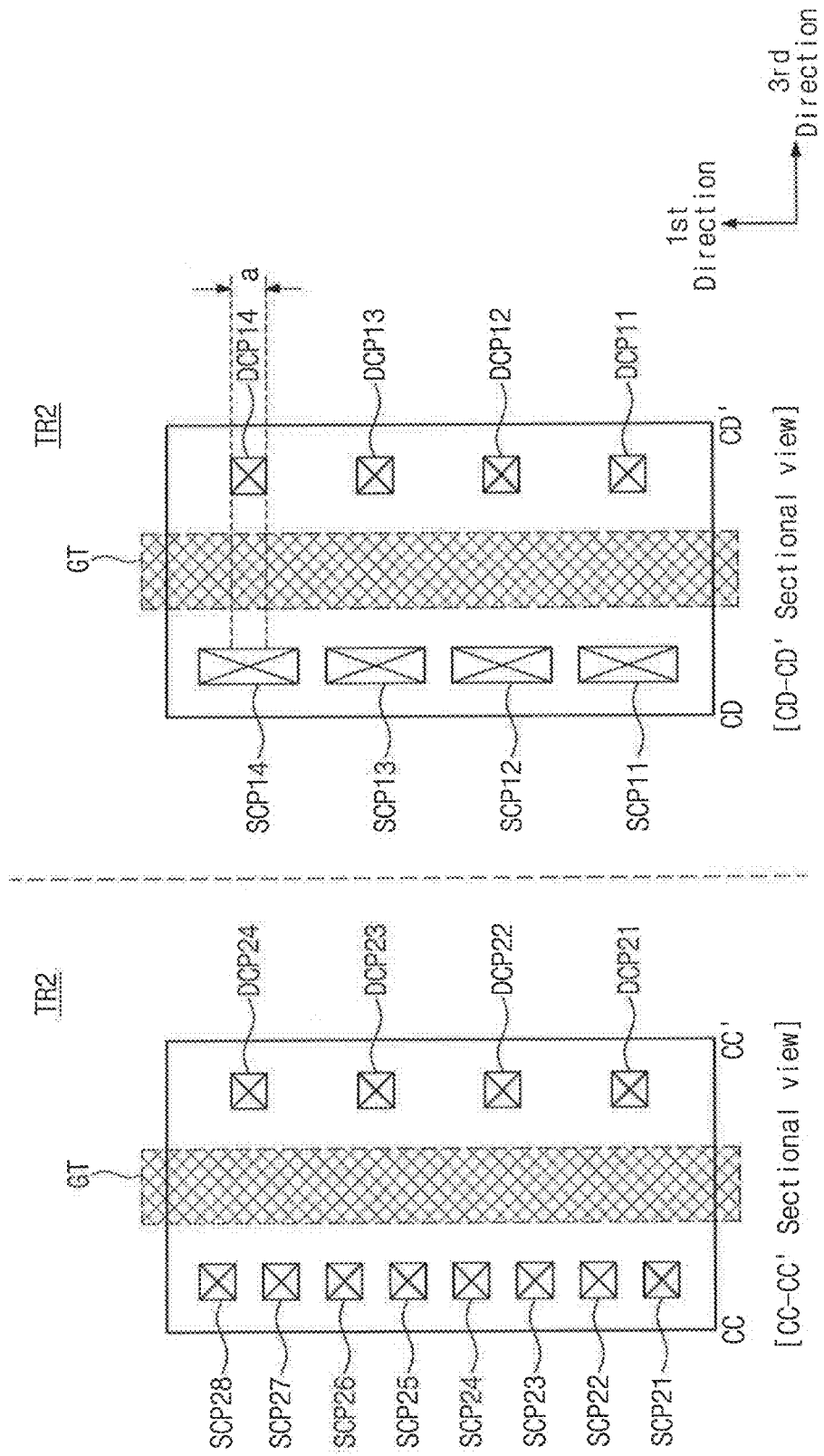
FIG. 16 illustrates cross sections taken along lines CC-CC' and CD-CD' of FIG. 15.
Figure 17:
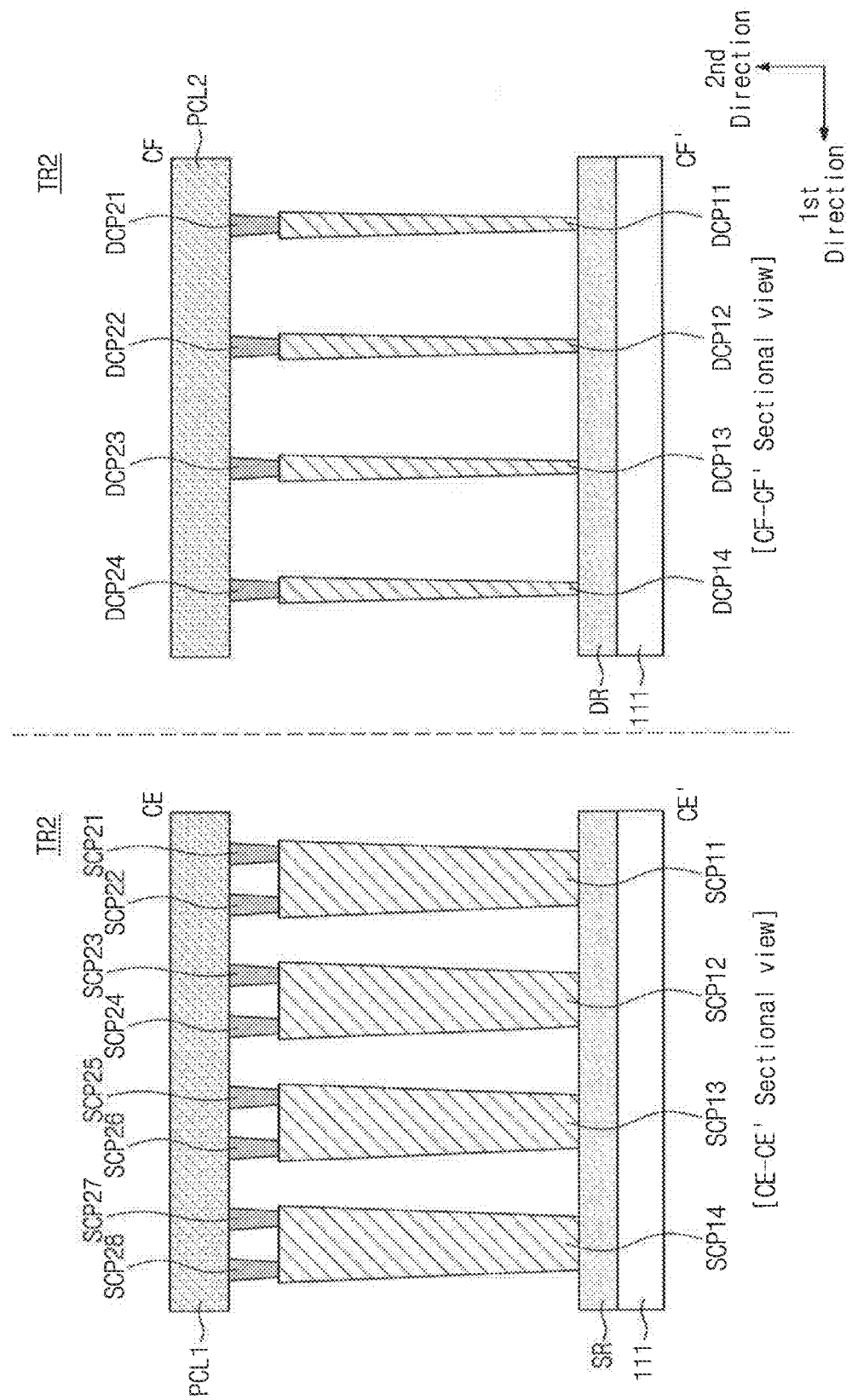
FIG. 17 illustrates cross sections taken along lines CE-CE' and CF-CF'.

FIG. 14 is a perspective view of a second transistor according to an exemplary embodiment of the present inventive concept. FIG. 15 illustrates cross sections taken along lines CA-CA' and CB-CB' of FIG. 14. FIG. 16 illustrates cross sections taken along lines CC-CC' and CD-CD' of FIG. 15. FIG. 17 illustrates cross sections taken along lines CE-CE' and CF-CF'.

Referring to FIGS. 14 through 17, a second transistor TR2 may be disposed on the substrate 111. The second transistor TR2 may include the source region SR, the drain region DR, and the gate electrode GT.

The source region SR of the second transistor TR2 may be connected to the first peripheral conductive line PCL1 through first through source lower source contact plugs SCP11 through SCP14 and first through eighth upper source contact plugs SCP21 through SCP28. The drain region DR of the second transistor TR2 may be connected to the second peripheral conductive line PCL2 through first through source lower drain contact plugs DCP11 through DCP14 and first through fourth upper drain contact plugs DCP21 through DCP24. The second transistor TR2 illustrated in FIGS. 14 through 17 may be connected to the second peripheral conductive line PCL2 through drain contact plugs. The number of drain contact plugs of the second transistor TR2 may be less than the number of drain contact plugs of the first transistor TR1 illustrated in FIGS. 10 through 13.

The contact area of each of the first through fourth lower source contact plugs SCP11 through SCP14 of the second transistor TR2 may be different from that of each of the contact plugs SCP21 through SCP28, DCP11 through DCPl4, and DCP21 through DCP24. In the second transistor TR2, the number of first through fourth lower source contact plugs SCP11 through SCP14, the number of firth through fourth lower drain contact plugs DCP11 through DCP14, and the number of first through fourth upper drain contact plugs DCP21 through DCP24 may be equal to each other. The number of first through fourth lower source contact plugs SCP11 through SCP14 may be different from that of first through eighth upper source contact plugs SCP21 through SCP28. The number of first through fourth lower source contact plugs SCP11 through SCP14 may be lower than that of first through eighth upper source contact plugs SCP21 through SCP28

As illustrated in FIGS. 15 and 16, the first through fourth upper drain contact plugs DCP21 through DCP24 and the first through fourth lower drain contact plugs DCP11 through DCP14 may respectively intersect the first through fourth upper source contact plugs SCP21 through SCP24.

Referring to a cross section taken along line CE-CE' of FIG. 17, one end of the lower source contact plug (e.g., SCP11) may be connected to one end of each of two upper source contact plugs (e.g., SCP21 and SCP22).

Referring to a cross section taken along line CD-CD' of FIG. 16, one lower source contact plug may correspond to one lower drain contact plug. In this case, opposite areas may be illustrated in area "a" illustrated in FIG. 16. In contrast, referring to a cross section taken along a line BC-BC' of a first transistor TR1 of FIG. 12, one lower source contact plug (e.g., SCP11) may correspond to two lower drain contact plugs (e.g., DCP11 and DCP12). In this case, opposite areas may be illustrated in area "2a".

In the second transistor TR2, opposite areas between lower source contact plugs and lower drain contact plugs may be half as many as the number of the opposite areas between lower source contact plugs and lower drain contact plugs of the first transistor TR1 shown in FIGS. 10 through 13. Since opposite areas between contact plugs in the second transistor TR2 are reduced, parasitic capacitance between source contact plugs and drain contact plugs may be reduced. Thus, propagation delay, due to parasitic capacitance, in signals transmitted and received through contact plugs may be reduced.

According to exemplary embodiments of the present inventive concept, a distance between drain contact plugs DCP of the second transistor TR2 may be longer than a distance between drain contact plugs DCP of the first transistor TR1.

Performance of a nonvolatile memory device may be increased by making the number of source contact plugs and the number of drain contact plugs different and by making contact areas of the source and drain contact plugs different (e.g., asymmetrically).

Figure 18:
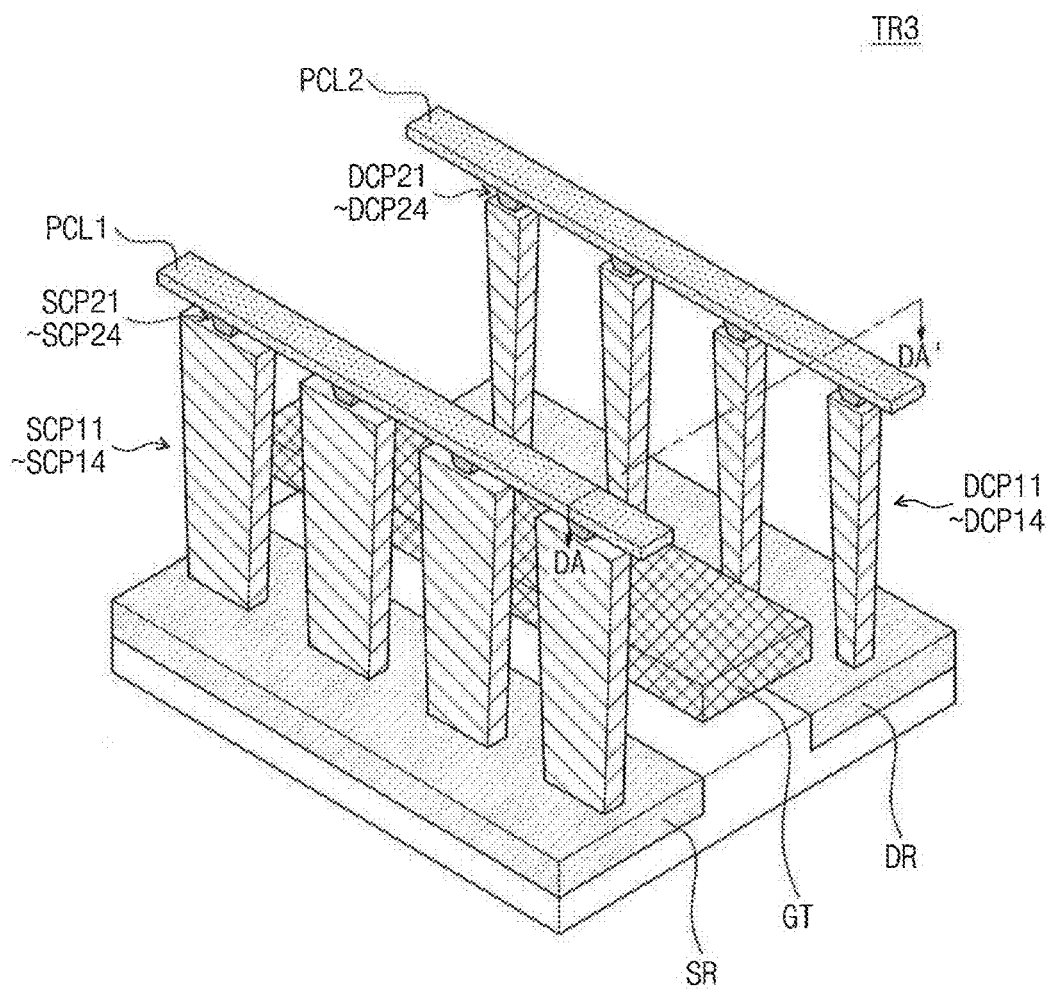
FIG. 18 is a perspective view of a transistor according to an exemplary embodiment of the present inventive concept.
Figure 19:
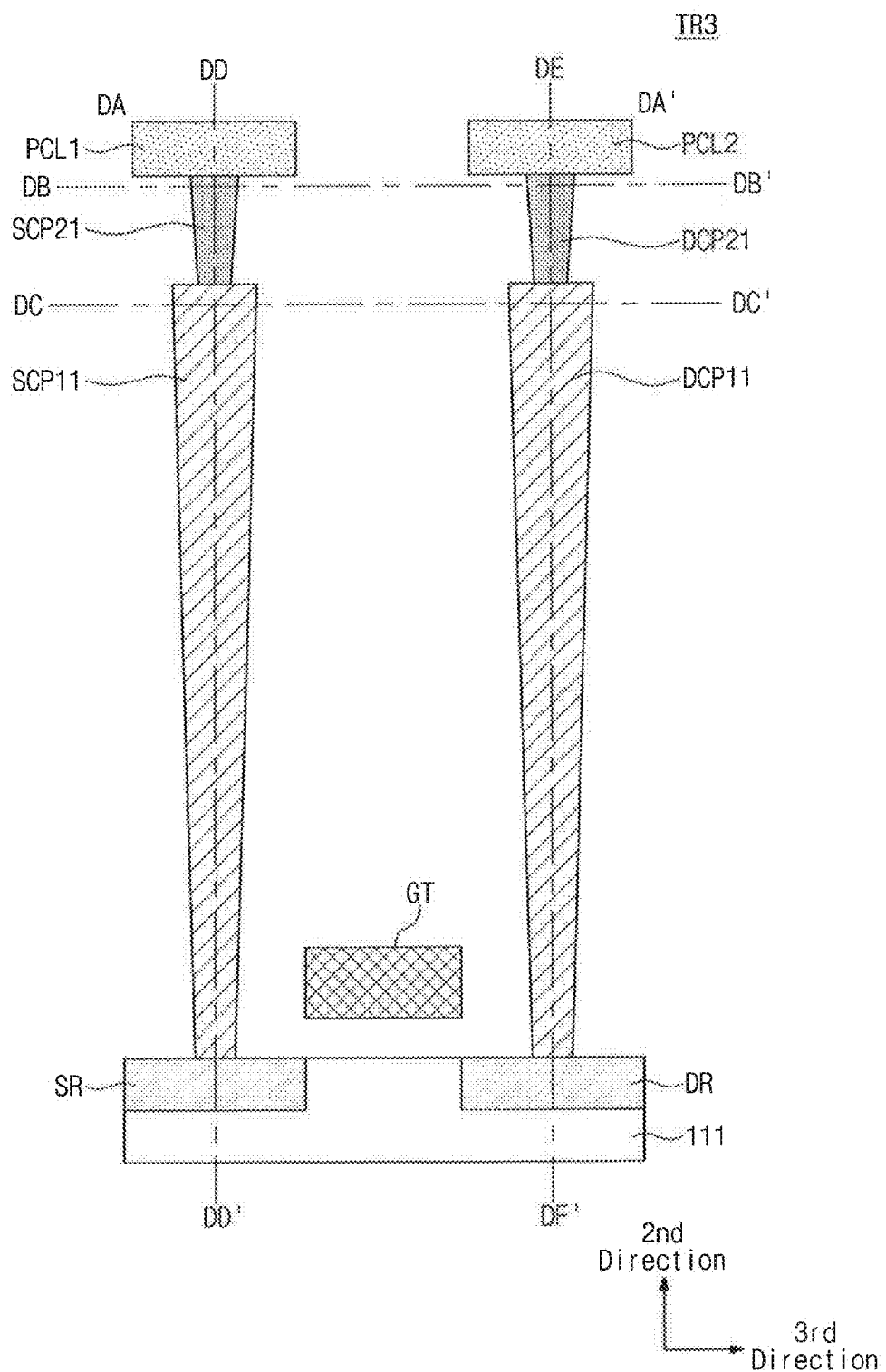
FIG. 19 is a cross-sectional view taken along line DA-DA' of FIG. 18.
Figure 20:
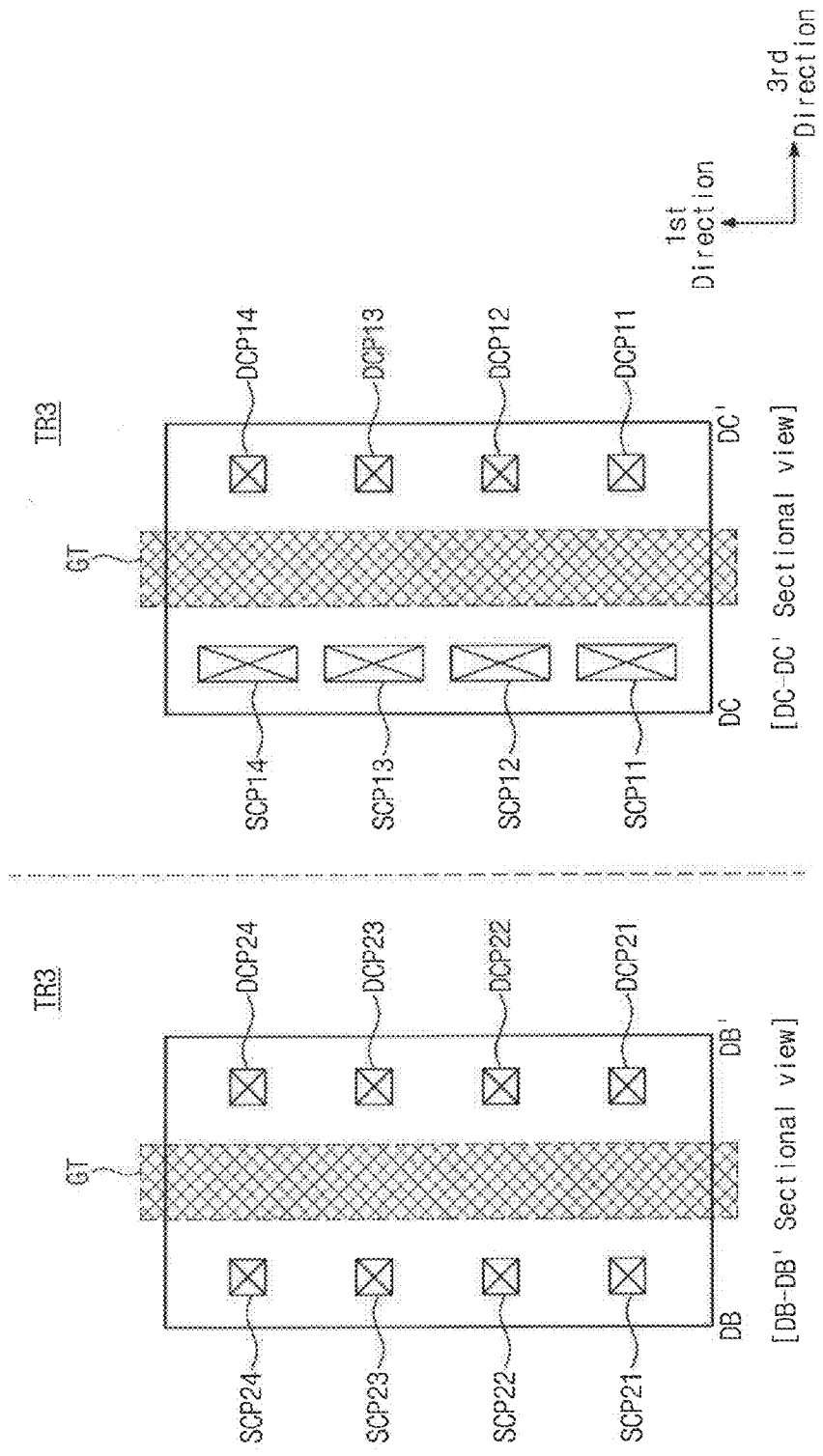
FIG. 20 illustrates cross sections taken along lines DB-DB' and DC-DC' of FIG. 19.
Figure 21:
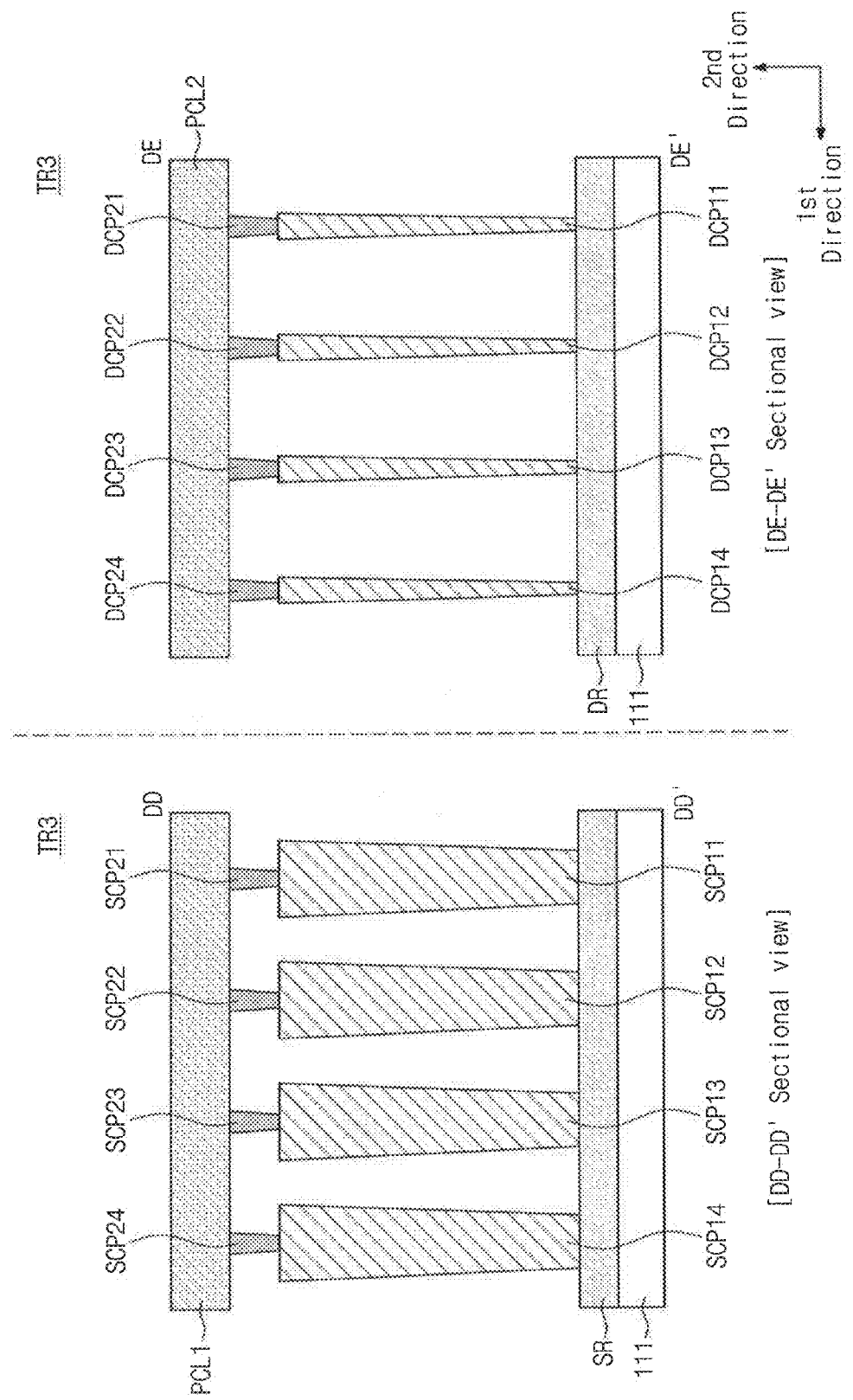
FIG. 21 illustrates cross sections taken along lines DD-DD' and DE-DE' of FIG. 19.

FIG. 18 is a perspective view of a transistor according to an exemplary embodiment of the present inventive concept. FIG. 19 is a cross-sectional view taken along line DA-DA' of FIG. 18. FIG. 20 illustrates cross sections taken along lines DB-DB' and DC-DC' of FIG. 19. FIG. 21 illustrates cross sections taken along lines DD-DD' and DE-DE' of FIG. 19.

Referring to FIGS. 18 through 21, a third transistor TR3 may be disposed on the substrate 111. The third transistor TR3 may include the source region SR, the drain region DR, and the gate electrode GT.

The source region SR of the third transistor TR3 may be connected to the first peripheral conductive line PCL1 by lower source contact plugs SCP11 through SCP14 and upper source contact plugs SCP21 through SCP24. The drain region DR of the third transistor TR3 may be connected to the second peripheral conductive line PCL2 by lower drain contact plugs DCP11 through DCP14 and upper drain contact plugs DCP21 through DCP24.

According to exemplary embodiments of the present inventive concept, the contact area of each of the lower source contact plugs SCP11 through SCP14 may be different from that of each of contact plugs SCP21 through SCP24, DCP11 through DCP14, and DCP21 through DCP24. The number of lower source contact plugs SCP11 through SCP14, the number of lower drain contact plugs DCP11 through DCP14, and the number of upper drain contact plugs DCP21 through DCP24 may be equal to each other.

Referring to FIGS. 20 and 21, the first upper source contact plug SCP21 may be connected to the first lower source contact plug SCP1. The contact area of the first lower source contact plug SCP11 may be wider than that of the first upper source contact plug SCP21. Thus, resistance due to the source contact plug may be reduced.

According to exemplary embodiments of the present inventive concept, a distance between source contact plugs SCP of the third transistor TR3 may be greater than that between source contact plugs SCP of a first transistor TR1.

As described above, resistance in source contact plugs may be reduced by forming upper and lower source contact plugs asymmetrically. Capacitance may be reduced by forming lower source contact plugs and lower drain contract plugs asymmetrically. Process overhead (e.g., forming a mask additionally) may be reduced by forming upper source contact plugs, upper drain contact plugs, and lower drain contact plugs to have substantially the same shape. Thus, the performance of the nonvolatile memory device may be increased.

Transistors TR1 through TR3 described with reference to FIGS. 9 through 21 have been described as examples; however, exemplary embodiments of the present inventive concept are not limited thereto. For example, the number of upper source contact plugs, the number of lower source contact plugs, the number of upper drain contact plugs, and the number of lower drain contact plugs may be different from each other. Respective ends of the upper source contact plugs may be connected to one end of a lower source contact plug.

Contact plugs described with reference to FIGS. 9 through 21 have been described as examples; however, the number of source and drain contact plugs may be increased or decreased. For example, the number of lower drain contact plugs may be smaller than the number of lower source contact plugs.

Transistors that are included in the peripheral circuit 120 illustrated in FIG. 9 may be implemented with one of first through third transistors TR1 through TR3 described with reference to FIGS. 10 through 21.

Figure 22:
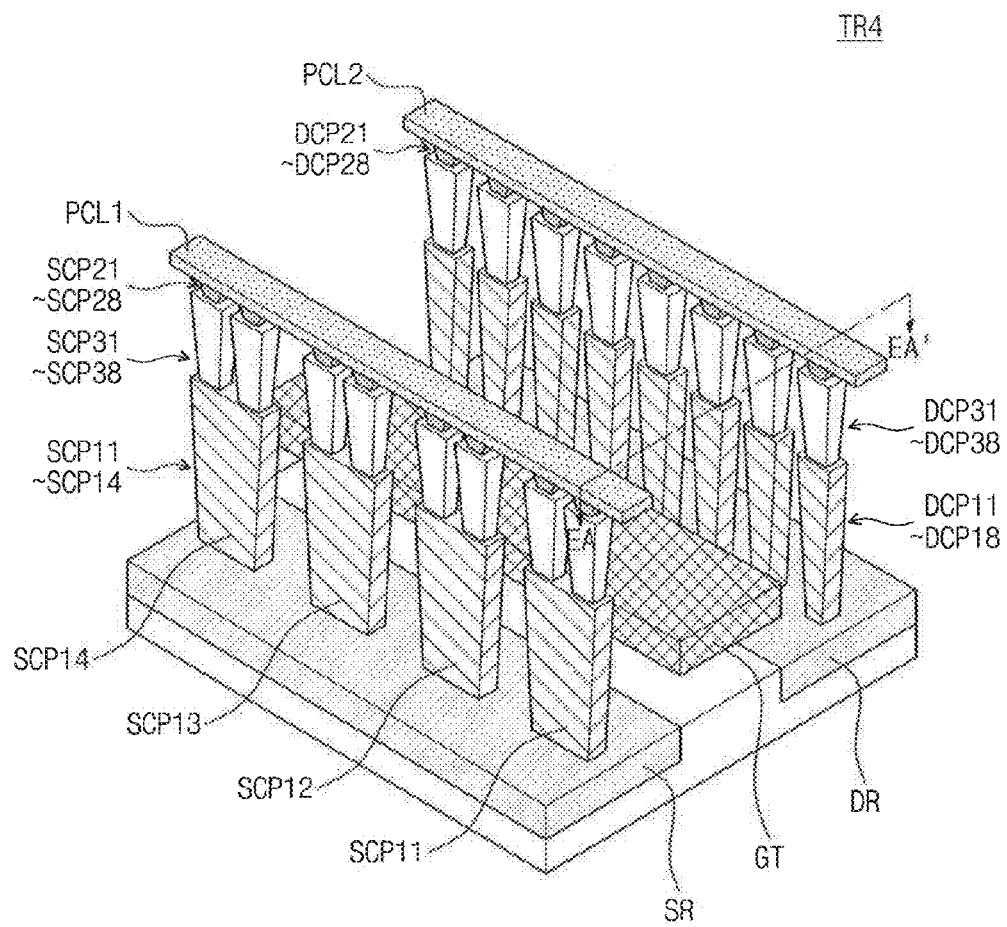
FIG. 22 is a perspective view of a transistor according to an exemplary embodiment of the present inventive concept.
Figure 23:
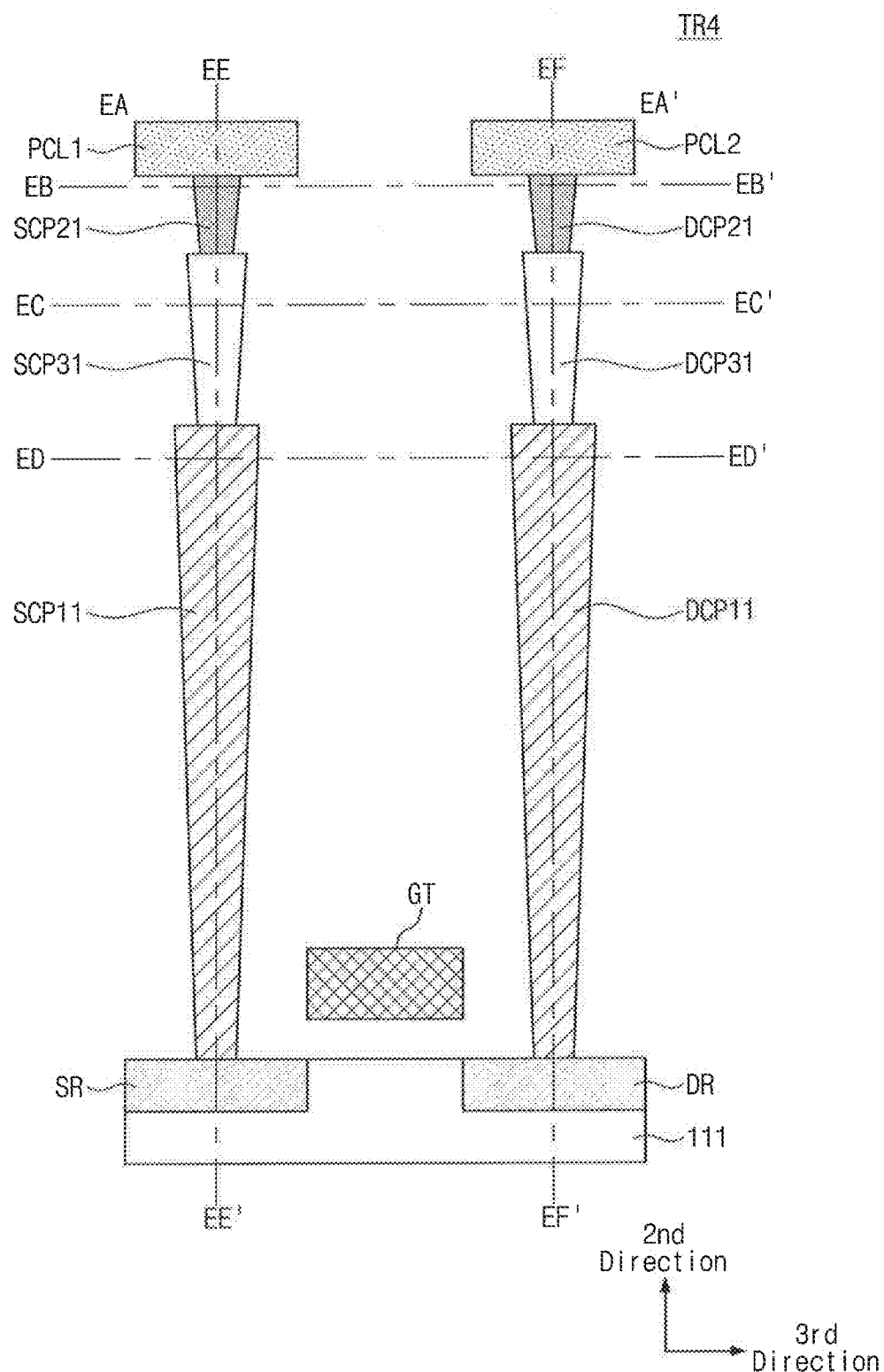
FIG. 23 is a cross-sectional view taken along line EA-EA' of FIG. 22.
Figure 24:
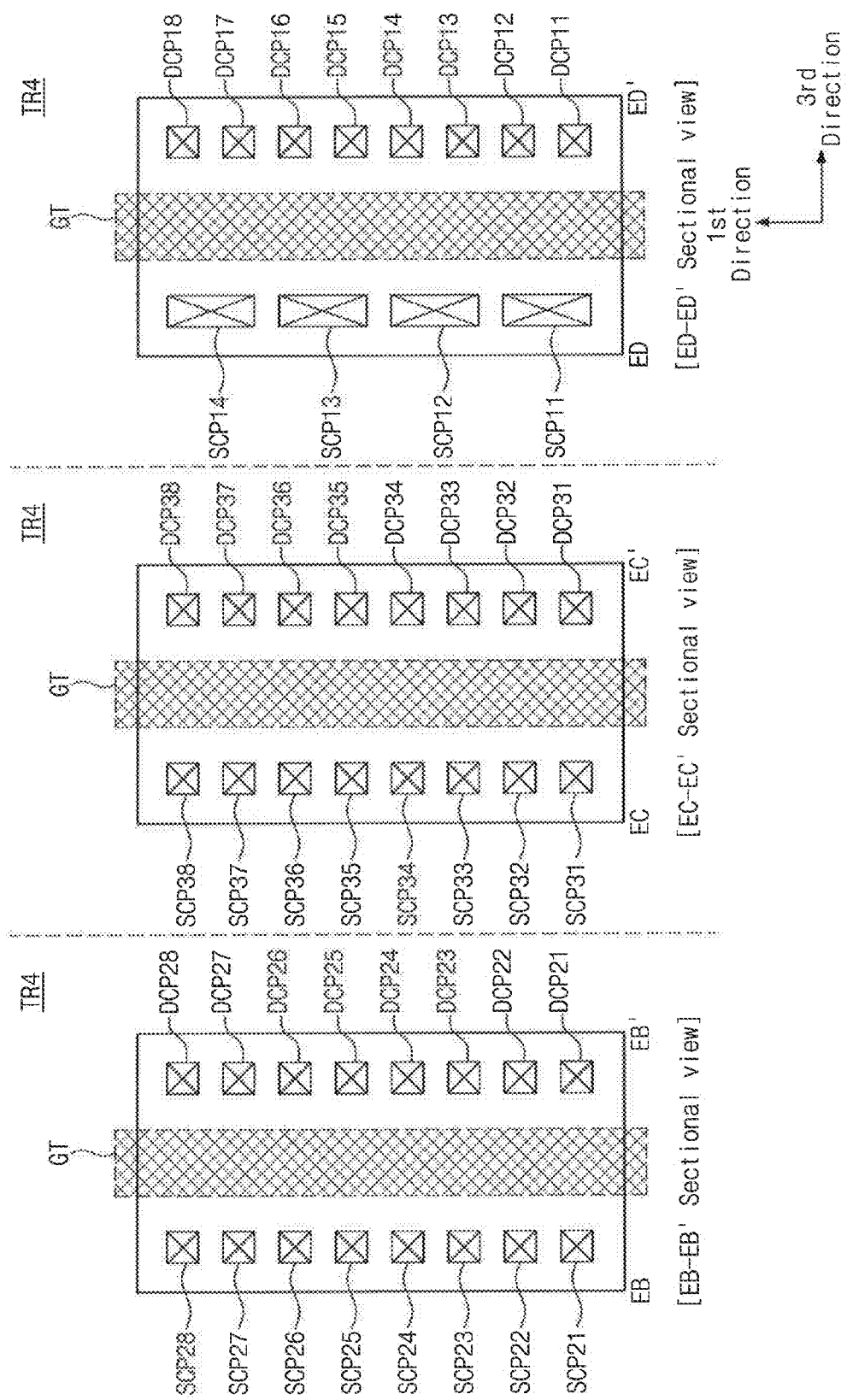
FIG. 24 illustrates cross sections taken along lines EB-EB', EC-EC', and ED-ED' of FIG. 23.
Figure 25:
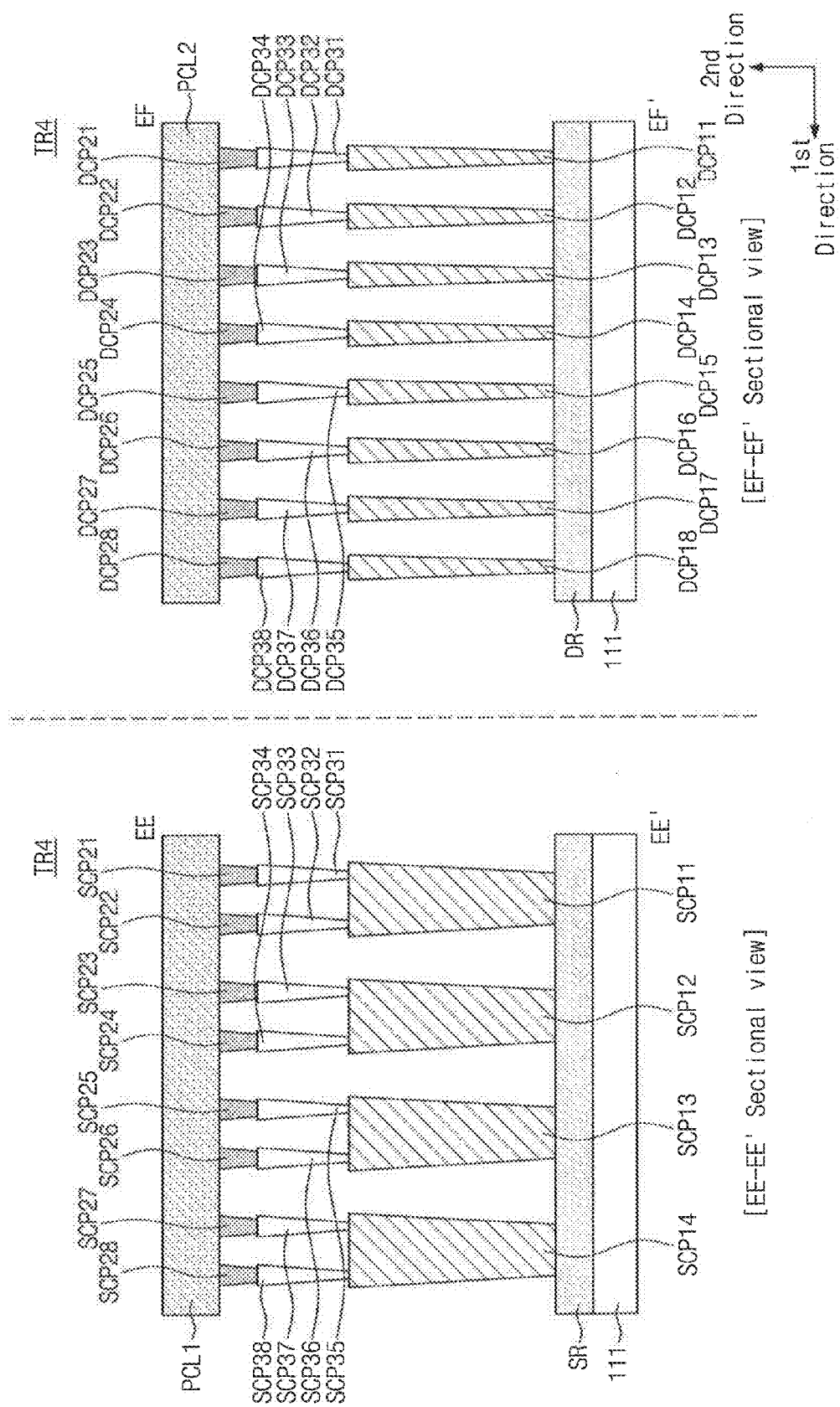
FIG. 25 illustrates cross sections taken along lines EE-EE' and EF-EF'.

FIG. 22 is a perspective view of a transistor according to an exemplary embodiment of the present inventive concept. FIG. 23 is a cross-sectional view taken along line EA-EA' of FIG. 22. FIG. 24 illustrates cross sections taken along lines EB-EB', EC-EC', and ED-ED' of FIG. 23. FIG. 25 illustrates cross sections taken along lines EE-EE' and EF-EF'.

Referring to FIGS. 22 through 25, a fourth transistor TR4 may be disposed on the substrate 111. The fourth transistor TR4 may include the source region SR, the drain region DR, and the gate electrode GT.

The source region SR of the fourth transistor TR4 may be connected to the first peripheral conductive line PCL1 by source contact plugs SCP11 through SCP14, SCP21 through SCP28, and SCP31 through SCP38. The drain region DR of the fourth transistor TR4 may be connected to the second peripheral conductive line PCL2 by drain contact plugs DCPL11 through DCP18, DCP21 through DCP28, and DCP31 through SCP38.

According to exemplary embodiments of the present inventive concept, the source contact plugs SCP11 through SCP14, SCP21 through SCP28, and SCP31 through SCP38 and the drain contact plugs DCP11 through DCP18, DCP21 through DCP28, and DCP31 through SCP38 may have a multi-layer stack structure different from the source plugs described with reference to FIGS. 10 through 21. For example, as illustrated in FIG. 23, one end of the source contact plug SCP11 may be connected to the source region, and the other end of the source contact plug SCP11 may be connected to one end of a source contact plug SCP31. The other end of the source contact plug SCP31 may be connected to one end of the source contact plug SCP21. The other end of the source contact plug SCP21 may be connected to one end of the first peripheral conductive line PCL1. The source contact plugs SCP11, SCP31, and SCP21 may be stacked along a second direction.

One end of the drain contact plug DCP11 may be connected to the drain region, and the other end of the drain contact plug DCP11 may be connected to one end of a drain contact plug DCP31. The other end of the drain contact plug DCP31 may be connected to one end of the drain contact plug DCP21. The other end of the drain contact plug DCP21 may be connected to one end of the first peripheral conductive line PCL1. The drain contact plugs DCP11, DCP31, and DCP21 may be stacked along the second direction.

Although not shown in figures, source contact plugs SCP31 through SCP38 and drain contact plugs DCP31 through DCP38 may be disposed in the first insulation layer or in any other insulation layer between the first insulation layer 10 and a second insulation layer 20.

Source contact plugs SCP11 through SCP14 and drain contact plugs DCP11 through DCP18 may be referred to as "lower source contact plugs" and "lower drain contact plugs". Source contact plugs SCP21 through SCP28 and drain contact plugs DCP21 through DCP28 may be referred to as "upper source contact plugs" and "upper drain contact plugs". Source contact plugs SCP31 through SCP38 and drain contact plugs DCP31 through DCP38 may be referred to as "intermediate source contact plugs" and "intermediate drain contact plugs".

As illustrated in FIG. 24, the contact area of each of the lower source contact plugs SCP11 through SCP14 may be different from that of each of other contact plugs. For example, the contact area of each of the lower source contact plugs SCP11 through SCP14 may be wider than that of each of other contact plugs.

Referring to a cross section taken along line EE-EE' of FIG. 25, one end of the lower source contact plug (e.g., SCP11) may be connected to one end of each of two intermediate source contact plugs (e.g., SCP31 and SCP32). The other end of each of the two intermediate source contact plugs (e.g., SCP31 and SCP32) may be connected to one end of each of two upper source contact plugs (e.g., SCP21 and SCP22), respectively.

Resistance due to the source contact plug may be reduced by making a contact area of each of lower source contact plugs SCP11 through SCP14 relatively wide. Thus, a propagation delay in signals transmitted and received through contact plugs may be reduced.

Figure 26:
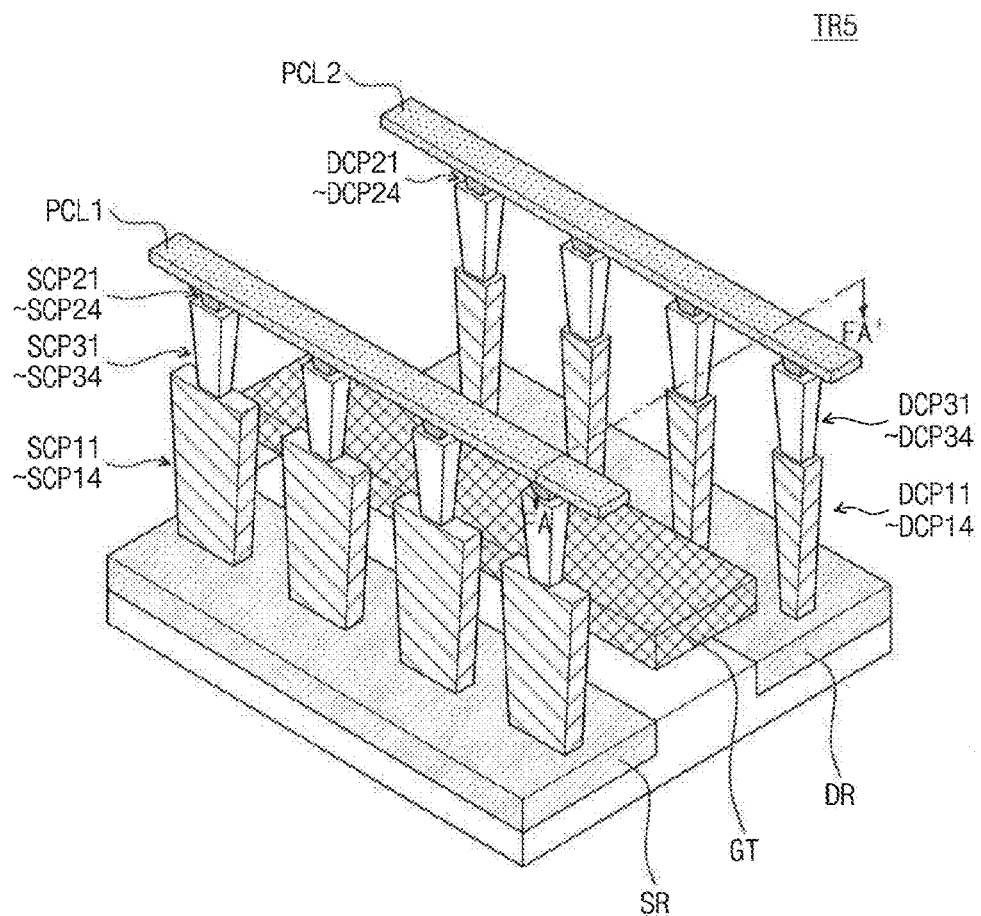
FIG. 26 is a perspective view of a transistor according to an exemplary embodiment of the present inventive concept.
Figure 27:
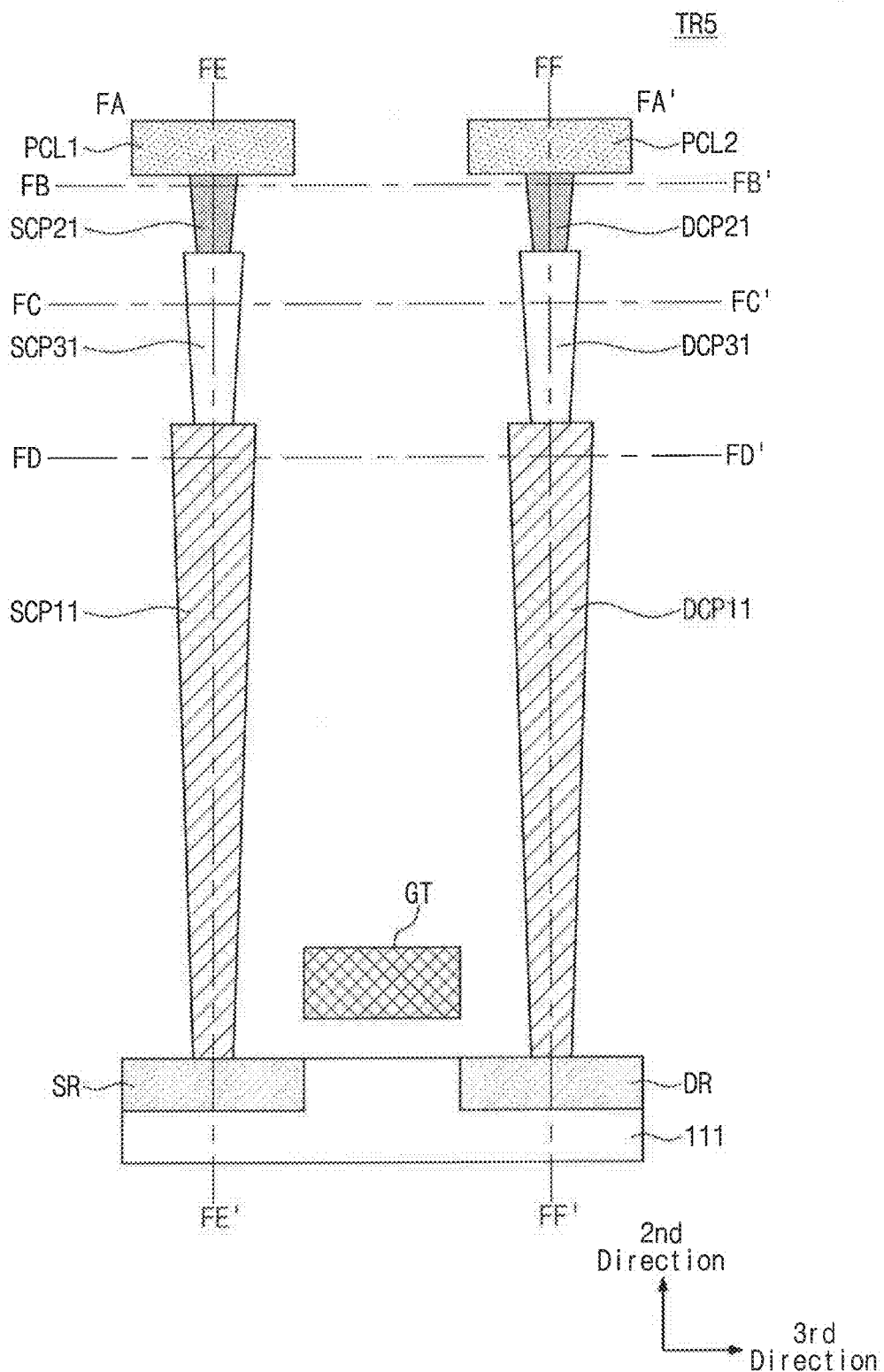
FIG. 27 is a cross-sectional view taken along line FA-FA' of FIG. 26.
Figure 28:
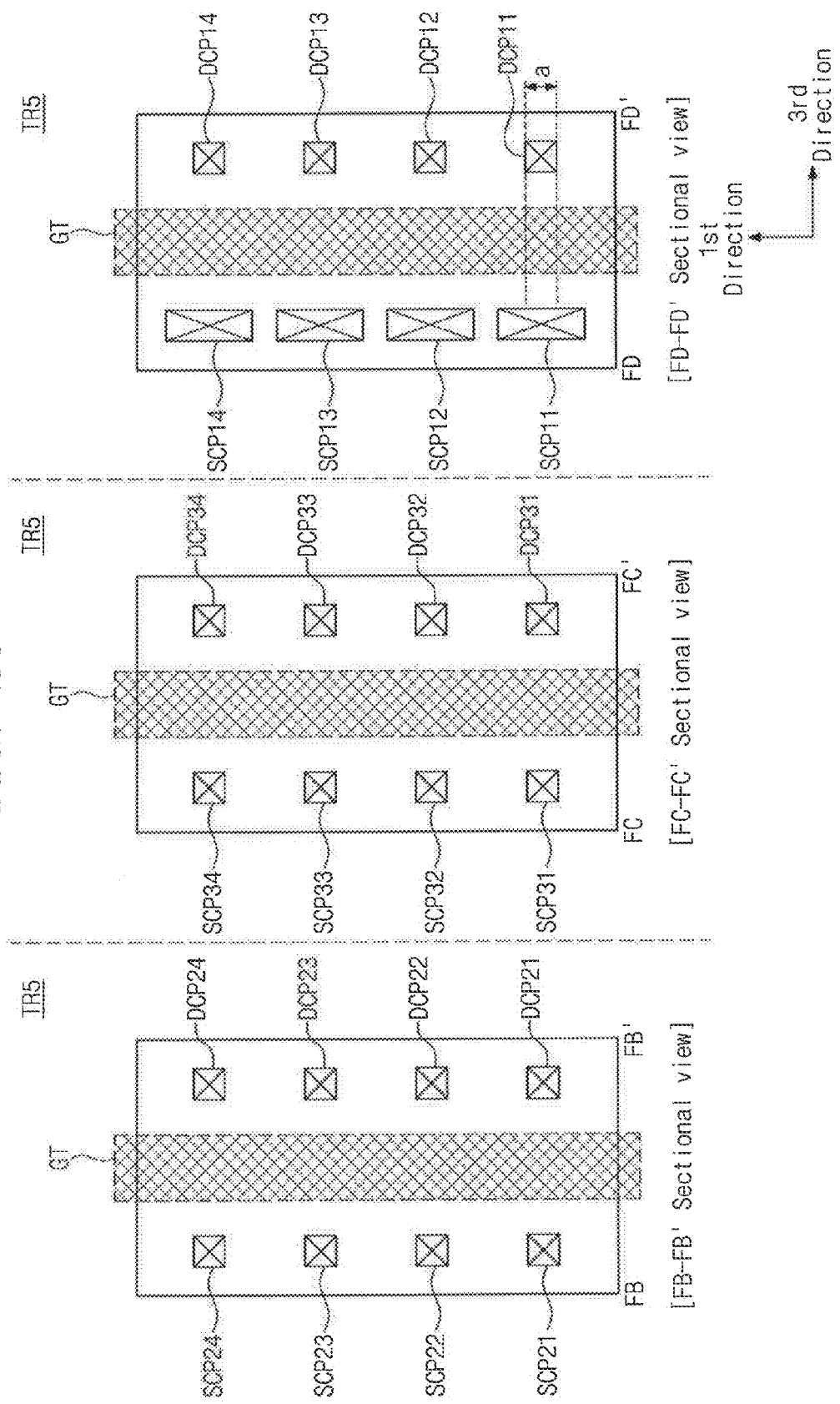
FIG. 28 illustrates cross sections taken along lines FB-FB', FC-FC', and FD-FD' of FIG. 27.
Figure 29:
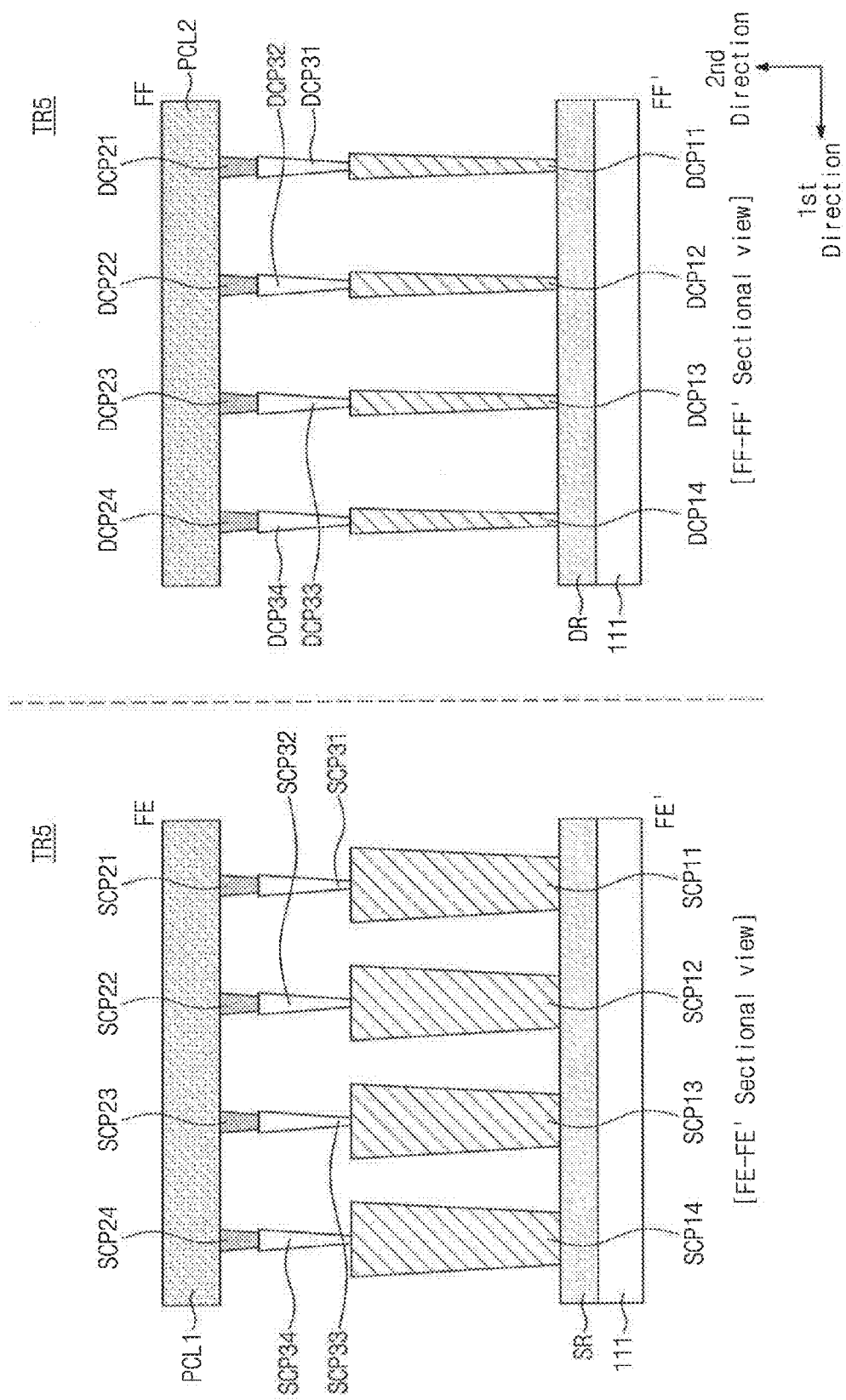
FIG. 29 illustrates cross sections taken along lines FE-FE' and FF-FF'.

FIG. 26 is a perspective view of a fifth transistor according to an exemplary embodiment of the present inventive concept. FIG. 27 is a cross-sectional view taken along a line FA-FA' of FIG. 26. FIG. 28 illustrates cross sections taken along lines FB-FB', FC-FC', and FD-FD' of FIG. 27. FIG. 29 illustrates cross sections taken along lines FE-FE' and FF-FF'.

Referring to FIGS. 26 through 29, a fifth transistor TR5 may be disposed on the substrate 111. The fifth transistor TR5 may include the source region SR, the drain region DR, and the gate electrode GT.

The source region SR of the fifth transistor TR5 may be connected to the first peripheral conductive line PCL1 by first through fourth lower source contact plugs SCP1 through SCP14, first through fourth intermediate source contact plugs SCP31 through SCP34, and first through fourth upper source contact plugs SCP21 through SCP24.

The drain region DR of the fifth transistor TR5 may be connected to the first peripheral conductive line PCL1 by first through fourth lower drain contact plugs DCP11 through DCP14, first through fourth intermediate drain contact plugs DCP31 through DCP34, and first through fourth upper drain contact plugs DCP21 through DCP24.

In FIGS. 26 through 29, the number of source contact plugs SCP may be equal to the number of drain contact plugs DCP. For example, the number of first through fourth lower source contact plugs SCP11 through SCP14, the number of first through fourth intermediate source contact plugs SCP31 through SCP34, the number of first through fourth upper source contact plugs SCP31 through SCP34, the number of first through fourth lower drain contact plugs DCP1 through DCP14, the number of first through fourth intermediate drain contact plugs DCP31 through DCP34, and the number of first through fourth upper drain contact plugs DCP31 through DCP34 may be equal to each other.

Referring to a cross section taken along FE-FE' of FIG. 29, one end of a lower source contact plug (e.g., SCP11) may be connected to one end of the intermediate source plug (e.g., SCP31) and the other end of the intermediate source plug (e.g., SCP31) may e connected to one end of the upper source contact plug (e.g., SCP21). In this case, the contact area of each of the lower source contact plugs SCP11 through SCP14 may be wider than that of each of the upper and intermediate source contact plugs SCP21 through SCP24 and SCP31 through SCP34. In other words, source contact plugs may be disposed asymmetrically.

As compared with a fourth transistor TR4 described with reference to FIGS. 22 through 25, the distance between contact plugs CP of the fifth transistor TR5 may be greater. Referring to a cross section taken along line FD-FD' of FIG. 28, an area of a drain contact plug (e.g., DCP11) opposite to the lower source contact plug (e.g., SCP11) may be illustrated in area "a" illustrated in FIG. 28.

Referring to a cross section taken along line ED-ED' of FIG. 24, the opposite area between lower drain contact plugs (e.g., DCP11 and DCP12) that is opposite to the lower source contact plug (e.g., SCP11) connected with a fourth transistor TR4 may be illustrated in an area "2a" illustrated in FIG. 24.

Parasitic capacitance between source contact plugs and drain contact plugs may be reduced by reducing the number of lower drain contact plugs connected with the fifth transistor TR5. Thus, a propagation delay in signals transmitted and received through contact plugs may be reduced.

Figure 31:
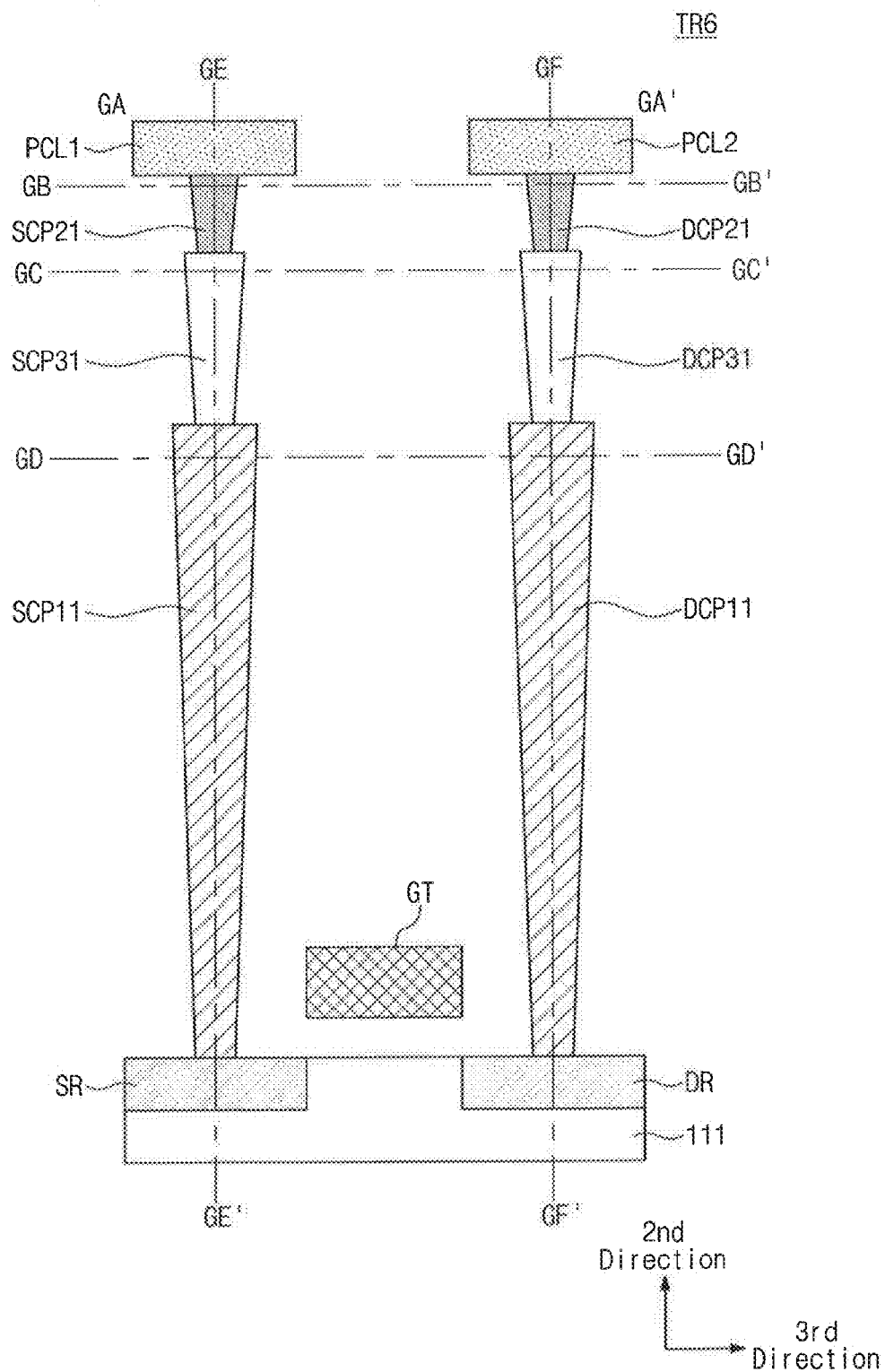
FIG. 31 is a cross-sectional view taken along line GA-GA' of FIG. 30.
Figure 32:
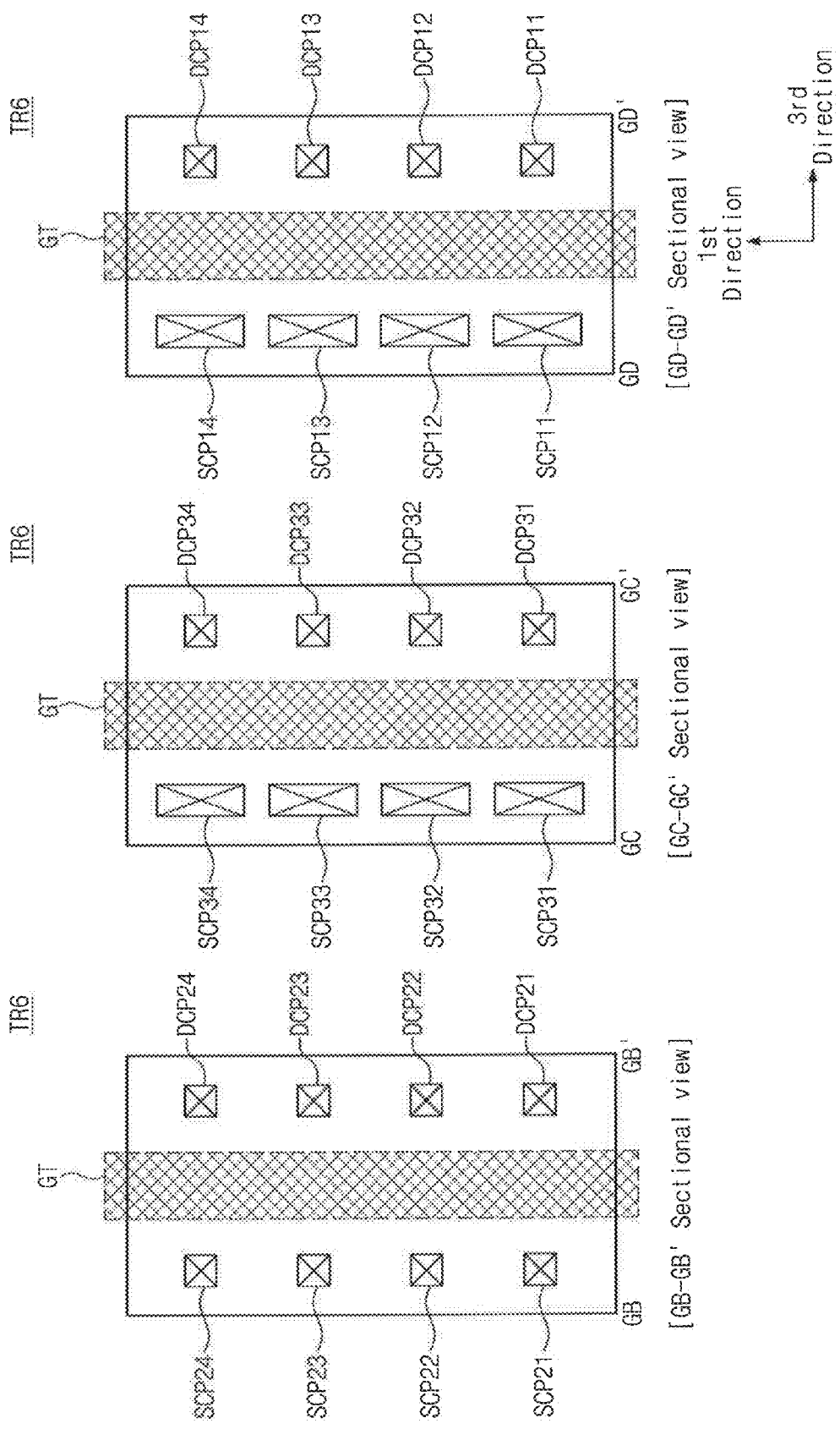
FIG. 32 illustrates cross sections taken along lines GB-GB', GC-GC', and GD-GD' of FIG. 31.
Figure 33:
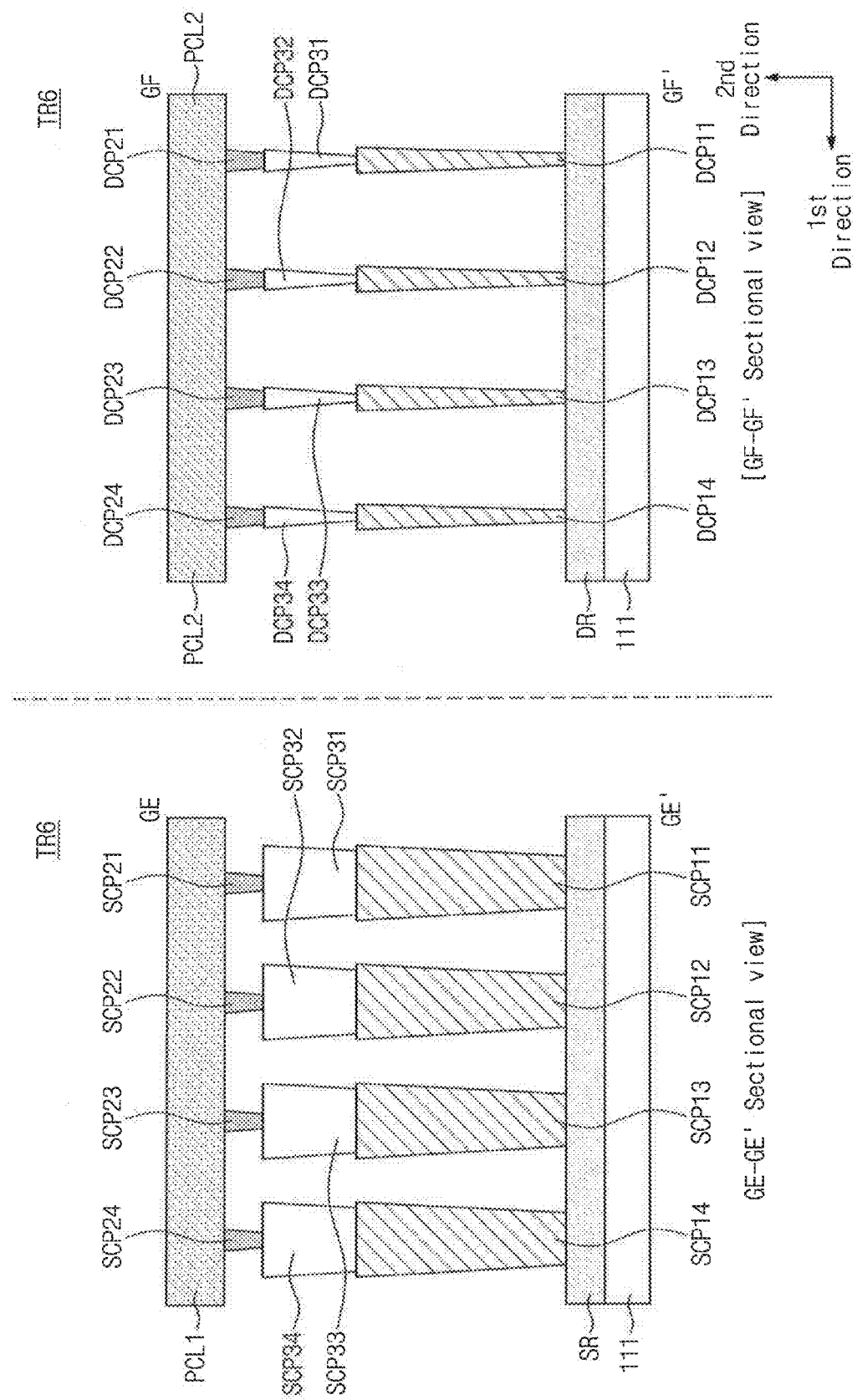
FIG. 33 illustrates cross sections taken along lines GE-GE' and GF-GF'.

FIG. 30 is a perspective view of a transistor according to an exemplary embodiment of the present inventive concept. FIG. 31 is a cross-sectional view taken along a line GA-GA' of FIG. 30. FIG. 32 illustrates cross sections taken along lines GB-GB', GC-GC', and GD-GD' of FIG. 31. FIG. 33 illustrates cross sections taken along lines GE-GE' and GF-GF'.

Referring to FIGS. 30 through 33, the source region SR of a sixth transistor TR6 may be connected to the first peripheral conductive line PCL1 by first through fourth lower source contact plugs SCP11 through SCP14, first through fourth intermediate source contact plugs SCP31 through SCP34, and first through fourth upper source contact plugs SCP31 through SCP34.

The drain region DR of the sixth transistor TR6 may be connected to the first peripheral conductive line PCL1 by first through fourth lower drain contact plugs DCP11 through DCP14, first through fourth intermediate drain contact plugs DCP31 through DCP34, and first through fourth upper drain contact plugs DCP31 through DCP34.

The number of source contact plugs SCP may be equal to the number of drain contact plugs DCP. For example, the number of first through fourth lower source contact plugs SCP11 through SCP14, the number of first through fourth intermediate source contact plugs SCP31 through SCP34, the number of first through fourth upper source contact plugs SCP31 through SCP34, the number of first through fourth lower drain contact plugs DCP11 through DCP14, the number of first through fourth intermediate drain contact plugs DCP31 through DCP34, and the number of first through fourth upper drain contact plugs DCP31 through DCP34 may be equal to each other.

According to exemplary embodiments of the present inventive concept, unlike intermediate source contact plugs SCP31 through SCP34 connected with the fifth transistor TR5, intermediate source contact plugs SCP31 through SCP34 connected with the sixth transistor TR6 may have a wider contact area.

Referring to cross sections taken along lines GC-GC' and GE-GE' of FIG. 32, the contact area of each of the first through fourth lower source contact plugs SCP11 through SCP14 may be substantially the same as that of each of the first through fourth intermediate source contacts SCP31 through SCP34. The contact area of each of the first through fourth lower source contact plugs SCP11 through SCP14 and the contact area of each of the first through fourth intermediate source contacts SCP31 through SCP34 may be wider than that of each of any other contact plugs.

As described above, resistance of a source contact plug may be decreased by increasing the contact area of each of intermediate and lower source contact plugs. Thus, a propagation delay in signals transmitted and received through contact plugs may be reduced.

In exemplary embodiments of the present inventive concept, at least one of transistors in the peripheral circuit 120 may be connected to a first peripheral wiring through source contact plugs having a multi-layer stack structure and to a second peripheral wiring through drain contact plugs having a multi-layer stack structure. In this case, the source contact plugs having the multi-layer stack structure may have an asymmetric structure (e.g., a structure where the number of source contact plugs in one layer is different from that in any other layer or a structure where a contact area of each of source contact plugs in one layer is different from that in any other layer or structure). Alternatively, drain contact plugs having a multi-layer stack structure may have an asymmetric structure (e.g., a structure where the number of drain contact plugs in one layer is different from that in any other layer or a structure where a contact area of each of drain contact plugs in one layer is different from that in any other layer or structure). The asymmetric structure may reduce resistance of source contact plugs and may reduce parasitic capacitance between source contact plugs and drain contact plugs. Thus, a propagation delay in signals transmitted and received through contact plugs may be reduced.

The above-described transistors and contact plugs are described as examples; however, exemplary embodiments of the present inventive concept are not limited thereto. For example, the number of lower, intermediate or upper source contact plugs and the number of lower, intermediate or upper drain contact plugs may be increased or decreased to have an asymmetric structure. Source contact plugs and drain contact plugs may have a 3-layer stack structure or may have a stack structure having more than 3 layers. For example, the source contact plug that connects the source region of the transistor and the conductive line of the metal layer may include n sub source contact plugs (e.g., n being a natural number greater than 3), which may be stacked in a direction perpendicular to the substrate 111. In other words, the source contact plug may have an n-layer stack structure.

Each of the contact plugs may extend in a direction parallel with the substrate 111 so as to be connected with an adjacent transistor. Alternatively, a conductive line that extends in a direction parallel with the substrate 111 may be disposed between adjacent contact plugs such that transistors in the peripheral circuit 120 are connected.

Figure 34:
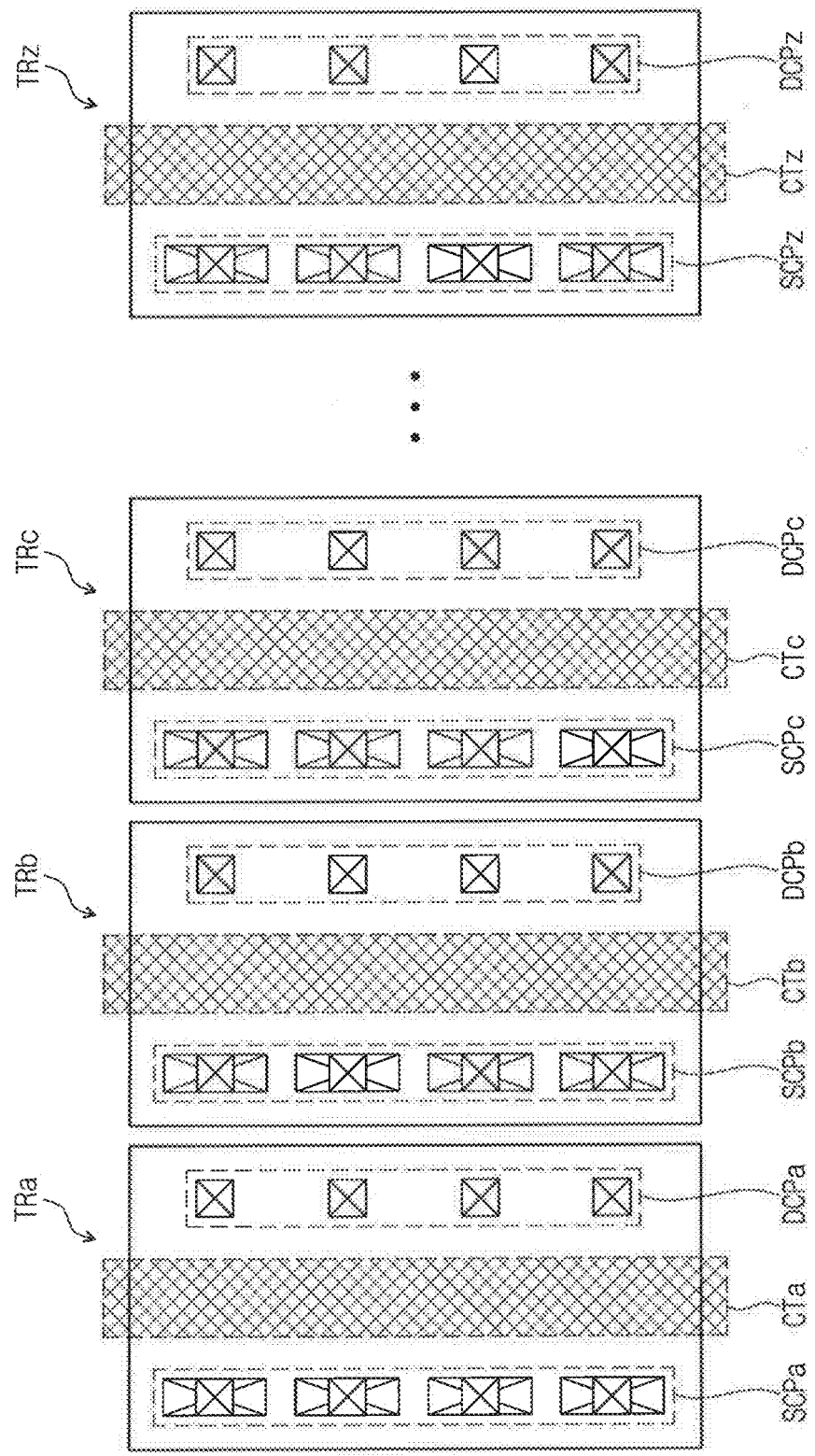
FIG. 34 is a plan view of a peripheral circuit according to an exemplary embodiment of the present inventive concept.

FIG. 34 is a plan view of a peripheral circuit according to an exemplary embodiment of the present inventive concept. According to the exemplary embodiment illustrated in FIG. 34, it is assumed that each of transistors TRa through TRz is the third transistor TR3 described with reference to FIGS. 18 through 21 and each of source and drain contact plugs SCPa through SCPz and DCPa through DCPz has a 2-layer stack structure. However, exemplary embodiments of the present inventive concept are not limited thereto. Upper and lower contact plugs of each of the source and drain contact plugs SCPa through SCPz and DCPa through DCPz are illustrated together in FIG. 34; however exemplary embodiments of the present inventive concept are not limited thereto.

Referring to FIG. 34, the peripheral circuit 120 may include a plurality of transistors TRa through TRz. The transistors TRa through TRz may be disposed along a direction parallel with the substrate 111 (see, e.g., FIG. 3).

The source contact plugs SCPa through SCPz and the drain contact plugs DCPa through DCPz connected with the transistors TRa through TRz may be upper and lower source contact plugs and upper and lower drain contact plugs described with reference to FIGS. 18 through 21.

As described with reference to FIGS. 18 through 21, resistance and parasitic capacitance for each of the transistors TRa through TRz may be reduced. In addition, parasitic capacitance due to a contact plug of an adjacent transistor may be reduced.

The transistors TRa and TRb may be adjacent to each other. Parasitic capacitance of source contact plug SCPb of the transistor TRb may be affected by both a drain contact plug DCPb of the transistor TRa and the drain contact plug DCPa of the transistor TRa. In this case, as illustrated in FIG. 34, an opposite area of the source contact plug SCPb and the drain contact plug DCPa may be relatively small. Thus, the influence of the drain contact plug DCPa of the transistor TRa may be reduced by iteratively disposing the source contact plug and the drain contact plug that have an asymmetric structure.

According to an exemplary embodiment of the present inventive concept, parasitic capacitance due to an adjacent transistor may be reduced by iteratively disposing contact plugs that have an asymmetric structure.

FIG. 35 is a perspective view of a memory block according to an exemplary embodiment of the present inventive concept. According to the exemplary embodiment illustrated in FIG. 35, it is assumed that the number of word line layers is "4". However, exemplary embodiments of the present inventive concept are not limited thereto. Referring to FIG. 35, a memory block may have a PBiCS (pipe-shaped bit cost scalable) structure where lower ends of units of serially-connected memory cells are connected through a pipe. The memory block may include m×n strings NS (e.g., m being 6 and n being 2). Each string NS may include serially-connected memory cells MC1 through MC8. In each string, a first upper end may be connected to the string selection transistor SST, a second upper end may be connected to a ground selection transistor GST, and lower ends of units of serially-connected memory cells may be connected through a pipe.

Memory cells of each string NS may include a plurality of stacked semiconductor layers. Each string NS may include a first pillar PL11, a second pillar PL12, and a pillar connection portion PL13 connecting the first and second pillars PL11 and PL12. The first pillar PL11 may be connected to the bit line (e.g., BL1) and the pillar connection portion PL13 and may penetrate the string selection line SSL and word lines WL5 through WL8.

The second pillar PL12 may be connected to a common source line CSL and the pillar connection portion PL13 and may penetrate the ground selection line GSL and word lines WL1 through WL4. As illustrated in FIG. 25, each string NS have a U-shaped pillar shape.

According to exemplary embodiments of the present inventive concept, a back-gate BG may be disposed on a substrate 101, and the pillar connection portion PL13 may be disposed in the back-gate BG. One back-gate BG may be commonly used within a block BLK and the one back-gate BG may be connected to more than one pillar connection portion. The back-gate GB may be separated from a back-gate of any other block.

Figure 36:
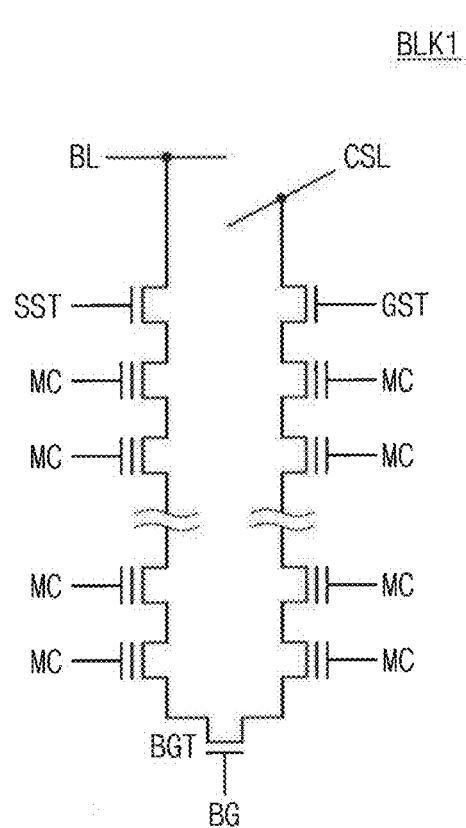
FIG. 36 is a circuit diagram of a string NS shown in FIG. 35.

FIG. 36 is a circuit diagram of a string NS shown in FIG. 35. Referring to FIG. 36, the string NS may include the string selection transistor SST, first memory cells MCs, a back-gate transistor BGT, second memory cells MCs, and the ground selection transistor GST that may be connected in series between the bit line BL and the common source line CSL. The back-gate transistor BGT may include a gate connected with the back-gate BG.

A memory block described with reference to FIGS. 35 and 36 may be a memory block having a three-dimensional stack structure. A metal layer ML may be disposed on the memory block described with reference to FIGS. 35 and 36, and the memory block may be connected to the peripheral circuit 120 through the metal layer ML. The peripheral circuit 120 may be connected to the metal layer ML by contact plugs that are described with reference to FIGS. 9 through 34.

An exemplary memory block is described with reference to FIGS. 4 through 7, FIG. 35, and FIG. 36. However, exemplary embodiments of the present inventive concept are not limited thereto. For example, a memory cell array may include memory blocks that have a two- or three-dimensional structure. A height of the peripheral circuit may be lower than that of the memory cell array. When the memory cell array and the peripheral circuit are interconnected through the metal layer disposed on the memory cell array and the peripheral circuit, contact plugs described with reference to FIGS. 8 through 34 may be connected to the peripheral circuit.

Figure 37:
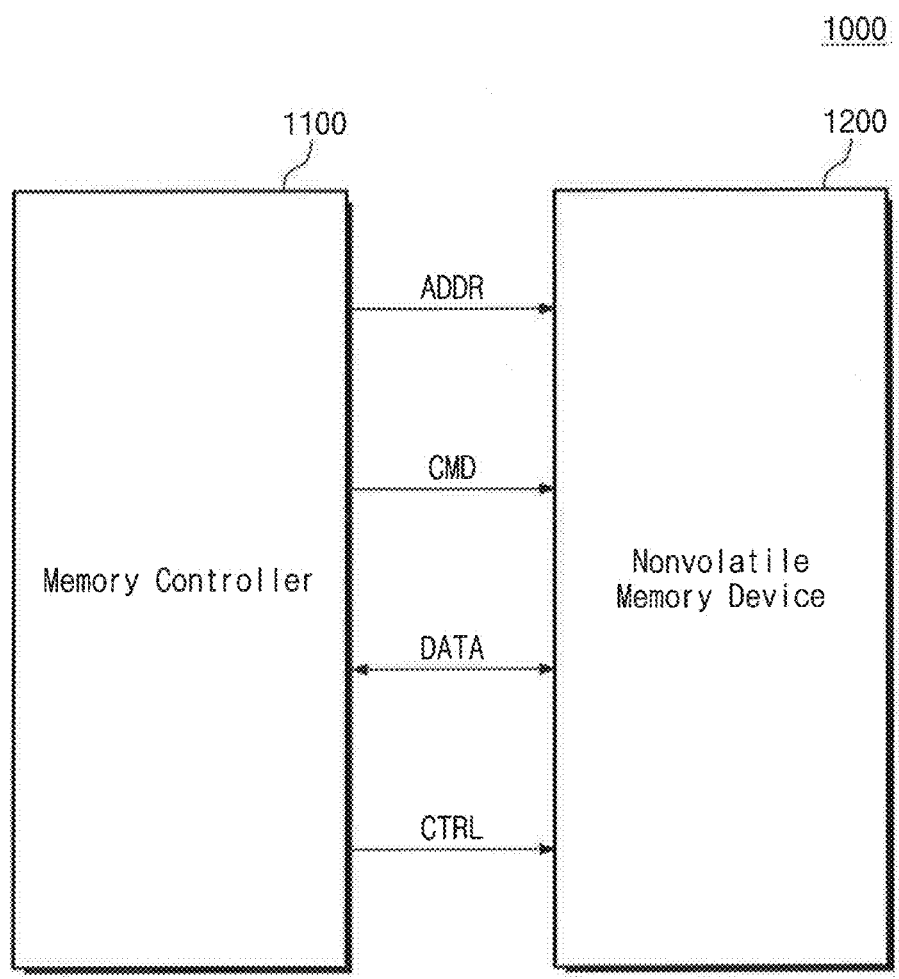
FIG. 37 is a block diagram schematically illustrating a nonvolatile memory system to which a nonvolatile memory device according to an exemplary embodiment of the present inventive concept is applied.

FIG. 37 is a block diagram schematically illustrating a nonvolatile memory system to which a nonvolatile memory device according to an exemplary embodiment of the present inventive concept is applied. Referring to FIG. 37, a nonvolatile memory system 1000 may include a memory controller 1100 and a nonvolatile memory device 1200.

The memory controller 1100 may control the nonvolatile memory device 1200 according to a request of an external device (e.g., a host or application processor). For example, the memory controller 110 may send an address ADDR, a command CMD, and a control signal CTRL to the nonvolatile memory device 1200 to read data stored in the nonvolatile memory device 1200. The nonvolatile memory device 1200 may transmit data to the memory controller 1100 in response to signals received from the memory controller 1100.

The memory controller 1100 may send the address ADDR, the command CMD, the control signal CTRL, and data to the nonvolatile memory device 1200 to store the data in the nonvolatile memory device 1200. The nonvolatile memory device 1200 may store data in response to signals received from the memory controller 1100.

The nonvolatile memory device 1200 may be the nonvolatile memory device described with reference to FIGS. 1 through 36. The nonvolatile memory device 1200 may include the memory cell array having a three-dimensional vertical stack structure and the peripheral circuit connected to the memory cell array. At least one of transistors included in the peripheral circuit may be connected to the memory cell array or to the metal layer disposed on the memory cell array through contact plugs that have an asymmetric structure.

Figure 38:
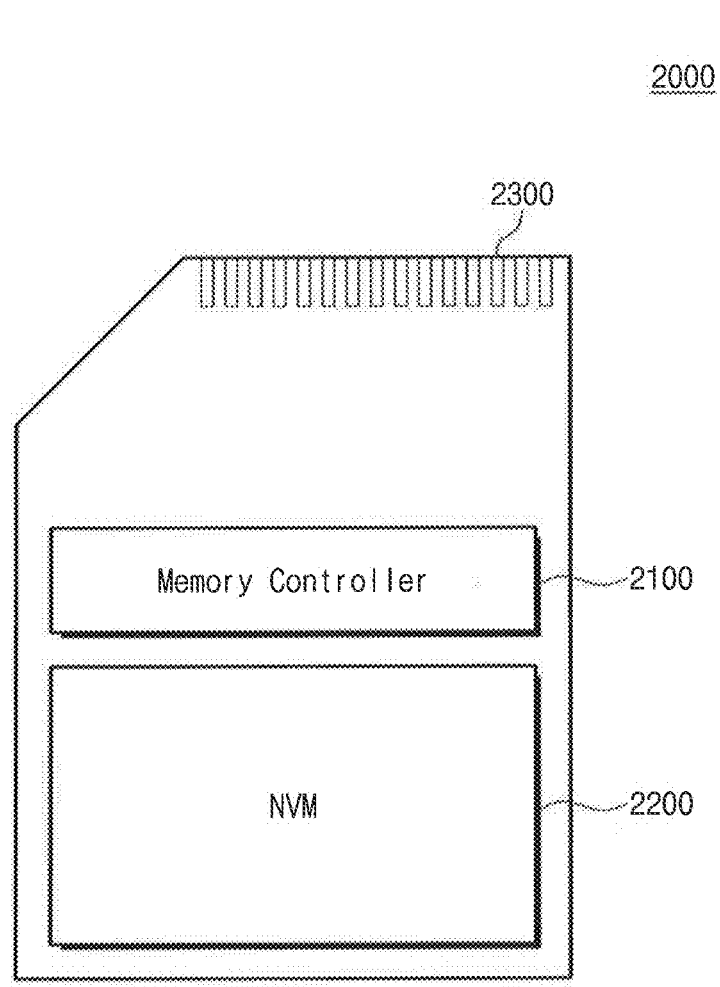
FIG. 38 is a block diagram schematically illustrating a memory card system including a nonvolatile memory system according to exemplary embodiments of the present inventive concept.

FIG. 38 is a block diagram schematically illustrating a memory card system including a nonvolatile memory system according to exemplary embodiments of the present inventive concept. Referring to FIG. 38, a memory card system 2000 may include a memory controller 2100, a nonvolatile memory (NVM) 2200, and a connector 2300.

The memory controller 2100 may be connected to the NVM 2200. The memory controller 2100 may be configured to access the NVM 2200. For example, the memory controller 2100 may be adapted to control an overall operation of the NVM 2200 including, but not limited to, a read operation, a write operation, an erase operation, and a background operation. The memory controller 2100 may provide an interface between the NVM 2200 and a host. The memory controller 2100 may be configured to drive firmware for controlling the NVM 2200.

According to exemplary embodiments of the present inventive concept, the memory controller 2100 may include components such as, but not limited to, a RAM, a processing unit, a host interface, a memory interface, and an error correction unit.

The memory controller 2100 may communicate with an external device through the connector 2300. The memory controller 2100 may communicate with an external device according to a particular communication protocol. For example, the memory controller 2100 may communicate with the external device through at least one of various interface protocols such as, but not limited to, universal serial bus (USB, multimedia card (MMC), eMMC (embedded MMC), peripheral component interconnection (PCI), PCI-express (PCI-E), advanced technology attachment (ATA), a serial-ATA protocol, parallel-ATA, small computer small interface (SCSI), enhanced small disk interface (ESDI), integrated drive electronics (IDE), UFS (Universal Flash Storage), WiFi, Bluetooth, NVMe, and Firewire. In exemplary embodiments, the connector 2300 may be defined by at least one of the communication protocols.

According to exemplary embodiments of the present inventive concept, the NVM 2200 may be used in a variety of nonvolatile memory devices, such as, but not limited to, an EPROM (Electrically Erasable and Programmable ROM), a NAND flash memory, a NOR flash memory, a PRAM (Phase-change RAM), an ReRAM (Resistive RAM), a FRAM (Ferroelectric RAM), and an STT-MRAM (Spin-Torque Magnetic RAM).

The memory controller 2100 or the NVM 2200 may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP). Alternatively, the NVM 2200 may include a plurality of nonvolatile memory chips, which may be used in one of the above-described packaging technologies.

According to exemplary embodiments of the present inventive concept, the memory controller 2100 and the NVM 2200 may be included in a single semiconductor device. The memory controller 2100 and the NVM 2200 may be included in a single semiconductor device to form a solid state drive (SSD). The memory controller 2100 and the NVM 2200 may be included in a single semiconductor device to form a memory card such as, but not limited to, a PC card (PCMCIA, personal computer memory card international association), a compact flash card (CF), a smart media card (SM, SMC), a memory stick, a multimedia card (MMC, RS-MMC, MMC-micro), an SD card (SD, miniSD, microSD, SDHC), and a universal flash storage (UFS).

The NVM 2200 may be a nonvolatile memory device described with reference to FIGS. 1 through 36. The NVM 2200 may include the memory cell array having a three-dimensional vertical stack structure and the peripheral circuit connected with the memory cell array. At least one of transistors that the peripheral circuit includes may be connected to the memory cell array or to the metal layer disposed on the memory cell array by contact plugs that have an asymmetric structure.

Figure 39:
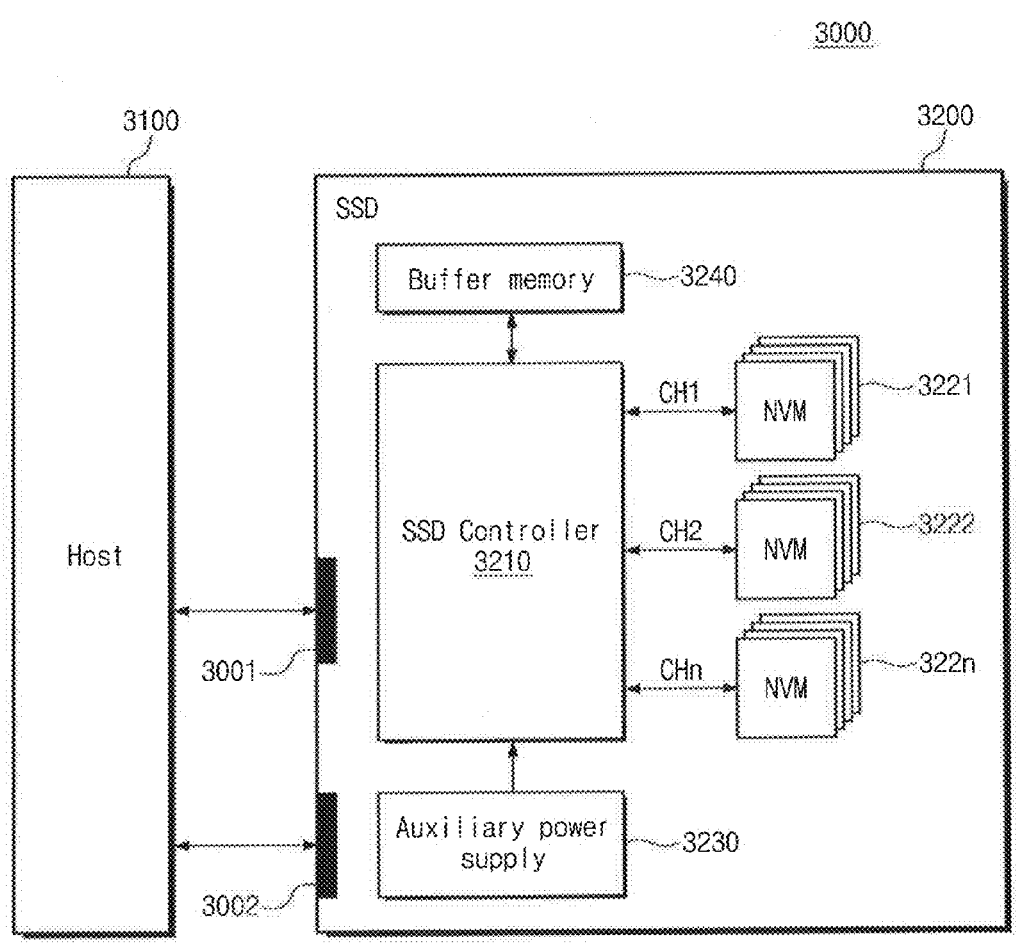
FIG. 39 is a block diagram illustrating a solid state drive including a nonvolatile memory system according to an exemplary embodiment of the present inventive concept.

FIG. 39 is a block diagram illustrating a solid state drive including a nonvolatile memory system according to an exemplary embodiment of the present inventive concept. Referring to FIG. 39, a solid state drive (SSD) system 3000 may include a host 3100 and an SSD 3200. The SSD 3200 may exchange signals SGL with the host 3100 through a host interface 3001 and may be supplied with power through a power connector 3002. The SSD 3200 may include a plurality of flash memories 3221 to 322*n*, an SSD controller 3210, an auxiliary power supply 3230, and a buffer memory 3240.

The SSD controller 3210 may control the flash memories 3221 to 322*n* in response to the signal SIG from the host 3100. For example, the signal SIG may be a signal that is transmitted through an interface between the host 3100 and the SSD 3200. For example, the signal SIG may be a signal defined by at least one of various interface protocols such as, but not limited to, universal serial bus (USB, multimedia card (MMC), eMMC (embedded MMC), peripheral component interconnection (PCI), PCI-express (PCI-E), advanced technology attachment (ATA), a serial-ATA protocol, parallel-ATA, small computer small interface (SCSI), enhanced small disk interface (ESDI), integrated drive electronics (IDE), UFS (Universal Flash Storage), WiFi, Bluetooth, NVMe, and Firewire.

The auxiliary power supply 3230 may be connected to the host 3100 via the power connector 3002. The auxiliary power supply 3230 may be charged by power from the host 3100. When power is not consistently supplied from the host 3100, the auxiliary power supply 3230 may provide power to the SSD system 3000. The auxiliary power supply 3230 may be disposed inside or outside the SSD 3200. For example, the auxiliary power supply 3230 may be disposed on a main board and may supply auxiliary power to the SSD 3200.

The buffer memory 3240 may act as a buffer memory of the SSD 3200. For example, the buffer memory 3240 may temporarily store data received from the host 3100 or from the flash memories 3221 to 322*n*. The buffer memory 3240 may temporarily store metadata (e.g., mapping tables) of the flash memories 3221 to 322*n*. The buffer memory 3240 may include volatile memories such as DRAM, SDRAM, DDR SDRAM, LPDDR SDRAM, or SRAM, and/or nonvolatile memories such as FRAM ReRAM, STT-MRAM, or PRAM.

Each of the nonvolatile memories 3221 through 322*n* may be a nonvolatile memory device described with reference to FIGS. 1 through 36. Each of the nonvolatile memories 3221 through 322*n* may include the memory cell array having a three-dimensional vertical stack structure and the peripheral circuit connected to the memory cell array. At least one of transistors that the peripheral circuit includes may be connected to the memory cell array or to the metal layer disposed on the memory cell array by contact plugs that have an asymmetric structure.

Figure 40:
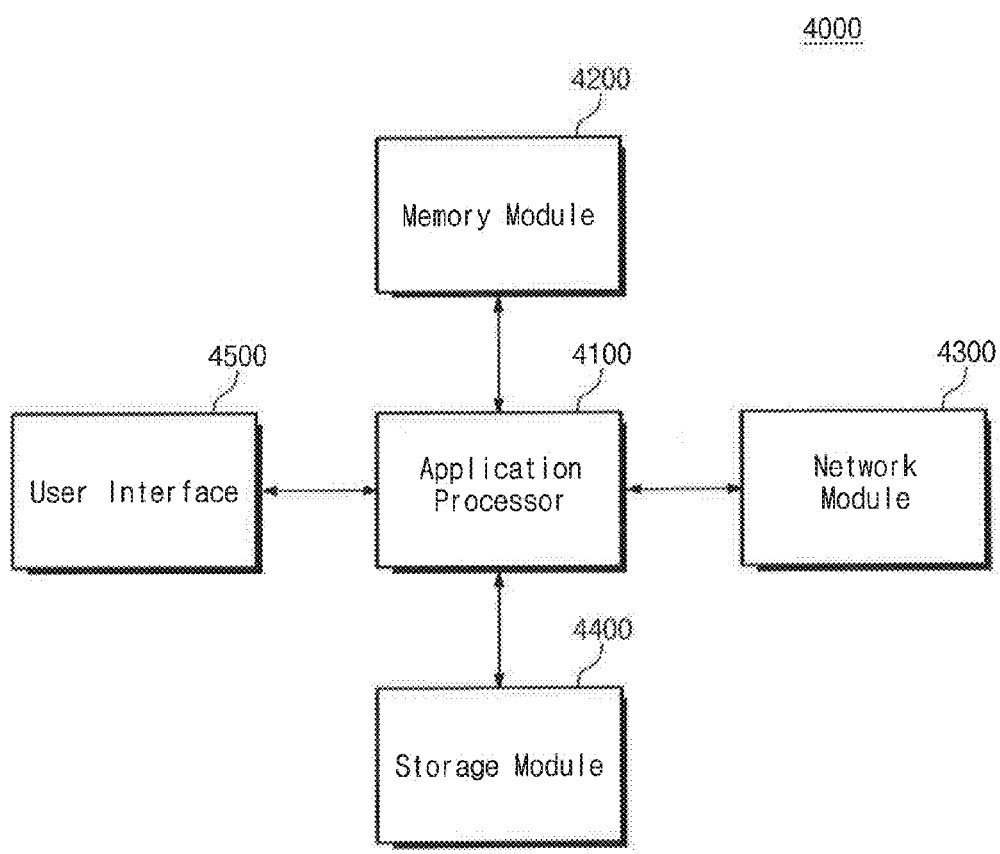
FIG. 40 is a block diagram schematically illustrating a user system including a nonvolatile memory system according to an exemplary embodiment of the present inventive concept.

FIG. 40 is a block diagram schematically illustrating a user system including a nonvolatile memory system according to an exemplary embodiment of the present inventive concept. Referring to FIG. 40, a user system 4000 may include an application processor 4100, a memory module 4200, a network module 4300, a storage module 4400, and a user interface 4500.

The application processor 4100 may drive components of the user system 4000. For example, the application processor 4100 may drive an operating system. For example, the application processor 4100 may include controllers for controlling components of the user system 4000. For example, the application processor 4100 may control graphics engines, or a variety of interfaces. The application processor 4100 may include a system-on-chip (SoC).

The memory module 4200 may be a main memory, a working memory, a buffer memory, or a cache memory of the user system 4000. The memory module 4200 may include a volatile random access memory, such as DRAM (Dynamic Random Access Memory), SDRAM (Synchronous DRAM), DDR SDRAM (Double Date Rate SDRAM), DDR2 SDRAM, DDR3 SDRAM, LPDDR DRAM, LPDDR2 DRAM, or LPDDR3 DRAM or a nonvolatile random access memory, such as PRAM (Phase-change RAM), MRAM (Magnetic RAM), RRAM (Resistive RAM), or FRAM (Ferroelectric RAM). According to exemplary embodiments of the present inventive concept, the application processor 4100 and the memory module 4200 may be packed in a semiconductor package. The application processor may be packed in a POP (Package on Package) configuration.

The network module 4300 may communicate with external devices. For example, the network module 4300 may support wireless communications, such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, or WI-DI. According to exemplary embodiments of the present inventive concept, the network module 4300 may be embedded in the application processor 4100.

The storage module 4400 may store data. For example, the storage module 4400 may store data received from the application processor 4100. The storage module 4400 may provide the application processor 4100 with data stored therein. For example, the storage module 4400 may include a nonvolatile semiconductor memory device such as PRAM, MRAM, RRAM, NAND flash memory, NOR flash memory, or a three-dimensional NAND flash memory. According to exemplary embodiments of the present inventive concept, the storage module 4400 may include a removable drive, such as a memory card of the user system 4000 or an external drive.

The storage module 4400 may include a plurality of nonvolatile memory devices. Each of the nonvolatile memory devices may be a nonvolatile memory device described with reference to FIGS. 1 through 36. Each of the nonvolatile memory devices may include the memory cell array having a three-dimensional vertical stack structure and the peripheral circuit connected to the memory cell array. At least one of transistors that the peripheral circuit includes may be connected to the memory cell array or to the metal layer disposed on the memory cell array through contact plugs that have an asymmetric structure.

The user interface 4500 may provide an interface for providing data or commands to the application processor 4100 or for outputting data to an external device. For example, the user interface 4500 may include user input interfaces, such as a keyboard, a keypad, a button, a touch panel, a touch screen, a touch pad, a touch ball, a camera, a microphone, a Gyroscope, a vibration sensor, and a piezoelectric element. The user interface 4500 may include user output interfaces, such as an LCD (Liquid Crystal Display) device, an OLED (Organic Light Emitting Diode) display device, an AMOLED (Active Matrix OLED) display device, an LED, a speaker, and a motor.

According to exemplary embodiments of the present inventive concept, a nonvolatile memory device may include the memory cell array having a three-dimensional stack structure and the peripheral circuit connected to the memory cell array by the metal layer. The peripheral circuit may include the plurality of transistors, which may be connected to conductive lines in the meal layer by contact plugs. Resistance and capacitance due to contact plugs may be reduced by having contact plugs with an asymmetric structure (e.g., the number of contacts or contact areas may be variable). Therefore, propagation delay due to resistance and capacitance may be reduced. Thus, the performance of the nonvolatile memory device may be increased.

Capacitance between source and drain regions of each transistor of the peripheral circuit of nonvolatile memory device may be reduced. Therefore, propagation delay due to resistance and capacitance may be reduced. Thus, the performance of the nonvolatile memory device may be increased.

While the present inventive concept has been particularly shown and described with reference to exemplary embodiments thereof, it will be understood by those of ordinary skill in the art that various changes in form and detail may be made therein without departing from the spirit and scope of the present inventive concept, as defined by the following claims.

What is claimed is:

1. A nonvolatile memory device, comprising:
   a memory cell array including a plurality of cell strings, wherein each of the cell strings comprises memory cells stacked in a direction perpendicular to a substrate; and
   a peripheral circuit connected to the memory cell array through a plurality of conductive lines, wherein the peripheral circuit comprises a plurality of transistors, wherein each of the transistors is formed on the substrate, wherein each of the transistors includes first and second regions, wherein the first and second regions comprise a conductive material different from a material included in the substrate, and wherein a gate electrode is disposed between the first and second regions,
   wherein in at least one of the transistors, the first region is connected to at least one of the conductive lines through a plurality of first contact plugs extending in the direction perpendicular to the substrate, and a plurality of second contact plugs extending in the direction perpendicular to the substrate,
   wherein each of the second contact plugs is disposed on a respective first contact plug, and
   wherein a contact area of each of the first contact plugs is different from a contact area of each of the second contact plugs.

2. The nonvolatile memory device of claim 1, wherein the contact area of each of the first and second contact plugs is an upper surface of each contact plug that is parallel with the substrate.

3. The nonvolatile memory device of claim 1, wherein a first end of each of the first contact plugs is connected to the at least one conductive line and a second end of each of the first contact plugs is connected to a first end of each of the second contact plugs, and
   wherein a second end of each of the second contact plugs is connected to the first region.

4. The nonvolatile memory device of claim 3, wherein a length of each of the first contact plugs is shorter than a length of each of the second contact plugs, and wherein the length extends in the direction perpendicular to the substrate.

5. The nonvolatile memory device of claim 3, wherein the contact area of each of the plurality of first contact plugs is smaller than the contact area of each of the plurality of second contact plugs.

6. The nonvolatile memory device of claim 3, wherein the number of the first contact plugs is greater than the number of the second contact plugs, and
   wherein the first end of the second contact plugs is connected to the second end of each of at least two of the first contact plugs.

7. The nonvolatile memory device of claim 2, wherein a first length of each of the first contact plugs is shorter than a second length of each of the second contact plugs, wherein the first and second lengths extend in the direction perpendicular to the substrate.

8. The nonvolatile memory device of claim 1, wherein the second region of the at least one transistor is connected to at least one of the conductive lines through a plurality of third contact plugs and a plurality of fourth contact plugs, wherein the fourth contact plugs extend in the direction perpendicular to the substrate, and wherein the fourth contact plugs are disposed on the third contact plugs.

9. The nonvolatile memory device of claim 8, wherein a second end of each of the fourth contact plugs is connected to the second region and a first end of each of the fourth contact plugs is connected to a second end of each of the third contact plugs, and
   wherein a first end of each of the third contact plugs is connected to the at least one conductive line.

10. The nonvolatile memory device of claim 9, wherein the contact area of each of the plurality of second contact plugs is greater than a contact area of each of the plurality of fourth contact plugs.

11. The nonvolatile memory device of claim 9, wherein the number of the second contact plugs is less than the number of the fourth contact plugs.

12. The nonvolatile memory device of claim 1, wherein a metal layer is disposed on the memory cell array and the peripheral circuit, and
   wherein the metal layer includes the plurality of conductive lines.

13. The nonvolatile memory device of claim 1, wherein a length of the peripheral circuit extending in the direction perpendicular to the substrate is shorter than a length of the memory cell array extending in the direction perpendicular to the substrate.

14. A nonvolatile memory device, comprising:
   a memory cell array including a plurality of cell strings, wherein each of the cell strings comprises memory cells stacked in a direction perpendicular to a substrate; and a peripheral circuit connected to the memory cell array through a plurality of conductive lines, wherein the peripheral circuit comprises a plurality of transistors, wherein at least one of the transistors includes a source region and a drain region, wherein the source region is connected to a first conductive line of the plurality of conductive lines through a plurality of source contact plugs extending in a direction perpendicular to the substrate, wherein the drain region is connected to a second conductive line of the plurality of conductive lines through a plurality of drain contact plugs extending in the direction perpendicular to the substrate, wherein a contact area of each of the source contact plugs is different from a contact area of each of the drain contact plugs, and wherein the contact area of each of the source and drain contact plugs is an area parallel with the substrate.

15. The nonvolatile memory device of claim 14, wherein each of the source contact plugs includes:
 a lower source contact plug comprising a second end connected to the source region; and
 an upper source contact plug comprising a second end connected to a first end of the lower source contact plug, wherein a first end of the upper source contact plug is connected to the first conductive line, and
wherein each of the drain contact plugs includes:
 a lower drain contact plug comprising a second end connected to the drain region; and
 an upper drain contact plug comprising a second end connected to a first end of the lower drain contact plug, wherein a first end of the upper drain contact plug is connected to the second conductive line.

16. The nonvolatile memory device of claim 15, wherein a contact area of the lower source contact plug of each source contact plug is larger than a contact area of the upper source contact plug of each source contact plug.

17. The nonvolatile memory device of claim 15, wherein a contact area of the lower drain contact plug of each drain contact plug is larger than a contact area of the upper drain contact plug of each drain contact plug.

18. The nonvolatile memory device of claim 14, wherein the number of the source contact plugs is greater than the number of the drain contact plugs.

19. The nonvolatile memory device of claim 14, wherein each of the source contact plugs includes:
 a lower source contact plug having a second end connected to the source region;
 an intermediate source contact plug having a second end connected to a first end of the lower source contact plug; and
 an upper source contact plug having a second end connected to a first end of the intermediate source contact plug, wherein a first end of the upper source contact plug is connected to the first conductive line, and
wherein each of the drain contact plugs includes:
 a lower drain contact plug having a second end connected to the drain region;
 an intermediate drain contact plug having a second end connected to a first end of the lower drain contact plug; and
 an upper drain contact plug having a second end connected to a first end of the intermediate drain contact plug, wherein a first end of the upper drain contact plug is connected to the second conductive line.

20. The nonvolatile memory device of claim 19, wherein a contact area of the lower source contact plug of each source contact plug is larger than a contact area of the intermediate source contact plug of each source contact plug and a contact area of the upper source contact plug of each source contact plug.

* * * * *